(12) United States Patent
Kato et al.

(10) Patent No.: US 7,425,753 B2
(45) Date of Patent: Sep. 16, 2008

(54) SEMICONDUCTOR DEVICE

(75) Inventors: Hidenori Kato, Hyogo (JP); Masahide Mori, Osaka (JP); Hirofumi Watanabe, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 191 days.

(21) Appl. No.: 11/230,040

(22) Filed: Sep. 19, 2005

(65) Prior Publication Data
US 2006/0065949 A1 Mar. 30, 2006

(30) Foreign Application Priority Data
Sep. 30, 2004 (JP) .............................. 2004-286742

(51) Int. Cl.
*H01L 29/00* (2006.01)
(52) U.S. Cl. .............................. 257/536; 257/E29.141; 257/537; 257/758; 257/E23.145
(58) Field of Classification Search ................ 257/536, 257/E29.141
See application file for complete search history.

(56) References Cited
U.S. PATENT DOCUMENTS
2003/0160285 A1* 8/2003 Shiiki ......................... 257/358

FOREIGN PATENT DOCUMENTS
| JP | 56-58256 | 5/1981 |
| JP | 58-170 | 1/1983 |
| JP | 58-148443 | 9/1983 |
| JP | 61-100956 | 5/1986 |
| JP | 8-124729 | 5/1996 |
| JP | 2536303 | 7/1996 |
| JP | 2699559 | 9/1997 |
| JP | 2932940 | 5/1999 |
| JP | 3185677 | 5/2001 |
| JP | 2002-124639 | 4/2002 |
| JP | 2002-261237 | 9/2002 |

* cited by examiner

*Primary Examiner*—Tu-Tu V. Ho
(74) *Attorney, Agent, or Firm*—Cooper & Dunham LLP

(57) ABSTRACT

A semiconductor device equipped with an integrated circuit including a metal thin-film-resistor object is disclosed. The semiconductor device includes a lower layer side insulator film formed on a semiconductor substrate, a metal wiring pattern formed on the lower layer side insulator film, an underground insulator film having a silicon oxide-film that contains at least phosphor, or phosphor and boron in the uppermost layer formed on the lower layer side insulator film and the metal wiring pattern, and a connection hole formed in the underground insulator film on the metal wiring pattern. The metal thin-film-resistor object is formed covering the underground insulator film, and inside of the connection hole, and is electrically connected to the metal wiring pattern in the connection hole.

18 Claims, 34 Drawing Sheets

SEMICONDUCTOR DEVICE

BACKGROUND OF THE INVENTION

1. Field of the Invention

The present invention generally relates to a semiconductor device, and especially relates to a semiconductor device equipped with an integrated circuit including a metal thin-film-resistor.

2. Description of the Related Art

In an analog integrated circuit, resistors are abundantly used as important components. In recent years and continuing, resistors consisting of a metal thin film (henceforth a metal thin-film-resistor) attract attention in view of low temperature dependency (henceforth TCR) of the resistance. As a material of the metal thin-film-resistors, chromium silicon (CrSi), nickel chromium (NiCr), tantalum nitride (TaN), chromium silicide (CrSi2), chromium silicide nitride (CrSiN), chromium silicon oxy (CrSiO), etc., are used.

It is often the case that the metal thin-film-resistor object of a semiconductor device is formed in the film thickness of less than 100 nm (1000 Å (angstrom)) in order to obtain a high sheet resistance such that requirements for high integration are met.

Conventional methods of obtaining an electrical connection of the metal thin-film-resistor object are as follows.

Method (1): A method of directly connecting metal wiring to the metal thin-film-resistor object (for example, Patent Reference 1).

Method (2): A method of connecting metal wiring through a hole that is formed in a layer insulation film, which hole is formed after forming the metal thin-film-resistor object (for example, Patent Reference 2 and Patent Reference 3).

Method (3): A method of connecting metal wiring to a barrier film that is formed on a metal thin film resistor layer (for example, Patent Reference 4 and Patent Reference 5).

Method (4): A method of forming an electrode inside a connection hole formed in an insulator layer, forming a resistor film on the insulator layer, and then forming a resistor pattern that is connected to the electrode by dry etching (for example, Patent Reference 1).

The foregoing Methods (1) through (4) are further described.

With reference to FIG. 37, Method (1) is described.

A device separating oxide film 3, a transistor (not illustrated), etc. are formed on a silicon substrate 1 that is in the shape of a wafer. Then, a first layer insulation film 5 is formed, and a metal thin-film-resistor object 101 is formed on the first layer insulation film 5. A metal film for wiring is formed all over the first layer insulation film 5 and the metal thin-film-resistor object 101. The metal film for wiring is patterned by a wet etching process, and a first layer metal wiring pattern 103 is formed.

In a manufacturing process of common semiconductor devices, dry etching technology is generally used when etching a metal film for wiring. However, since the metal thin-film-resistor object 101, which is thin, is present directly under the metal film for wiring, over-etching (excessive etching) may take place if the dry etching technology is used. For this reason, it is necessary to use the wet etching technology for patterning the metal film for wiring when forming the first layer metal wiring pattern 103.

Method (2) is described with reference to FIG. 38.

The device separating oxide film 3, the first layer insulation film 5, and the metal thin-film-resistor object 101 are formed on the silicon substrate 1. Then, a CVD (chemical vapor deposition) oxide film 105 serving as a layer insulation film for the metal wiring is formed on the first layer insulation film 5 and the metal thin-film-resistor object 101. A resist pattern for forming a connection hole for metal wiring is formed, the resist pattern having openings that expose the CVD oxide film 105 at both ends of the metal thin-film-resistor object 101. Then, the wet etching technology is carried out with the resist pattern serving as a mask such that connection holes 107 are formed by selectively removing the CVD oxide film 105. Then, the resist pattern is removed, a metal film for wiring, which consists of an AlSiCu film, is formed on the CVD oxide film 105 including the inside of the connection holes 107, patterning of the metal film for wiring is carried out, and a first layer metal wiring pattern 109 is formed.

In a manufacturing process of common semiconductor devices, dry etching technology is used when forming a connection hole. However, where the metal thin-film-resistor object 101 is thinner than 100 nm (1000 Å), it is difficult to prevent the connection holes 107 from running through the metal thin-film-resistor object 101. For this reason, it is necessary to use the wet etching technology when forming the connection holes 107.

Method (3) is described with reference to FIG. 39.

The device separating oxide film 3, the first layer insulation film 5, and the metal thin-film-resistor object 101 are formed on the silicon substrate 1. Then, on the first layer insulation film 5 including the metal thin-film-resistor object 101, a high melting point metal film, such as a TiW film, to serve as a barrier film to the metal wiring is formed, on which a metal film for wiring is formed. Then, the metal film for wiring is patterned using dry etching technology, and the first layer metal wiring pattern 111 is formed. Since the metal film for wiring is formed on the high melting point metal film, the dry etching technology can be used without etching the metal thin-film-resistor object 101. Then, the high melting point metal film is selectively removed by wet etching technology using the first layer metal wiring pattern 111 as a mask, and the high melting point metal film pattern 113 is formed. Here, since the high melting point metal film is formed immediately above the metal thin-film-resistor object 101, patterning of the high melting point metal film by dry etching technology is difficult.

Method (4) is described with reference to FIG. 40.

The first layer insulation film 5 and the device separating oxide film 3 are formed on the silicon substrate 1, and a first layer metal wiring pattern 115 is formed on the first layer insulation film 5. Then, an insulator layer 117 is formed on the first layer insulation film 5 and the first layer metal wiring pattern 115, and first connection holes 119 are formed in the insulator layer 117 on the first layer metal wiring pattern 115 at positions corresponding to both ends of the metal thin-film-resistor object 101. A conductive material is embedded in the first connection holes 119 such that conductive plugs (electrodes) 121 are formed. At this juncture, a connection hole for electrically connecting the first layer metal wiring pattern 115 and a second layer metal wiring pattern 129 formed at a later process is not formed. Next, on the surface of the insulator layer 117 a metal thin film is formed, which is then patterned such that the metal thin-film-resistor object 101 is formed on the conductive plugs 121 and the insulator layer 117.

Then, an insulator layer 123 is formed on the whole surface of the insulator layer 117 so that the metal thin-film-resistor object 101 is prevented from being etched when patterning the second layer metal wiring pattern at a later process using dry etching technology. A second connection hole 125 is formed through the insulator layers 117 and 123 on the first layer metal wiring pattern 115 at a place different from the formation region of the metal thin-film-resistor object 101, the second connection hole 125 being arranged for electrically connecting the second layer metal wiring pattern 129 and the first layer metal wiring pattern 115. A conductive material is embedded in the second connection hole 125, and a second conductive plug 127 is formed. A metal film for forming a second layer metal wiring pattern 129 is formed on the insulator layer 123 including the formation region of the second conductive plug 127, the metal film is patterned by a photoengraving process and a dry etching process, and the second layer metal wiring pattern 129 is formed on the second conductive plug 127 and the insulator layer 123.

Further, although it is not a metal thin-film-resistor object, a semiconductor integrated circuit device equipped with a resistor that is formed on the uppermost layer wiring electrode through an insulator layer and is connected to the uppermost layer wiring electrode is disclosed (for example, Patent Reference 6).

With reference to FIG. 41, the case where such a structure is applied to a metal thin-film-resistor object is described.

The first layer insulation film 5 and the device separating oxide film 3 are formed on the silicon substrate 1, and the first layer metal wiring pattern 115 is formed on the first layer insulation film 5. Then, an underground insulator film 131 is formed on the first layer insulation film 5 including the first layer metal wiring pattern 115. A connection hole 133 is formed to the underground insulator film 131 on the first layer metal wiring pattern 115 by a photoengraving process and a dry etching process. Then, a metal thin film for forming the metal thin-film-resistor object 101 is formed on the underground insulator film 131 including the formation region of the connection hole 133, which metal thin film is patterned to a predetermined form, and the metal thin-film-resistor object 101 is formed.

Further, as a semiconductor device equipped with a metal thin-film-resistor object, an integrated circuit that mounts a metal thin film resistor on an insulation layer of the semiconductor integrated circuit is indicated, wherein the metal thin film resistor contacts metal wiring through an electrode portion of the metal thin film resistor through at least a part of an end and an upper surface of the metal wiring (for example, Patent Reference 7).

With reference to FIG. 42, a method of taking the contact of the metal thin film resistor and the metal wiring through at least a part of the end and the upper surface of metal wiring is described.

The first layer insulation film 5 is formed on the silicon substrate 1 on which the device separating oxide film 3 is formed, and the first layer metal wiring pattern 115 is formed on the first layer insulation film 5. Then, a plasma nitride film 135 is formed on the first layer insulation film 5 including the first layer metal wiring pattern 115. Then, a part of the plasma nitride film 135 is removed so that a part of the ends and the upper surface of the first layer metal wiring pattern 115 are exposed. Then, a metal thin film for forming a metal thin film resistor is deposited, which is then patterned, and the metal thin-film-resistor object 101 is formed.

Further, after a semiconductor device is physically structured, a laser trimming process is performed, wherein a laser beam is irradiated onto certain elements such as a fuse element and a resistor in order to disconnect or modify the elements for adjustment of the performance of the semiconductor device (for example, Patent Reference 8).

However, when the laser beam is irradiated in the laser trimming process, the laser beam may penetrate insulator layers, such as the oxidization silicon film, and may be irradiated onto the semiconductor substrate, for example, a silicon substrate. That may cause damage to the silicon substrate, and the reliability of the semiconductor device may be degraded, which is a problem. Further, in an online trimming process, wherein trimming is performed while measuring the performance of the semiconductor device, when a laser beam is irradiated onto the silicon substrate, an electron hole pair is produced in the silicon substrate. The electron hole pair generates noise that hinders correct measurement, and precise trimming cannot be obtained, which is a problem.

In order to cope with the problems, the following methods are proposed; namely, a method of arranging a coat around a resistor for preventing penetration of the laser beam (for example, Patent Reference 9), and a method of arranging a laser-beam shielding object consisting of one of polysilicon, a high melting point metal, and a silicide of high melting point metal between the fuse that consists of polysilicon and the silicon substrates (for example, Patent Reference 10).

Further, Patent Reference 11 discloses a method of stabilizing energy actually absorbed by the metal thin-film-resistor object in the case of the laser trimming process by forming a lower layer and an upper layer of a metal thin-film-resistor object by silicon oxide films of predetermined thickness. According to the Patent Reference 11, a silicon oxide film ($SiO_2$), a PSG (phospho silicate glass) film, and a BPSG (borophospho silicate glass) film are indicated as the silicon oxide film for the lower layer and the upper layer of the metal thin-film-resistor object.

[Patent Reference 1] JPA 2002-124639
[Patent Reference 2] JPA 2002-261237
[Patent Reference 3] Japanese Patent No. 2699559
[Patent Reference 4] Japanese Patent No. 2932940
[Patent Reference 5] Japanese Patent No. 3185677
[Patent Reference 6] JPA 58-148443
[Patent Reference 7] JPA 61-100956
[Patent Reference 8] JPA 8-124729
[Patent Reference 9] JPA 56-58256
[Patent Reference 10] JPA 58-170
[Patent Reference 11] Japanese Patent No. 2536303

DESCRIPTION OF THE INVENTION

[Problem(s) to be Solved by the Invention]

For example, when an NSG (non-doped silicate glass) film is used as an underground insulator film of a metal thin-film-resistor object, since it is hard to diffuse the metal thin-film-resistor object in the underground insulator film, high laser power is needed when performing a laser trimming process on the metal thin-film-resistor object. Then, a problem arises in that adjacent regions of the metal thin-film-resistor object may be damaged, the adjacent regions including a passivation film formed on the metal thin-film-resistor object, an element under the metal thin-film-resistor object, and a silicon substrate.

SUMMARY OF THE INVENTION

It is a general object of the present invention to provide a semiconductor device equipped with an integrated circuit including a metal thin-film-resistor object, wherein damage of a region adjacent to the metal thin-film-resistor object by laser irradiation is reduced, substantially obviating one or more of the problems caused by the limitations and disadvantages of the related art.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides as follows.

[Means for Solving the Problem]

The semiconductor device of the present invention is equipped with an integrated circuit including a metal thin-film-resistor object. The first aspect of the present invention provides the semiconductor device that includes a lower layer side insulator film (an underground film) formed through another layer on a semiconductor substrate, a metal wiring pattern formed on the lower layer side insulator film, an underground insulator film formed on the lower layer side insulator film and the metal wiring pattern having a silicon oxide film that contains phosphor, or phosphor and boron at least as the uppermost layer, and a connection hole formed in the underground insulator film on the metal wiring pattern, wherein the metal thin-film-resistor object is formed on the underground insulator film and inside the connection hole such that the metal thin-film-resistor object is electrically connected to the metal wiring pattern inside the connection hole.

According to the present invention, the underground insulator film serving as the underground film of the metal thin-film-resistor object may be a silicon oxide film containing a single layer of phosphor, or phosphor and boron, or alternatively, may be a laminated film that includes two or more insulator layers having a silicon oxide film that contains phosphor, or phosphor and boron.

Compared with an NSG film, the silicon oxide film containing phosphor (PSG film) and the silicon oxide film containing boron and phosphor (BPSG film) have lower atomic densities, and lower melting points.

As for making an electrical connection of a metal thin-film-resistor object, methods are described above. According to Method (1) described with reference to FIG. 37, the first layer metal wiring pattern 103 is directly formed on the metal thin-film-resistor object 101, and patterning the metal film for the first layer metal wiring pattern 103 cannot be performed by dry etching technology, posing the problem in that formation of a detailed pattern is difficult and high integration of circuits is hindered.

Further, a metal thin-film-resistor object in general is easily oxidized. Accordingly, if the metal film for the first layer metal wiring pattern 103 is formed where the surface of the metal thin-film-resistor object 101 is oxidized, a problem is in that the electrical connection between the metal thin-film-resistor object 101 and the first layer metal wiring pattern 103 cannot be satisfactorily obtained. Although the electrical connection to metal wiring can be improved by removing natural oxide films formed on a substrate, such as a silicon substrate surface, by hydrofluoric acid solution in a manufacturing process of common semiconductor devices, the metal thin-film-resistor object 101 is etched into not a little by the hydrofluoric acid. For this reason, if the oxide-film removal process using the hydrofluoric acid is performed before forming the metal film for the first layer metal wiring pattern 103, there is a possibility of causing variations of the resistance of the metal thin-film-resistor object 101.

According to Method (2) described with reference to FIG. 38, dry etching technology can be performed for patterning of the metal film for the first layer metal wiring pattern 109 by forming the layer insulation film 85 on the metal thin-film-resistor object 101.

However, as for forming the connection hole 107 for electrically connecting the first layer metal wiring pattern 109 and the metal thin-film-resistor object 101, it is necessary to use wet etching technology for providing the opening, which hinders miniaturization and high integration. Further, hydrofluoric acid solution is used in the wet etching process for forming the connection hole 107, and in order to prevent the metal thin-film-resistor object 101 from being etched by the hydrofluoric acid, additional processes of forming a barrier film on the metal thin-film-resistor object 101, and patterning the barrier film are required, which poses the problem in that the number of manufacturing processes is increased.

According to Method (3) described with reference to FIG. 39, a dry etching process can be applied to the metal film for the first layer metal wiring patterns 111, and a connection hole is not necessary. However, since wet etching technology has to be employed for patterning the high melting point metal film for forming the high melting point metal film pattern 113 that substantially determines the length of the metal thin-film-resistor object 101 as described above, the high melting point metal film pattern 113 tends to be etched wider than desired. The over-etching causes the substantial length of the metal thin-film-resistor object 101 to vary, resulting in variation of the resistance and difficulty in miniaturization.

Further, when forming the high melting point metal film for the high melting point metal film pattern 113, the surface of the metal thin-film-resistor object 101 is oxidized. Accordingly, hydrofluoric acid solution is used to remove the oxidized film of the metal thin-film-resistor object 101 in order to obtain satisfactory electrical connection to the high melting point metal film pattern 113. The oxidized film removal process by the hydrofluoric acid before forming the high melting point metal film pattern 113 can cause variations of the resistance of the metal thin-film-resistor object 101.

As described above, according to Methods (1) through (3) described with reference to FIG. 37 through FIG. 39, respectively, the metal thin-film-resistor object 101 is made thin, which requires a wet etching process at one of the processes. The wet etching process hinders miniaturization, and causes the resistance to vary.

Further, since the metal thin-film-resistor object 101 tends to be oxidized, forming a satisfactory electrical connection to metal wiring is difficult. To cope with this problem, additional processes are required, such as the barrier film formation process only for the metal thin-film-resistor object 101, and the oxidized film removal process by hydrofluoric acid solution, resulting in the increased number of the manufacturing processes, and variation in the resistance, respectively.

The semiconductor device of the first aspect of the present invention solves the problem such as described above.

Further, when forming a part of the metal thin-film-resistor object 101 inside the connection hole formed on the insulator layer on the metal wiring pattern, as shown in FIG. 41, step coverage (level difference covering nature) of the metal thin-film-resistor object 101 is degraded on the inner wall side of the connection hole 133, especially at the bottom of the connection hole 133. The degraded step coverage causes a problem that the contact resistance between the metal thin-film-resistor object 101 and the first layer metal wiring pattern 115 becomes great, and varies.

In view of this, according to the first aspect of the present invention, at least the upper end of the connection hole is formed in the shape of a taper, and further, a residual substance of Ar sputter etching may be formed on the inner wall of the connection hole, the residual substance including the materials of the metal wiring pattern and the underground insulator film, and Ar.

The Ar sputter etching residual substance and the taper form of the connection hole, at least at the upper end, can be formed by performing an Ar sputter etching process that uses Ar gas (called Ar sputter etching process) after the connection hole is formed in the underground insulator film.

The second aspect of the present invention provides a semiconductor device that includes an underground insulator film formed on the semiconductor substrate through another layer, the underground insulator film having a silicon oxide film that contains phosphor, or phosphor and boron at least as the uppermost layer, a metal wiring pattern formed on the underground insulator film, and a sidewall formed on the side of the metal wiring pattern, the sidewall consisting of an insulating material, wherein a metal thin-film-resistor object is formed on the metal wiring pattern and the underground insulator film through the sidewall surface.

As for the semiconductor device according to the second aspect of the present invention, an Ar sputter etching residual substance containing at least the material of the sidewall and Ar may be formed on the surface of the sidewall on the side of the underground insulator film. The Ar sputter etching residual substance can be formed by performing an Ar sputter etching process on the underground insulator film after forming the metal wiring pattern and the sidewall.

As for the semiconductor device according to the second aspect of the present invention, the metal thin-film-resistor object is formed such that it intersects the metal wiring pattern. Here, "the metal thin-film-resistor object intersecting the metal wiring pattern" concerning the second aspect means that a part of the metal thin-film-resistor object is formed covering the sidewall on one side of the metal wiring pattern and the sidewall on the other side of the metal wiring pattern through the surface of the metal wiring pattern. Further, in the third aspect, it means that a part of the metal thin-film-resistor object 21 is formed covering the surface of the underground insulator film that is formed near a side of the metal wiring pattern and the underground insulator film formed on the other side of the metal wiring pattern through the surface of the metal wiring pattern.

In the first aspect and the second aspect of the present invention, the metal wiring pattern can be constituted, for example, by the metal material pattern and the high melting point metal film formed on at least on the upper surface of the metal material pattern.

The third aspect of the present invention provides a semiconductor device that includes an underground insulator film having a silicon oxide film containing phosphor, or phosphor and boron at least as the uppermost layer, the underground insulator film being formed on the semiconductor substrate through another layer, a first connection hole and a second connection hole formed in the underground insulator film, a first conductive plug formed in the first connection hole, a second conductive plug formed in the second connection hole, being simultaneously formed with the first conductive plug, and a metal wiring pattern formed on the second conductive plug formed in the second connection hole, and on the underground insulator film, wherein the metal thin-film-resistor object is formed on the first conductive plug and on the underground insulator film.

Further, the first conductive plug and the second conductive plug consist of a first conductive material and a second conductive material formed on the first conductive material formed on the inner wall surfaces of the first connection hole and the second connection hole, respectively. At the first connection hole, the upper surface of the first conductive material is formed with an interval to (a level difference from) the upper end of the first connecting hole, and the upper surface of the second conductive material. Further, the perimeter section of the upper surface of the second conductive material, and the upper part of the first connection hole are formed in the shape of a taper. In a space between the inner wall of the first connection hole above the first conductive material and the second conductive material, an Ar sputter etching residual substance that contains at least the materials of the underground insulator film, the first conductive material, and Ar may be formed.

The taper form and the Ar sputter etching residual substance can be formed by performing an Ar sputter etching process on the underground insulator film under the conditions that the upper part of the first conductive material constituting the first conductive plug is removed when a metal film for the metal wiring pattern formed on the first conductive plug is selectively removed, and a hollow is formed in the circumference of the first conductive plug.

As for the first, the second, and the third aspects of the present invention, a metal nitride film may be provided for covering the upper surface of the metal thin-film-resistor object such that a metal oxide film may not be formed between the upper surface of the metal thin-film-resistor object and the metal nitride.

Further, as for the first, the second, and the third aspects of the present invention, the metal wiring pattern can be made the metal wiring pattern of the uppermost layer.

One of the problems with the conventional technology as described with reference to FIGS. 37 through 42 is that the reliability of a semiconductor device is degraded by a laser beam damaging the insulation layer and the silicon substrate when performing laser trimming on the metal thin-film-resistor object. Further, another of the problems is in that an electron hole pair is generated in the silicon substrate when performing online trimming, the electron hole pair causing noise at the time of a performance measurement, and hindering correct measurements.

To cope with the problems, conventionally, laser power has to be controlled to be high enough for processing and low enough to avoid causing damage. That is, the margin of allowable laser power is limited, causing difficulties in providing stable trimming.

In view of this, as for the first, the second, and the third aspects of the present invention, a laser beam transparency prevention film made of a metal material may be provided at the bottom of the underground insulator film in a region below the metal thin-film-resistor object.

Further, as for the first, the second, and the third aspects of the present invention, a part of components of the integrated circuit, other than the metal thin-film-resistor object, may be arranged in the region under the metal thin-film-resistor object.

Examples of the components of the integrated circuit that can be arranged in the region under the metal thin-film-resistor object are a transistor, a capacitor, a metal wiring pattern, a polysilicon wiring pattern, and an impurity diffusion layer.

Further, it is desirable that the thickness of the metal thin-film-resistor object is between 0.5 and 100 nm (5 and 1000 Å), more preferably between 2 and 50 nm (20 and 500 Å).

Further, it is desirable that a flattening process be carried out on the underground insulator film.

An example to which the semiconductor device of the present invention is applied is a semiconductor device including a division resistance circuit wherein a divided voltage is output by two or more resistors, and the output voltage is adjusted by cutting a fuse element. The resistors constituting the division resistance circuit are comprised of the metal thin-film-resistor object of the semiconductor device of the present invention.

Another example to which the semiconductor device of the present invention is applied is a semiconductor device including a division resistance circuit wherein a divided voltage is output by two or more resistors, and the output voltage is adjusted by laser irradiation onto the resistors. The resistors constituting the division resistance circuit are comprised of the metal thin-film-resistor object of the semiconductor device of the present invention.

Further, another example to which the semiconductor device of the present invention is applied is a semiconductor device including a voltage detector that is constituted by a division resistance circuit for dividing an input voltage, and outputting a divided voltage, a reference voltage generating circuit for supplying a reference voltage, and a comparator circuit for comparing the divided voltage provided by the division resistance circuit with the reference voltage provided by the reference voltage generating circuit.

The division resistance circuit constituting the voltage detector includes the resistor to which the metal thin-film-resistor object of the semiconductor device of the present invention is applied.

Further, another example to which the semiconductor device of the present invention is applied is a semiconductor including a constant voltage generating circuit that is constituted by an output driver for controlling an output voltage, a division resistance circuit for dividing the output voltage and supplying a divided voltage, a reference voltage generating circuit for supplying a reference voltage, and a comparator circuit for comparing the divided voltage provided by the division resistance circuit with the reference voltage provided by the reference voltage generating circuit, and for controlling operations of the output driver according to a comparison result. The division resistance circuit constituting the constant voltage generating circuit includes the resistors to which the metal thin-film-resistor object of the semiconductor device of the present invention is applied.

[Effect of the Invention]

According to the first aspect of the present invention, the underground insulator film of the metal thin-film-resistor object includes a silicon oxide film that contains phosphor, or phosphor and boron at least as the uppermost layer. By using one of a PSG film and a BPSG film that have lower atomic density than an NSG film as the insulator layer contacting the undersurface of the metal thin-film-resistor object, the metal thin-film-resistor object can be easily diffused in the underground insulator film when trimming; accordingly, lower power is required, reducing damage due to laser irradiation of regions adjacent to the metal thin-film-resistor object.

Further, according to the first aspect of the present invention, the metal thin-film-resistor object is formed on the underground insulator film and inside of the connection hole formed in the underground insulator film, and is electrically connected to the metal wiring pattern formed on the lower layer side insulator film in the connection hole. Accordingly, the patterning process by wet etching technology after forming the metal thin-film-resistor object is not required, which process is necessary in the conventional technology described with reference to FIGS. 37 through 39. Further, since the surface of the metal thin-film-resistor object contacting the metal wiring pattern is not exposed to the atmosphere, a stable and reliable electrical connection between the metal thin-film-resistor object and the metal wiring pattern can be obtained even if a process of removing an oxide film removal process and a process of forming a barrier film for preventing the metal thin-film-resistor object from etching are not performed. In this manner, the metal thin-film-resistor object that is miniaturized and provides a stable resistance can be realized regardless of the thickness of the metal thin-film-resistor object without increasing the number of processes.

Further, as for the first aspect of the present invention, if at least the upper end of the connection hole is formed in the shape of a taper, the Ar sputter etching residual substance contains at least the materials of the metal wiring pattern and the underground insulator film, and Ar is formed in the inner wall of the connection hole, the Ar sputter etching residual substance improves the step coverage of the metal thin-film-resistor object inside the connection hole, and the contact resistance between the metal wiring pattern and the metal thin-film-resistor object is stabilized. Further, the taper shape of the connection hole, formed at least at the upper end, prevents an overhang of the metal thin film deposited near the upper end of the connection hole from forming when forming the metal thin film for the metal thin film resistance object such that an influence affecting deposition of the metal thin film inside the connection hole is reduced. In this way, the step coverage of the metal thin-film-resistor object can be raised.

Further, a conventional metal thin-film-resistor object tends to receive influence from its underground film, e.g., resistance fluctuation, as the time elapses from formation of the underground film and due to structure of the underground film. In this connection, the Ar sputter etching process carried out on the underground insulator film according to the present invention is effective to mitigate the underground film dependability of the sheet resistance of the metal thin-film-resistor object, and to reduce the resistance fluctuation with time. As described above, the taper form of the upper end of the connection hole, and the Ar sputter etching residual substance are formed by performing the Ar sputter etching process after forming the connection hole; and the Ar sputter etching process is carried out on the underground film before forming the metal thin film for the metal thin-film-resistor object.

Effects obtained by the Ar sputter etching process on the underground film of the metal thin-film resistance object are described below.

According to the semiconductor device of the second aspect of the present invention, since the underground insulator film of the metal thin-film-resistor has the silicon oxide film that contains phosphor, or phosphor and boron at least as the uppermost layer, damage to regions adjacent to the metal thin-film-resistor object by laser irradiation is reduced as in the first aspect of the present invention.

Further, the second aspect includes the sidewall consisting of the underground insulator film formed through another layer on the semiconductor substrate, the metal wiring pattern formed on the underground insulator film, and an insulating material formed on the side of the metal wiring pattern, wherein the metal thin-film-resistor object is formed covering the underground insulator film and the metal wiring pattern through the sidewall surface. For this reason, patterning by wet etching technology is not necessary after forming the metal thin-film-resistor object. Further, since the contact surface of the metal thin-film-resistor object with the metal wiring pattern is not exposed to the atmosphere, even if the process of removing the oxide-film and the process of forming the barrier film for etching prevention of the metal thin-film-resistor object are not performed, a stabilized and satisfactory electrical connection between the metal thin-film-resistor object and the metal wiring pattern can be obtained. In this way, the second aspect of the present invention provides a metal thin-film-resistor object that can be made small and can provide a stable resistance regardless of the thickness of the metal thin-film-resistor object without increasing the number of manufacturing processes.

Further, since the metal thin-film-resistor object is formed covering the metal wiring pattern, the sidewall surface, and the underground insulator film, the step coverage of the metal thin-film-resistor object can be prevented from degrading due to a steep level difference resulting from the metal wiring pattern side, and stabilization of the resistance of the metal thin-film-resistor object is realized.

Further, since the metal thin-film-resistor object is formed covering the metal wiring pattern, the sidewall surface, and the underground insulator film, the process of forming the connection hole is dispensed with, which process is required where the electrical connection between the metal thin-film-resistor object and the wiring pattern is made through the connection hole. Accordingly, the manufacturing process is simplified and shortened, the resistance of the metal thin-film-resistor object does not change, and the contact resistance with the electrode does not increase due to degradation of the step coverage of the metal thin-film-resistor object, which are concerns where the connection hole is used.

Further, if the Ar sputter etching residual substance containing at least the material of the sidewall and Ar is formed on the surface of the side of the insulator layer of the sidewall, the underground film dependability of the sheet resistance of the metal thin-film-resistor object can be mitigated, and resistance change with the passage of time can be reduced by the fact that the Ar sputter etching process is carried out on the underground insulator film before forming the metal thin film for the metal thin film resistor. Here, the Ar sputter etching residual substance can be formed by performing the Ar sputter etching process to the underground insulator film after forming the metal wiring pattern and the sidewall. Effects acquired by performing the Ar sputter etching process on the underground film of the metal thin-film-resistor object are described in detail below.

Further, in the second aspect, the metal thin-film-resistor object may be formed intersecting the metal wiring pattern. In this case, fluctuation of the contact area between the electrode and the metal thin-film-resistor object can be prevented from occurring, the fluctuation being due to a superposition gap (displacement) between the thin-film-resistor object and the metal wiring pattern, and rounding of the end of the metal thin-film-resistor object. Thus, further stabilized contact resistance is obtained.

According to the first aspect and the second aspect of the present invention, the metal wiring pattern may be constituted by a metal material pattern, and a high melting point metal film formed on at least the upper surface of the metal material pattern. In this case, since the high melting point metal film is formed between the metal thin-film-resistor object and the metal material pattern, variation in the contact resistance between the metal thin-film-resistor object and the metal wiring pattern can be reduced. In this way, precision of the resistance and improvement in the yield are obtained. Further, in general, with a structure where a metal thin-film-resistor object and a metal material directly touch, the contact resistance tends to be sharply changed by a low temperature heat treatment of about 300-400° C. This problem is solved by the high melting point metal film as described above.

In the third aspect of the semiconductor device of the present invention, the underground insulator film of the metal thin-film-resistor object has the silicon oxide film containing phosphor, or phosphor and boron at least as the uppermost layer. Accordingly, damage to the regions adjacent to the metal thin-film-resistor object by laser irradiation is reduced as in the first aspect and the second aspect of the present invention.

Further, the semiconductor device includes an underground insulator film formed on a semiconductor substrate through another layer, a first connection hole and a second connection hole formed in the underground insulator film, a first conductive plug formed inside the first connection hole, a second conductive plug formed inside the second connection hole, being simultaneously formed with the first conductive plug, and a metal wiring pattern formed on the second conductive plug and the underground insulator film, wherein a metal thin-film-resistor object is formed on the first conductive plug and the underground insulator film. Accordingly, patterning by wet etching technology after forming the metal thin-film-resistor object is not required of the third aspect. Further, since the contact surface of the metal thin-film-resistor object with the first conductive plug is not exposed to the atmosphere, a stabilized and satisfactory electrical connection between the metal thin film resistor object and the first conductive plug can be obtained without performing the process of removing the oxide film and the process of forming the barrier film for etching prevention of the metal thin-film-resistor object. In this way, miniaturization of the metal thin-film-resistor object and stabilization of the resistance can be realized regardless of the thickness of the metal thin-film-resistor object without increasing the number of processes.

Further, the metal thin-film-resistor object is formed on the first conductive plug formed inside the first connection hole and on the underground insulator film, which contrasts with the case described with reference to FIG. 41 where the metal thin-film-resistor object and the metal wiring pattern are electrically connected through the connection hole formed on the metal wiring pattern. Accordingly, the semiconductor device of the third aspect of the present invention is free from the resistance change of the metal thin-film-resistor object and the increase in the contact resistance with the electrode, which result from degradation of the step coverage of the metal thin-film-resistor object.

Further, since the second conductive plug for electrically connecting the metal wiring patterns of upper and lower layers is formed simultaneously with the first conductive plug for taking the electrical connection of the metal thin-film-resistor object, the formation process of an insulator layer 123, and the process of exclusively forming a second connection hole 125 and a second conductive plug 127 are dispensed with, which processes are described with reference to FIG. 40. Accordingly, the metal thin-film-resistor object can be formed for low cost and in a short time without increasing the number of the manufacturing processes.

As described, according to the third aspect, stabilization of the resistance of the metal thin-film-resistor object can be realized without sharply increasing the number of the manufacturing processes.

Further, the first conductive plug and the second conductive plug formed on the inner wall surface of the first connection hole and the second connection hole, respectively, consist of the first conductive material and the second conductive material formed on the first conductive material. As for the first connection hole, the upper end of the first conductive material is formed with an interval to (a level difference from) the upper end of the first connection hole and the upper surface of the second conductive material. The perimeter section of the upper surface of the second conductive material and the upper end of the first connection hole are formed in a taper form. An Ar sputter etching residual substance containing at least the material of the underground insulator film, the first conductive material, and Ar may be formed to a space between the inner wall of the first connection hole and the second conductive material on the first conductive material.

As described above, the taper form and the Ar sputter etching residual substance are formed by performing an Ar sputter etching process on the underground insulator film in the state where the upper part of the first conductive material constituting the first conductive plug is removed, and the hollow is formed in the circumference of the first conductive plug. By forming the circumferential section of the upper surface of the second conductive material and the upper end the first connection hole in the taper form, and by forming the Ar sputter etching residual substance in the space between the inner wall of the first connection hole and the second conductive material on the first conductive material, the step coverage of the metal thin-film-resistor object near the first connection hole can be improved, and stabilization of and improvement in precision of the resistance of the metal thin-film-resistor object can be obtained.

Further, by performing the Ar sputter etching process on the underground insulator film before formation of the metal thin-film-resistor object, the underground film dependability and change with time of sheet resistance of the metal thin-film-resistor object are mitigated. In this way, stabilization of the resistance of the metal thin-film-resistor object can be realized. Effects acquired by performing the Ar sputter etching process on the underground film of the metal thin-film-resistor object are described below.

As for the first, the second, and the third aspects of the present invention, a metal nitride film can be formed for covering the upper surface of the metal thin-film-resistor object such that a metal oxide film is not formed between the upper surface of the metal thin-film-resistor object and the metal nitride. Since the upper surface of the metal thin-film-resistor object is not oxidized, stabilization and improvement in precision of the resistance of the metal thin-film-resistor object are obtained.

As for the first, the second, and the third aspects of the present invention, the metal wiring pattern may be made of a metal wiring pattern of the uppermost layer. Then, design flexibility is enhanced, since layout change of the metal thin-film-resistor object, for example, can be carried out by layout change of the metal thin-film-resistor object and the metal wiring pattern of the uppermost layer.

Further, by arranging the metal thin-film-resistor object higher than the insulator layer in which the metal wiring pattern of the uppermost layer is formed, a final protective coat consisting of an insulating material is formed on the upper layer of the metal thin-film-resistor object, which allows the insulating material on the metal thin-film-resistor object to be thinner, and film thickness variation can be made smaller as compared with the case where an insulator layer other than the final protective coat is also formed on the upper layer of the metal thin-film-resistor object. In this way, variation of interference of the insulating material on the metal thin-film-resistor object to a laser beam is made small, and variation in laser energy provided to the metal thin-film-resistor object can be made small, resulting in raised accuracy of laser trimming wherein the laser beam is irradiated onto the metal thin-film-resistor object. Further, since the insulating material on the metal thin-film-resistor object is made thin, heat dissipation capacity is improved, and a temperature rise of the metal thin-film-resistor object resulting from the laser irradiation at the time of the trimming process, etc., can be mitigated.

As for the first, the second, and the third aspects of the present invention, a laser-beam transparency prevention film consisting of a metal material may be formed in a region under the metal thin-film-resistor object, and between the underground insulator film and components of the integrated circuit. In this way, even if the laser beam is irradiated onto the metal thin-film-resistor object at intensity sufficient for cutting or modifying the metal thin-film-resistor object when performing the laser trimming process, since the laser beam that penetrates the underground insulator film is reflected onto the opposite side of the semiconductor substrate by the laser-beam transparency prevention film, the laser beam is prevented from irradiating the semiconductor substrate and the components of the integrated circuit. Accordingly, even if the components of the integrated circuit are arranged under the metal thin-film-resistor object, the components of the integrated circuit are prevented from being damaged, or from changing properties. Further, degradation of the reliability of the semiconductor device resulting from irradiation of the laser beam onto the semiconductor substrate at the laser trimming process can be prevented from occurring. Further, generating of an electron hole pair by irradiation of the laser beam onto the semiconductor substrate at the online trimming process can be prevented, and highly precise trimming processing can be performed.

In the semiconductor device of the present invention, if at least a part of the components of the integrated circuit other than the metal thin-film-resistor object, for example, a transistor, a capacitor, a metal wiring pattern, a polysilicon wiring pattern, and an impurity diffusion layer is arranged in the region under the metal thin-film-resistor object, an area for chip mounting can be reduced.

Further, the first, the second, and the third aspects of the present invention can be applied to a metal thin-film-resistor object having a thickness between 0.5 and 100 nm (5 and 1000 Å), preferably between 2 and 50 nm (20 and 500 Å), for realizing miniaturization of the metal thin-film-resistor object, and stabilization of the resistance of the metal thin-film-resistor without increasing the number of manufacturing processes. This is because a stabilized and satisfactory electrical connection of the metal thin-film-resistor object to the metal wiring pattern is obtained, as described above, even if the wet etching is not performed for patterning after forming the metal thin-film-resistor object, and the a process of removing an oxide film and the process of forming the barrier film for etching prevention of the metal thin-film-resistor object are not performed, given that the contact surface of the metal thin-film-resistor object with the metal wiring pattern is not exposed to the atmosphere.

Further, if the Ar sputter etching residual substance may be formed as described above, the underground film dependability of sheet resistance of the metal thin-film-resistor object is mitigated. Accordingly, the present invention can be applied to a semiconductor device with a metal thin-film-resistor object having the film thickness as described above, and the resistance of the metal thin-film-resistor object is stabilized.

Further, a flattening process may be carried out on the underground insulator film of the semiconductor device of the present invention. Then, variations of the resistance value metal thin-film-resistor object due to level difference of the insulator layer can be prevented from occurring.

Further, if a semiconductor device that includes a division resistance circuit for dividing an input voltage by two or more resistors and can adjust the divided voltage by cutting a fuse element uses the metal thin-film-resistor object and the underground insulator film that constitute the semiconductor device of the present invention as the resistors constituting the division resistance circuit, damage to the regions adjacent to the metal thin-film-resistor object due to laser irradiation during the trimming process can be reduced, and precision of the output voltage of the division resistance circuit can be raised.

Further, if a semiconductor device that includes a division resistance circuit for dividing an input voltage by two or more resistors and can adjust the divided voltage by irradiating a laser light onto the resistors uses the metal thin-film-resistor object and the underground insulator film that constitute the semiconductor device of the present invention as the resistors constituting the division resistance circuit, damage to the regions adjacent to the metal thin-film-resistor object due to laser irradiation during the trimming process can be reduced, and precision of the output voltage of the division resistance circuit can be raised.

Further, if a semiconductor device that includes a voltage detector constituted by a division resistance circuit for dividing an input voltage and supplying a divided voltage, a reference voltage generating circuit for supplying a reference voltage, and a comparator circuit for comparing the divided voltage provided by the division resistance circuit with the reference voltage provided by the reference voltage generating circuit uses the metal thin-film-resistor object and the underground insulator film constituting the semiconductor device of the present invention as resistors of the division resistance circuit, precision of the output voltage can be raised, and accordingly, detection precision of the voltage detector can be raised.

Further, if a semiconductor device that include a constant voltage generating circuit constituted by an output driver for controlling output of an input voltage a division resistance circuit for dividing the output voltage and supplying a divided voltage, a reference-voltage generating circuit for supplying a reference voltage, and a comparator circuit for comparing the divided voltage from the division resistance circuit with the reference voltage from the reference-voltage generating circuit and controlling operations of the output driver according to a comparison result uses the metal thin-film-resistor object, the underground insulator film, and the laser-beam transparency prevention film constituting the semiconductor device of the present invention as resistors of the division resistance circuit, the stability of the output voltage of the constant voltage generating circuit can be raised because precision of the output voltage can be raised by the division resistance circuit to which the present invention is applied.

DESCRIPTION OF THE PREFERRED EMBODIMENTS

In the following, embodiments of the present invention are described with reference to the accompanying drawings.

Figure 1A:
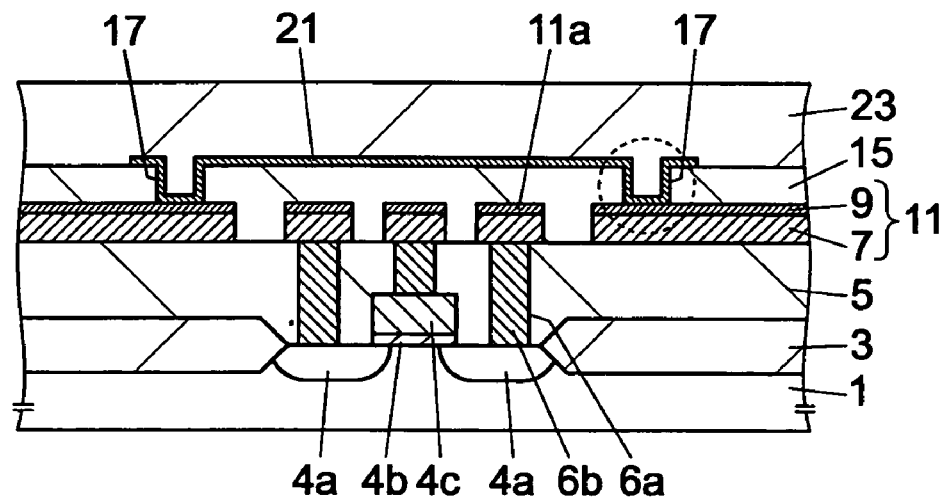
FIG. 1A is a cross-sectional view showing a formation region of a metal thin-film-resistor object according to an embodiment of the first aspect of the present invention.
Figure 1B:
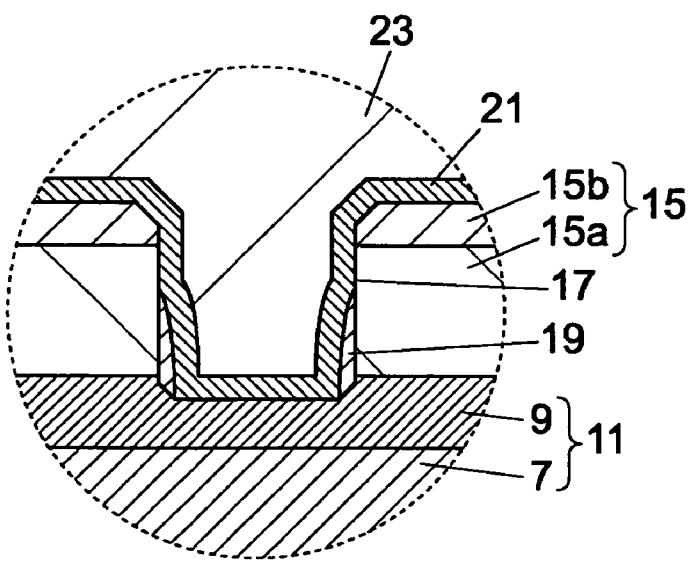
FIG. 1B is a cross-sectional view showing an expanded view of a portion surrounded by a dashed line in FIG. 1A.

FIG. 1A is a cross-sectional view showing a formation region of a metal thin-film-resistor object according to an embodiment of the first aspect of the present invention, and FIG. 1B is a cross-sectional view showing an expanded view of a portion surrounded by a dashed line in FIG. 1A.

A device separating oxide film 3 is formed on a silicon substrate 1. Impurity diffusion layers 4a and 4a are formed in a region that is to correspond to the bottom of a metal thin-film-resistor object 21 that is described below, surrounded by the device separating oxide film 3, and on the surface of the silicon substrate 1. On the silicon substrate 1 between the impurity diffusion layers 4a and 4a, a gate electrode 4c consisting of a polysilicon film is formed through a gate insulator layer 4b, whereby a transistor is formed.

A first layer insulation film (lower layer side insulator film) 5 consisting of a BPSG film or a PSG film is formed on the silicon substrate 1 including the formation region of the device separating oxide film 3 and the transistor. Contact holes 6a are formed in the first layer insulation film 5 corresponding to the impurity diffusion layers 4a and 4a, and the gate electrode 4c. In the contact holes 6a, tungsten, for example, is embedded, and conductive plugs 6b are formed.

On the first layer insulation film 5 and the conductive plugs 6b, the first layer metal wiring patterns 11 and 11a are formed, consisting of a metal material pattern 7 and a high melting point metal film 9 formed on the surface of the metal material pattern 7. The metal material pattern 7 is formed, for example, with an AlSiCu film. The high melting point metal film 9 is formed, for example, with a TiN film, serving as a barrier film and an antireflection film. Corresponding to the conductive plugs 6b, a first layer metal wiring pattern 11a is formed in the region corresponding to the bottom of the metal thin-film-resistor object 21 in the perpendicular direction of the drawing.

A second layer insulation film (underground insulator film) 15 is formed on the first layer insulation film 5 including the formation region of the first layer metal wiring patterns 11 and 11a, the second layer insulation film 15 being constituted by, e.g., a plasma NSG film 15a, an SOG film, and a plasma PSG film 15b in this sequence from bottom to top. In FIG. 1A, the second layer insulation film 15 is illustrated in one body, and the SOG film is not formed in the region shown in FIG. 1B. Connection holes 17 are formed in the second layer insulation film 15 corresponding to both ends of the metal thin-film-resistor object 21 and the first layer metal wiring pattern 11.

As shown in FIG. 1B, the bottom of each connection hole 17 is formed by removing a part of the surface of the high melting point metal film 9, and the upper end of the connection hole 17 is formed in a taper form. Further, an Ar sputter etching residual substance 19 is formed on the inner wall of the connection hole 17. The Ar sputter etching residual substance 19 and the taper form of the upper end of the connection hole 17 are omitted from illustration in FIG. 1A. The taper form and the Ar sputter etching residual substance 19 of the connection hole 17 are formed by performing an Ar sputter etching process on the second layer insulation film 15 in which the connection hole 17 is formed. Therefore, the Ar sputter etching residual substance 19 contains Ar, and the materials of the high melting point metal film 9 and the second layer insulation film 15; and in this example, contains Ar, Ti, N, Si, and O.

A CrSi thin-film-resistor object (a metal thin-film-resistor object) 21 is formed on the second layer insulation film 15 between the connection holes 17 and 17, inside of the connection holes 17 and 17, and on the first layer metal wiring pattern 11. The ends of the CrSi thin-film-resistor object 21 are electrically connected to the first layer metal wiring pattern 11 in the corresponding connection holes 17 and 17. Below the CrSi thin-film-resistor object 21, the first layer metal wiring pattern 11a is arranged through the second layer insulation film 15.

On the second layer insulation film 15 including the formation region of the CrSi thin-film-resistor object 21, a passivation film 23 serving as a final protective coat is formed, the passivation film 23 being constituted by a lower layer of a silicon oxide film and an upper layer of a silicon nitride film (illustrated in one body in FIG. 1A and FIG. 1B). A polyimide film may be formed on the passivation film 23.

Since the underground insulator film 15 of the CrSi thin-film-resistor object 21 is constituted by the PSG film 15b in the uppermost layer in this embodiment, the PSG film 15b having lower atomic low density than an NSG film, the CrSi thin-film-resistor object 21 is easily diffused in the underground insulator film 15 when laser trimming is performed, i.e., the trimming at low power is possible, and damage to regions adjacent to the metal thin-film-resistor object 21 by laser irradiation can be reduced. This is an advantage of the embodiment as compared with the case where the NSG film is used as an insulator layer that contacts the undersurface of the CrSi thin-film-resistor object 21.

Further, since the transistor as a component of the integrated circuit and the first layer metal wiring pattern 11a are arranged in the region under the CrSi thin-film-resistor object 21, miniaturization of the chip can be attained.

Further, as shown in FIG. 1B, since the Ar sputter etching residual substance 19 is formed in the inner wall of the connection hole 17, step coverage of the CrSi thin-film-resistor object 21 within the connection hole 17 is improved. In this way, stabilization of contact resistance with the first layer metal wiring pattern 11 of the CrSi thin-film-resistor object 21 is realized.

Further, since the upper end of the connection hole 17 is formed in the shape of a taper, an overhang of the CrSi thin film deposited near the upper end of the connection hole 17 is prevented from forming, when forming the CrSi thin film formation for forming the CrSi thin-film-resistor object 21. Accordingly, the influence affecting deposition of the CrSi thin film into the connection hole 17 is reduced; as a result, step coverage of the CrSi thin-film-resistor object 21 can be raised.

FIGS. 2A through 2D are cross-sectional views for explaining an example of the manufacturing method of the semiconductor device according to the embodiment described with reference to FIGS. 1A and 1B. FIG. 3 is a cross-sectional view showing an expanded view of the neighborhood of the connection hole 17 after performing the Ar sputter etching process according to the manufacturing method. In FIGS. 2A through 2D, illustration of the sidewall formed on the inner wall of the connection hole and the taper form of the upper end of the connection hole is omitted. The examples of the manufacturing processes are described with reference to FIGS. 1A, 1B, 2A through 2D, and 3.

Process (1): With well-known technology, the device separating oxide film 3 is formed on the surface of the silicon substrate 1 that is wafer-shaped. Further, the impurity diffusion layers 4a and 4a, the gate insulator layer 4b, and the gate electrode 4c, constituting the transistor, are formed in the region corresponding to the bottom of the CrSi thin-film-resistor object.

The first layer insulation film 5 consisting of a BPSG film or a PSG film is formed at about 800 nm (8000 Å) thickness using, for example, atmospheric pressure CVD equipment on the silicon substrate 1 to which the device separating oxide film 3, the transistor, etc., have been formed. Then, heat treatment such as reflow is performed, and the surface of the first layer insulation film 5 is flattened.

By a photoengraving process and an etching process, contact holes 6a are formed corresponding to the impurity diffusion layers 4a and 4a and the gate electrode 4c. An electrically conductive material such as tungsten is formed all over the first layer insulation film 5 including the formation region of the contact holes 6a. Then, an etch back process or a CMP process is performed such that unnecessary tungsten is removed, and conductive plugs 6b are formed in the contact holes 6a.

A metal film for wiring that consists of an AlSiCu film is formed on the first layer insulation film 5 at about 500 nm (5000 Å) thickness using, for example, DC magnetron sputtering equipment. Then, the high melting point metal film, a TiN film in this embodiment, serving as an antireflection film, is continuously formed in a vacuum on the metal film at about 80 nm (800 Å) thickness using a well-known technology. Here, since the high melting point metal film at a later process also serves as a barrier film for stabilizing the contact resistance between the metal material pattern formed from the metal film for wiring and the metal thin-film-resistor object 21, it is desirable to form the metal film for wiring and the high melting point metal film continuously in the vacuum.

Figure 2A:
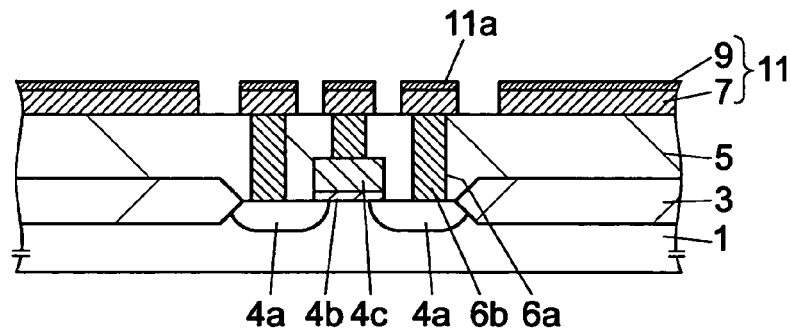
FIGS. 2A through 2D are cross-sectional views showing an example of a manufacturing method for manufacturing the metal thin-film-resistor object according the embodiment.
Figure 3:
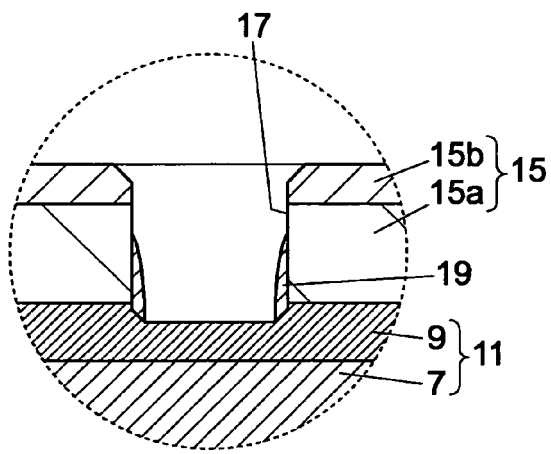
FIG. 3 is a cross-sectional view showing an expanded view of near a connection hole after performing an Ar sputter etching process in the manufacturing method shown by FIGS. 2A through 2D.

Using a well-known photoengraving process and a well-known etching process, the high melting point metal film and the metal film for wiring are patterned, and the first layer metal wiring patterns 11 and 11a consisting of the metal material pattern 7 and the high melting point metal film 9 are formed (refer to FIG. 2A). Since the high melting point metal film 9 serving as the antireflection film is formed on the metal film for wiring at this time, flattening and thinning of a resist pattern for demarcating the formation region of the first layer metal wiring pattern 11 can be reduced to a minimum degree. The first layer metal wiring pattern 11a is formed on the conductive plugs 6b and the first layer insulation film 5, and is arranged in a region corresponding to the bottom of the CrSi thin-film-resistor object.

Further, the metal thin-film-resistor object 21 is not formed at this stage; however, the first layer insulation film 5 serves as the underground film of the first layer metal wiring pattern 11, so that it is possible to perform patterning of the first layer metal wiring pattern 11 with sufficient over-etching with dry etching technology. That is, there is no need of using wet etching technology, which is the problem of the conventional technology, and miniaturization of a circuit is realized.

Process (2): A plasma NSG film is formed at about 600 nm (6000 Å) thickness on the first layer insulation film 5 including the formation region of the first layer metal wiring patterns 11 and 11a by, for example, a plasma CVD method. Then, the SOG film is formed on a plasma CVD oxide film, and a flattening process is performed by, for example, performing an SOG coating process and an etch back process, which are well-known technologies. Further, the plasma PSG film is formed in about 200 nm (2000 Å) thickness. In this way, the second layer insulation film 15 constituted by the plasma NSG film, the SOG film, and the plasma PSG film in this sequence from bottom to top is formed (refer to FIG. 2B).

Process (3): The resist pattern is formed by a well-known photoengraving process, the resist pattern being for forming the connection holes to the second layer insulation film 15 at positions that correspond to regions where both ends of the metal thin-film-resistor object 21 are to come and the first layer metal wiring pattern 11.

Then, the connection holes 17 are formed in the second layer insulation film 15 by selectively removing the second layer insulation film 15 with the resist pattern serving as the mask by using, for example, parallel flat type plasma etching equipment under the conditions of RF power: 700 W, Ar: 500 sccm (standard cc per minute), CHF3: 500 sccm, CF4: 500 sccm, and pressure: 466.6 Pa (3.5 Torr). At the bottom of the connection holes 17, the high melting point metal film 9 serving as the barrier film and the antireflection film remains at a thickness of about 60 nm (600 Å).

Figure 2B:
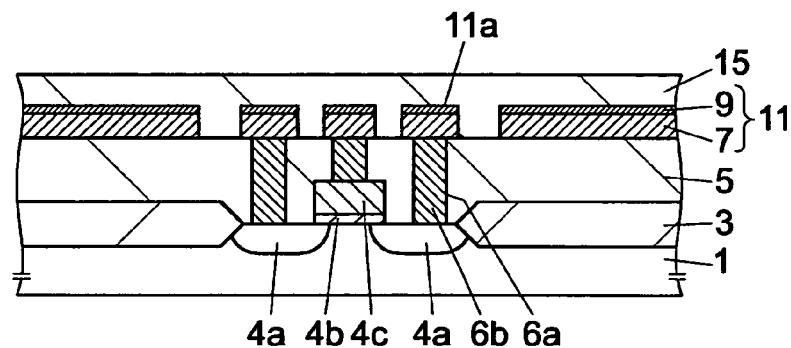
Figure 2C:
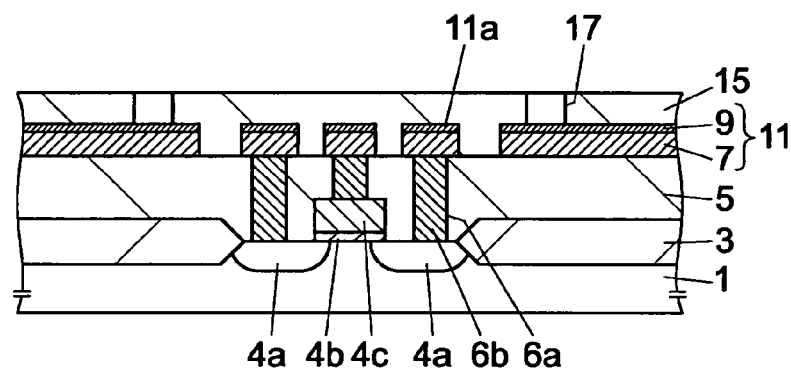

Then, the resist pattern is removed (refer to FIG. 2C).

Here, after the formation of the connection holes 17, a subproduct removal process may be performed for removing a subproduct adhered to the side wall of the connection holes 17, and the like, at the time of etching.

Further, the shape of the connection holes 17 may be improved in order to enhance the step coverage of the metal thin-film-resistor object 21 in the connection holes 17 by performing, for example, taper etching by changing etching conditions, and by an etching process that combines wet etching technology and dry etching technology.

Further, in Process (3) described above, the plasma etching conditions may be optimized such that the etching rate of the high melting point metal film 9 is made further lower than the etching rate of the second layer insulation film 15, and then the thickness of the high melting point metal film 9 remaining at the bottom of the connection holes 17 is made greater than this example of the manufacturing method. Further, it is also possible to obtain a sufficient thickness of the high melting point metal film 9 after formation of the connection holes 17, while the thickness of the high melting point metal film 9 is made thinner when being formed. As described, since Process (3) for forming the connection holes 17 is performed before the metal thin-film-resistor object 21 is formed, the connection holes 17 can be processed without restrictions resulting from the thinness of the metal thin-film-resistor object 21. That is, miniaturization can be pursued using dry etching technology.

Process (4): The Ar sputter etching process is performed to the surface of the second layer insulation film 15 including the inside of the connection holes 17, for example, in an Ar sputter etching of multi chamber sputtering equipment under the conditions in a vacuum of DC-bias: 1250 V, Ar: 20 sccm, pressure: 1.13 Pa (8.5 mTorr), and processing time: 20 seconds. The etching conditions are equivalent to conditions that etch about 5 nm (50 Å) of a thermal oxidation film formed in wet atmosphere of 1000° C. The film thickness of the high melting point metal film 9 remaining at the bottom of the connection holes 17 bottom is about 50 nm (500 Å) after this process.

After the formation of the Ar sputter etching process, the CrSi thin film (metal thin film) 27 for the metal thin film resistor object is formed keeping the vacuum state. Specifically, the semiconductor wafer is transported from the Ar sputter etching chamber to a sputter chamber that is equipped with a CrSi target (Si/Cr=80/20 wt %). The process is performed using the CrSi target under the conditions of DC power: 0.7 kW, Ar: 85 sccm, pressure: 1.13 Pa (8.5 mTorr), and processing time: 9 seconds. Then, the CrSi thin film 27 is formed in about 5 nm (50 Å) thickness all over the second layer insulation film 15 including the inside of the connection holes 17 (refer to FIGURE D).

As described above, the Ar sputter etching residual substance 19 consisting of Ar, the materials of the high melting point metal film 9, and the second layer insulation film 15 is formed on the inner wall of the connection hole 17, and the upper end of the connection holes 17 can be formed in the taper form as shown in FIG. 3 by performing the Ar sputter etching process to the second layer insulation film 15 including the inside of the connection holes 17 before forming the CrSi thin film 27 for the metal thin film resistor object. The Ar sputter etching residual substance 19 improves the step coverage of the CrSi thin film 27 in the connection holes 17. The taper shape formed at the upper end of the connection holes 17 prevents the CrSi thin film 27 deposited near the upper end of connection holes 17 from overhanging, and the CrSi thin film 27 can be properly deposited in the connection holes 17, resulting in improvement of the step coverage of the CrSi thin film 27.

Further, the Ar sputter etching process removes a natural oxide film formed on the surface of the high melting point metal film 9 at the bottom of the connection holes 17, and the first layer metal wiring pattern 11 and the CrSi thin film 27 are electrically connected at a satisfactory level.

Further, the Ar sputter etching process improves the underground film dependability of the CrSi thin-film-resistor object formed from the CrSi thin film 27 at a later process. This effect is described below.

Process (5): The resist pattern for demarcating the formation region of the metal thin-film-resistor object 21 on the CrSi thin film 27 is formed using a photoengraving process. Then, the CrSi thin film 27 is patterned using, for example, RIE (reactive ion etching) equipment with the resist pattern serving as the mask, and the CrSi thin-film-resistor object 21 is formed. Then, the resist pattern is removed. Here, the CrSi thin-film-resistor object 21 is electrically connected to the first layer metal wiring pattern 11 within the connection holes 17. Accordingly, a process of removing a metal oxide film from the surface of the CrSi thin-film-resistor object 21, which process uses hydrofluoric acid solution, is not required according to the present invention, the process being required of the conventional technology.

Next, the silicon oxide film and silicon nitride film serving as the passivation film 23 are formed one by one on the second layer insulation film 15 including the formation region of the CrSi thin-film-resistor object 21 using, for example, the plasma CVD method. In this way, the semiconductor device is completed (refer to FIGS. 1A and 1B).

According to this manufacturing method of the present invention, the first layer metal wiring pattern 11 and the connection holes 17 are first formed, then the CrSi thin-film-resistor object 21 is formed, and the CrSi thin-film-resistor object 21 and the first layer metal wiring pattern 11 are electrically connected in the connection holes 17. Accordingly, patterning by wet etching technology after carrying out patterning of the CrSi thin-film-resistor object 21 is not necessary.

Further, since the contact surface of the CrSi thin-film-resistor object 21 with the first layer metal wiring pattern 11 is not exposed to the atmosphere, even a process of removing an oxide-film is not performed, and a barrier film is not formed for etching prevention of the CrSi thin-film-resistor object 21, a stabilized and sufficient electrical connection is obtained between the CrSi thin-film-resistor object 21 and the first layer metal wiring pattern 11.

In this way, miniaturization and resistance stabilization of the CrSi thin-film-resistor object 21 are realized regardless of the thickness of the CrSi thin-film-resistor object 21 without increasing the number of manufacturing processes.

Further, since the high melting point metal film 9 serving as the barrier film is formed between the CrSi thin-film-resistor object 21 and the metal material pattern 7, the variation in the contact resistance between the CrSi thin-film-resistor object 21 and the first layer metal wiring pattern 11 can be reduced, and precision of the resistance and improvement in the yield are obtained.

Further, since the high melting point metal film 9 serves as the barrier film and the antireflection film, and the high melting point metal film 9 can be formed without increasing the manufacturing process compared with the conventional technology, the contact resistance between the metal thin-film-resistor object 21 and the metal wiring pattern is stabilized without increasing the manufacture cost.

Figure 4:
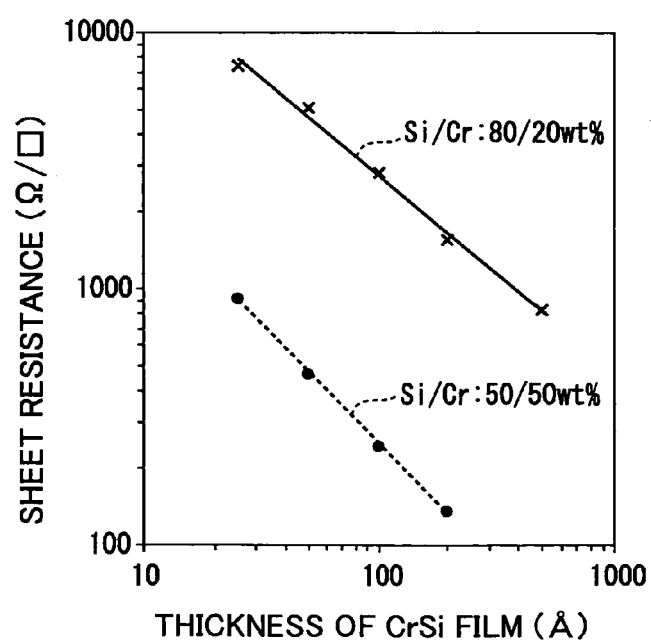
FIG. 4 is a graph showing relations between sheet resistance and thickness of a metal thin-film-resistor object formed according to the present invention, wherein the vertical axis represents the sheet resistance ($\Omega/\square$), and the horizontal axis represents the thickness of a CrSi film (Å)
Figure 5:
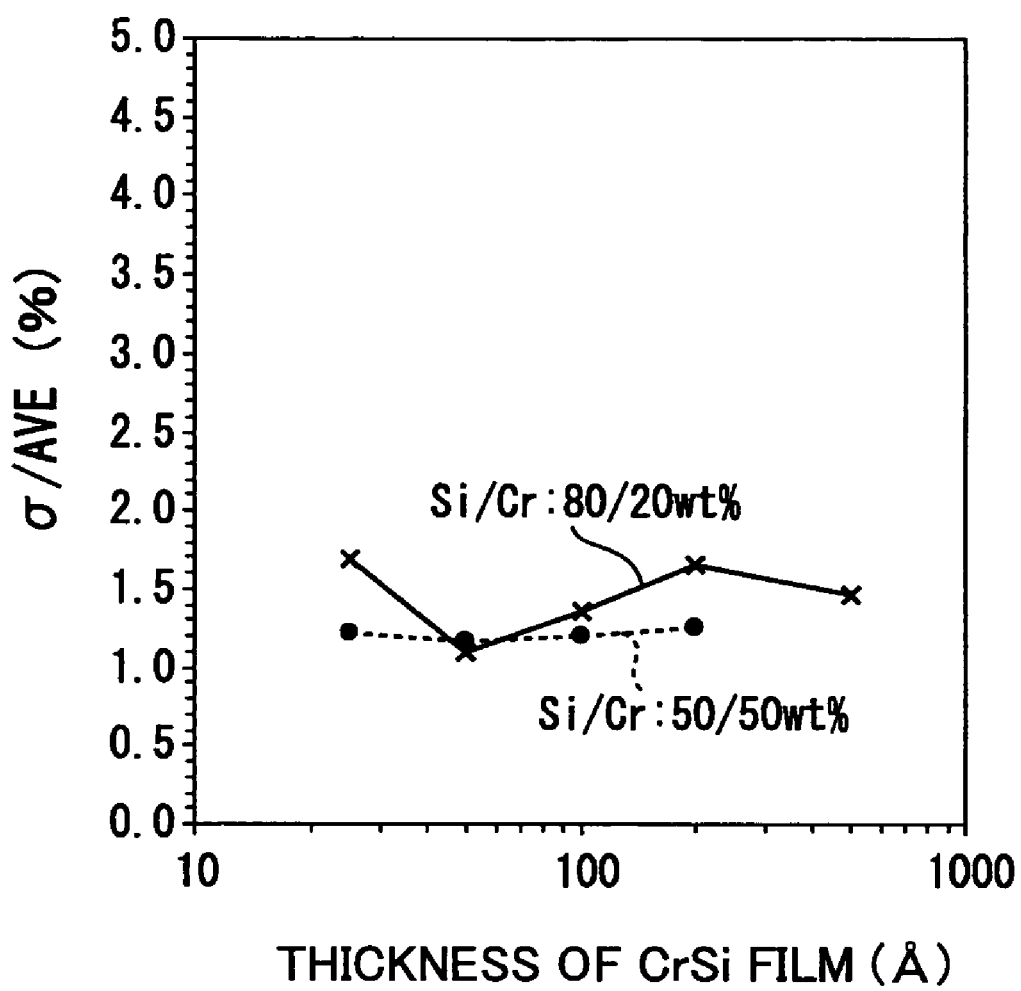
FIG. 5 is a graph showing relations between a value $\sigma$/AVE and film thickness, wherein $\sigma$ is the standard deviation of 63 sheet resistance values measured at 63 points on a wafer of the metal thin-film-resistor object formed according to the present invention, and AVE is the average of the 63 values; the vertical axis representing $\sigma$/AVE (%) and the horizontal axis representing the thickness of a CrSi film (Å)

With reference to FIG. 4 and FIG. 5, properties of a metal thin-film-resistor object having the same structure as the above embodiment are described. FIG. 4 is a graph showing relations between sheet resistance and thickness of the metal thin-film-resistor object 21, wherein the vertical axis represents the sheet resistance ($\Omega/\square$), and the horizontal axis represents the thickness of a CrSi film (Å). FIG. 5 is a graph showing relations between a value σ/AVE and film thickness, wherein C is the standard deviation of 63 sheet resistance values measured at 63 points on the wafer of the metal thin-film-resistor object 21, and AVE is the average of the 63 values, the vertical axis representing σ/AVE (%) and the horizontal axis representing the thickness of a CrSi film (Å).

The formation conditions of the metal thin-film-resistor object 21 are as follows.

Two samples having CrSi thin films, thickness of which ranged between 2.5 and 50 nm (25 and 500 Å), are produced using multi chamber sputtering equipment by adjusting processing-time under the conditions of DC power: 0.7 kW, Ar: 85 sccm, pressure: 1.13 Pa (8.5 mTorr), target (1): Si/Cr=50/50 wt %, and target (2): Si/Cr=80/20 wt %. Here, a sample of Si/Cr=50/50 wt % is not produced for the thickness of 50 nm (500 Å).

Further, the Ar sputter etching process before forming the CrSi thin film is performed using the multi chamber sputtering equipment under the conditions of DC-bias: 1250 V, Ar: 20 sccm, pressure: 1.13 Pa (8.5 mTorr), and processing time: 160 seconds. This is a process equivalent to carrying out etching removal of 40 nm (400 Å) of a thermal oxidation film formed in wet atmosphere at 1000° C.

Further, an AlSiCu film of 500 nm (5000 Å) thickness is used as lower layer metal wiring connected to the metal thin-film-resistor object 21, and no TiN film is formed on the AlSiCu film at the connection holes between the AlSiCu film and the CrSi thin film.

Sheet resistance is measured by a two-terminal method wherein current is measured while applying a voltage of 1V to both ends of one of 20 stripes of the metal thin-film-resistor object 21, each stripe being 0.5 μm wide and 50 μm long at intervals of 0.5 μm.

Here, the plane size of the connection hole that connects the metal wiring and the CrSi thin-film-resistor object is 0.6 μm×0.6 μm.

As shown in FIG. 4, regardless of the composition of the targets (i.e., Si/Cr=50/50 wt %, and Si/Cr=80/20 wt %), linearity of the thickness vs. sheet resistance is maintained for thickness between 2.5 and 20 nm (25 Å and 200 Å) or greater. That is, a metal thin-film-resistor object can be miniaturized and formed very thin, which the conventional technology is not able.

Further, as shown by FIG. 5, the variation in the sheet resistance among the 63 points of the wafer surface is hardly influenced by the thickness, and the variation in resistance is sufficiently small and stable with both targets (Si/Cr=50/50 wt %, and Si/Cr=80/20 wt %). As described above, the Ar sputter etching process adopted as the formation method of the sidewall in the connection holes realizes formation of a miniaturized metal thin-film-resistor object pattern having a stable resistance regardless of the thickness of the metal thin-film-resistor object 21.

Figure 6A:
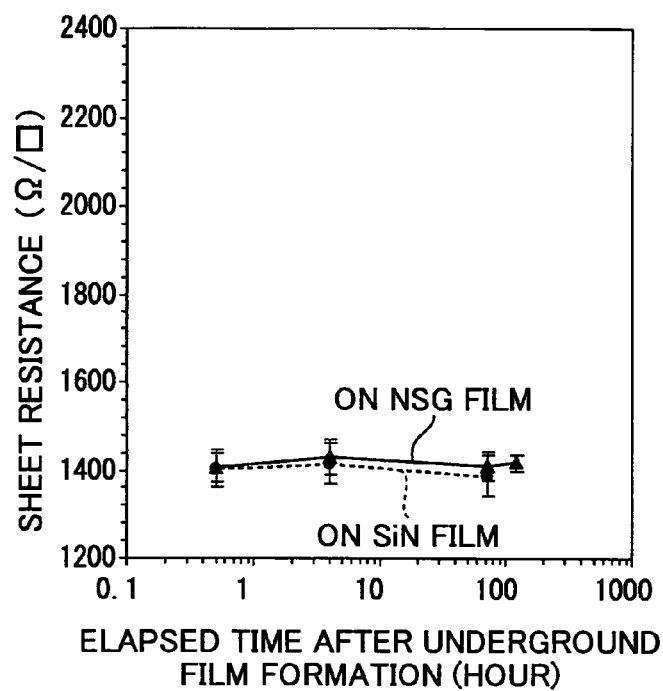
FIG. 6A is a graph showing relations between the time that has passed after forming the underground film of a metal thin film resistor and the sheet resistance of the CrSi thin-film-resistor object where an Ar sputter etching process is performed before forming the metal thin film for the metal thin-film-resistor object, the vertical axis representing the sheet resistance ($\Omega/\square$), and the horizontal axis representing the elapsed time after underground film formation (hour)

FIG. 6A is a graph showing relations between the time that has passed after forming the underground film of the metal thin film resistor and the sheet resistance of the CrSi thin-film-resistor object where the Ar sputter etching process is performed before forming the metal thin film for the metal thin-film-resistor object 21, the vertical axis representing the sheet resistance (Ω/□), and the horizontal axis representing the elapsed time after underground film formation (hour).

Figure 6B:
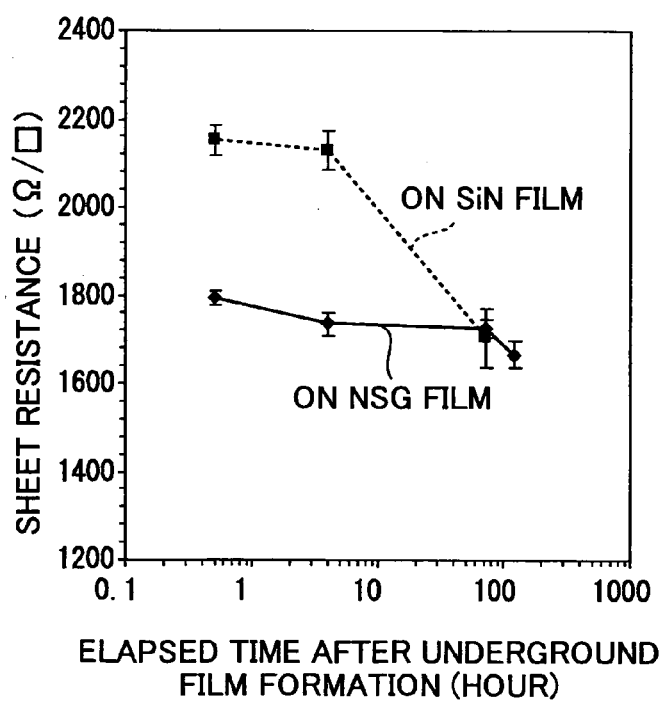
FIG. 6B is a graph showing relations between the time that has passed after forming the underground film of the metal thin film resistor and the sheet resistance of the CrSi thin-film-resistor object where the Ar sputter etching process is not performed before forming the metal thin film for the metal thin-film-resistor object, the vertical axis representing the sheet resistance ($\Omega/\square$), and the horizontal axis representing the elapsed time after underground film formation (hour)

FIG. 6B is a graph showing relations between the time that has passed after forming the underground film of the metal thin film resistor and the sheet resistance of the CrSi thin-film-resistor object where the Ar sputter etching process is not performed before forming the metal thin film for the metal thin-film-resistor object 21, the vertical axis representing the sheet resistance (Ω/□), and the horizontal axis representing the elapsed time after forming the underground film (hour).

FIGS. 6A and 6B show the sheet resistance (Ω/□) of CrSi thin-film-resistor objects on two sample wafers, one having a 200 nm (2000 Å) thick plasma SiN film, and the other having a 200 nm (2000 Å) thick plasma NSG film as the underground film, which films are formed by the plasma CVD method. The sheet resistance of the CrSi thin-film-resistor objects formed in these silicon wafers is measured by a 4 terminal method.

Specifically, the plasma SiN film serving as the underground film is formed under conditions of temperature: 360° C., pressure: 733.3 Pa (5.5 Torr), RF power: 200 W, $SiH_4$: 70 sccm, $N_2$: 3500 sccm, and $NH_3$: 40 sccm using parallel flat type plasma CVD equipment.

The plasma NSG film is formed under conditions of temperature: 400° C., pressure: 3.0 Torr, RF power: 250 W, $SiH_4$: 16 sccm, and $N_2O$: 1000 sccm using parallel flat type plasma CVD equipment.

The CrSi thin-film-resistor object is formed in a thickness of 10 nm (100 Å) using multi chamber sputtering equipment under conditions of a target: Si/Cr=80/20 wt %, DC power: 0.7 kW, Ar: 85 sccm, pressure: 1.13 Pa (8.5 mTorr), and processing-time: 13 seconds.

As for the sample to which the Ar sputter etching process is performed, the multi chamber sputtering equipment is used under conditions of DC-bias: 1250 V, Ar: 20 sccm, pressure: 1.13 Pa (8.5 mTorr), and processing time: 80 seconds. This process is equivalent to carrying out an etching removal by 20 nm (200 Å) of a thermal oxidation film formed in wet atmosphere of 1000° C.

As shown in FIG. 6B, when the Ar sputter etching process is omitted before formation of the CrSi thin film, the sheet resistance greatly changed with differences in the underground films (i.e., the SiN film and the NSG film). Further, the sheet resistance greatly changed with the time that had passed after forming the underground film before forming the CrSi thin-film-resistor object.

On the other hand, as shown in FIG. 6A, when the Ar sputter etching process is performed, the sheet resistance hardly changed with the differences in the underground films, and with the elapsed time.

As described above, the variation of the resistance due to the differences in underground films, elapsed time from a preceding process, and the like is sharply reduced by continuously forming the metal thin film object in the vacuum after performing the Ar sputter etching process.

Figure 7:
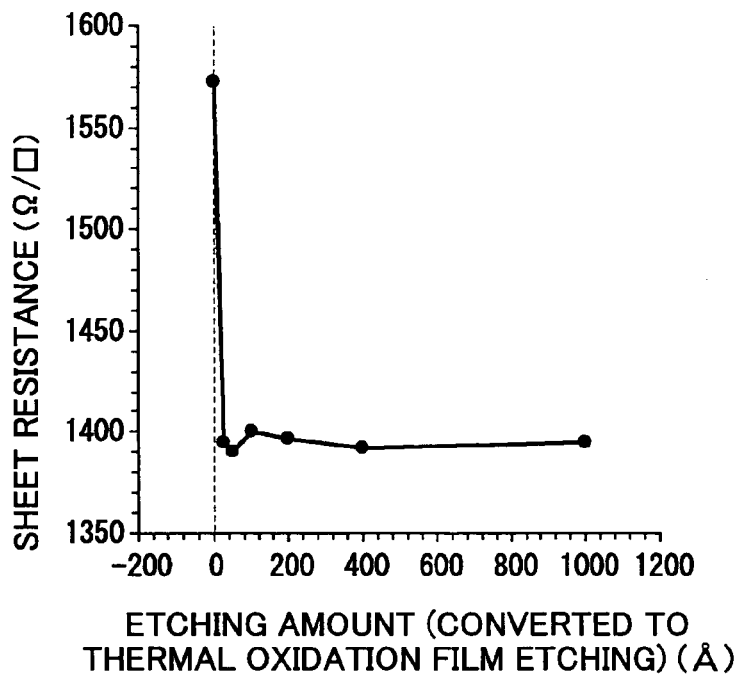
FIG. 7 is a graph showing relations between an amount of Ar sputter etching processing and the sheet resistance, the vertical axis representing the sheet resistance ($\Omega/\square$), and the horizontal axis representing the amount of etching (the amount converted in thermal oxidation film etching) (Å)

FIG. 7 is a graph showing relations between an amount of Ar sputter etching processing and the sheet resistance, the vertical axis representing the sheet resistance (Ω/□), and the horizontal axis representing the amount of etching (the amount converted to thermal oxidation film etching) (Å) FIG. 7 is of samples that have the plasma NSG film as the underground film, and the CrSi thin-film-resistor object that are formed under the same conditions as the applicable sample of FIG. 6. Here, the CrSi thin-film-resistor object is formed on the plasma NSG film, to which the Ar sputter etching process is performed after one week from formation of the plasma NSG film. Conditions of the Ar sputter etching process are the same as those of the applicable sample of FIG. 6, except for the amount of etching. The samples are etched by 0 nm (0 Å) (with no Ar sputter etching processing), 2.5 nm (25 Å), 5 nm (50 Å), 10 nm (100 Å), 20 nm (200 Å), 40 nm (400 Å), and 100 nm (1000 Å) in terms of the amount of etching a thermal oxidation film formed in wet atmosphere. The sheet resistance of the CrSi thin-film-resistor object is measured by the 4 terminal method.

As shown by FIG. 7, if the Ar sputter etching process is performed for an etching amount equivalent to 2.5 nm (25 Å) or more of the thermal oxidation film formed in wet atmosphere, the resistance of the CrSi thin-film-resistor object is stabilized. In addition, although the samples are etched only up to 100 nm (1000 Å), converted to the amount of a thermal oxidation film, as presented in FIG. 7, it is expected that the effect of the Ar sputter etching process is also acquired where the etching amount exceeds 100 nm (1000 Å) so long as the underground film remains at the formation region of the metal thin-film-resistor object 21.

Further, it turns out that the effect of the Ar sputter etching process affects not only the influence of the ground film but also the stability of the resistance of the CrSi thin film.

Figure 8:
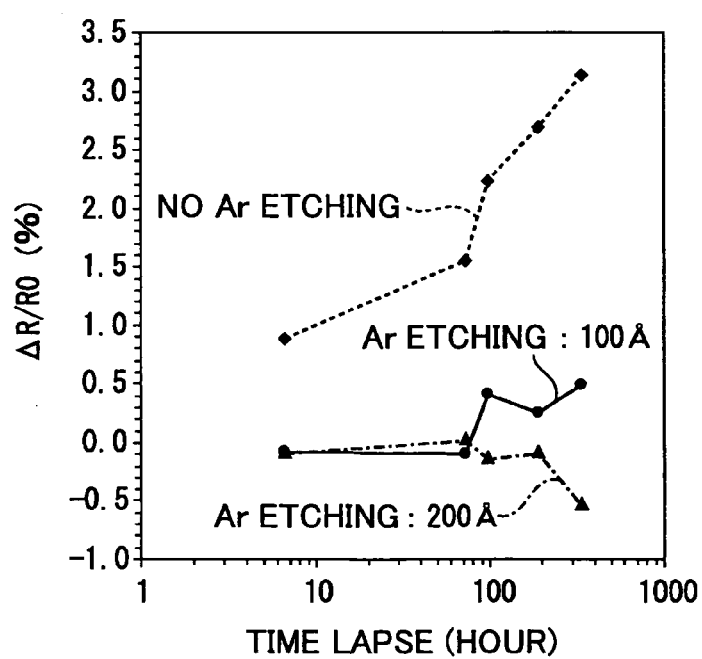
FIG. 8 is a graph showing relations between the change rate ($\Delta R/R0$) of the sheet resistance as compared with the sheet resistance immediately after formation (R0) and the time the CrSi thin film for the metal thin film resistor being left in the atmosphere at the temperature of 25° C. and 45% humidity after being formed, the vertical axis representing $\Delta R/R0$ (%), and the horizontal axis representing the time (hour)

FIG. 8 is a graph showing relations between the rate ($\Delta R/R0$) of the sheet resistance change compared with the sheet resistance immediately after formation (R0) and the time the CrSi thin film for the metal thin film resistor being left in the atmosphere of the temperature of 25° C., and 45% of humidity after formation, the vertical axis representing $\Delta R/R0$ (%), and the horizontal axis representing the time (hour).

Samples shown in FIG. 8 included the plasma NSG film serving as the underground film, and the CrSi thin-film-resistor object that are formed under the same conditions as the samples of FIG. 6.

As for the Ar sputter etching process, three kinds of samples are prepared, namely, with no Ar sputter etching processing (No Ar etching), with a 40 second process for 10 nm (100 Å etching (converted to the thermal oxidation film) (Ar etching: 10 nm (100 Å)), and with an 80 second process for 20 nm (200 Å) etching (converted to the thermal oxidation film) (Ar etching: 20 nm (200 Å)).

As for the samples with no Ar etching, the resistance rises as the time passes after formation, rising by 3% or more after being left for 300 hours or more.

On the other hand, with the samples, to which the Ar sputter etching process is performed (Ar etching: 10 nm (100 Å) and Ar etching: 20 nm (200 Å)), the rate of change of resistance is sharply decreased within ±1% of the sheet resistance immediately after the formation after the samples are left for 300 hours or more.

Comparing Ar etching: 10 nm (100 Å) with Ar etching: 20 nm (200 Å), the amount of the Ar sputter etching process produces a small difference, and it turns out that a small amount of the Ar sputter etching process is effective.

The effect of the Ar sputter etching process to the influence of the sheet resistance of the underground film and the influence of elapsed time in the atmosphere has been described with reference to FIG. 8 through FIG. 4, wherein the targets of Si/Cr=50/50 wt % and 80/20 wt % are used for the CrSi thin film resistor; nevertheless, the target is not limited to these. Rather, the same effect as the above is obtained with all the CrSi and CrSiN films thin films formed with targets Si/Cr=50/50 through 90/10 wt %.

Further, the Ar sputter etching processing method is not limited to the DC-bias sputter etching method that is used in the embodiment.

Figure 9:
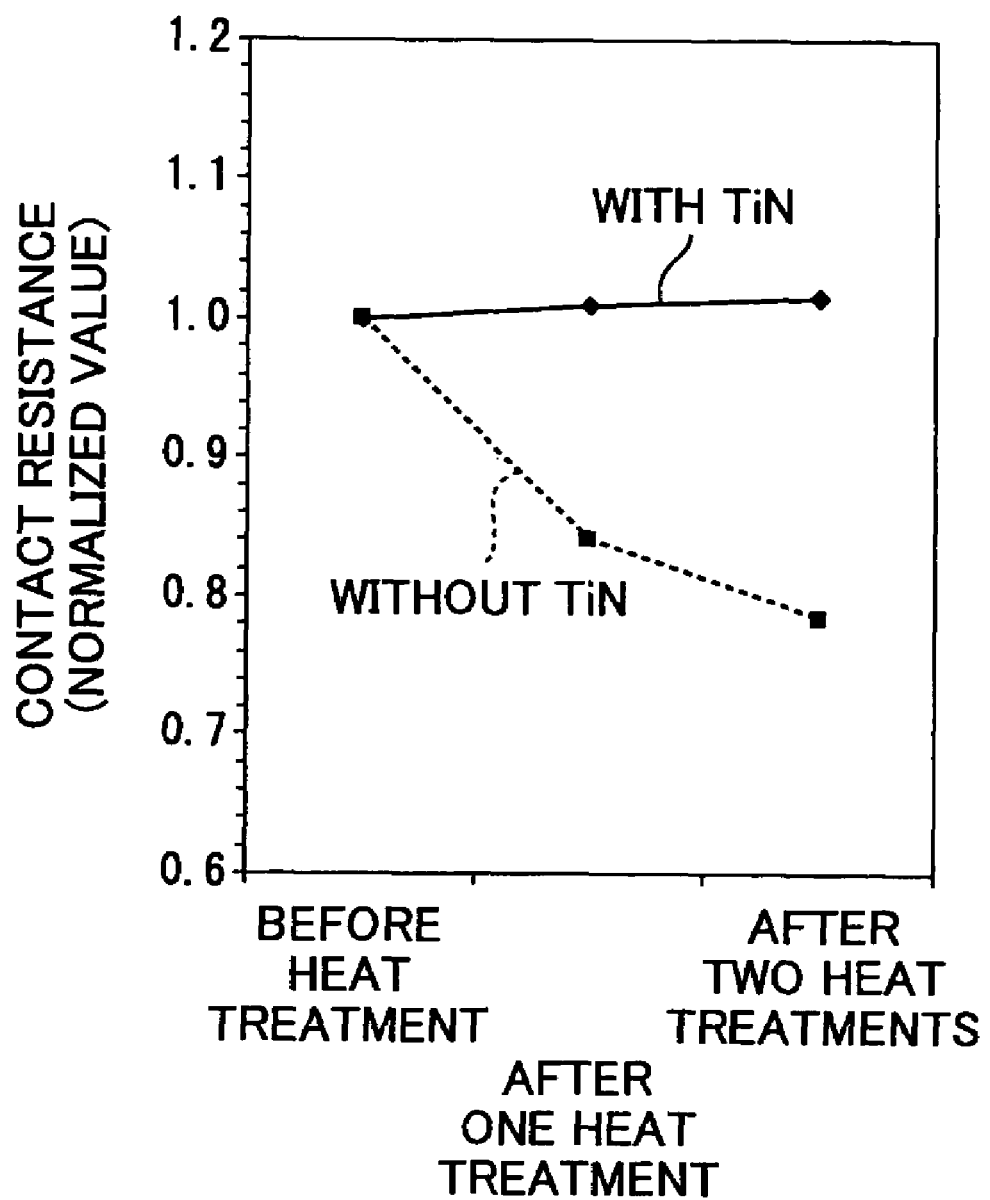
FIG. 9 is a graph showing changes in the contact resistance between the metal thin film resistor and the metal wiring depending on the number of times of heat treatment of two samples, one having a high melting point metal film remaining at the bottom of the connection hole, and the other having the high melting point metal film at the bottom of the connection hole completely removed, the vertical axis showing the contact resistance value normalized by a contact resistance value before the heat treatment, and the horizontal axis showing the number of times of the heat treatment.

FIG. 9 is a graph showing changes in the contact resistance between the metal thin film resistor and the metal wiring depending on the number of times of heat treatment of two samples, one having a high melting point metal film remaining at the bottom of the connection hole, and the other having the high melting point metal film at the bottom of the connection hole completely removed, the vertical axis showing the contact resistance value normalized by a contact resistance value before the heat treatment, and the horizontal axis showing the number of times of the heat treatment.

FIG. 9 is of the samples, in which the dry etching time is adjusted when forming the connection holes such that one sample had the high melting point metal film of about 50 nm (500 Å) thickness at the bottom of the connection holes, and the other sample had the high melting point metal film completely removed.

For the high melting point metal film, TiN is used.

The CrSi thin-film-resistor object is formed in 5 nm (50 Å) thickness under conditions of Si/Cr=80/20 wt %, DC power: 0.7 kW, Ar: 85 sccm, pressure: 1.13 Pa (8.5 mTorr), and processing-time: 6 seconds.

The Ar sputter etching process before forming the CrSi thin film is performed under conditions of DC-bias: 1250 V, Ar: 20 sccm, pressure: 1.13 Pa (8.5 mTorr), and processing time: 160 seconds. This process is equivalent to carrying out an etching removal of 40 nm (400 Å) of a thermal oxidation film formed in wet atmosphere at 1000° C.

The plane size of the connection hole is 0.6 μm×0.6 μm. The contact resistance is measured using the 4 terminal method.

The changes in contact resistance with different numbers of heat treatments for 30 minutes in 350° C. and in nitrogen atmosphere are as shown in FIG. 9.

That is, the contact resistance of the sample having the TiN film at the bottom of the connection hole did not change before and after the heat treatments. On the other hand, the contact resistance of the sample having no TiN film varied by 20% or greater after two heat treatments as compared with no heat treatment. This results from the TiN film serving as a barrier film that prevents the resistance change by the interaction of the CrSi thin film and the metal wiring from occurring.

By forming the TiN film between the CrSi thin-film-resistor object and the metal wiring, the contact resistance change due to heat treatment performed during a production process such as sintering and CVD, and in a back process such as soldering can be minimized. In this way, a contact resistance as designed can be stably obtained, and changes in the contact resistance before and after a product assembly are prevented from occurring, realizing high precision products, and a high production yield.

By the manufacturing method described with reference to FIGS. 1A, 1B, 2A through 2D, and 3, although the metal film for the first layer metal wiring pattern 11 and the high melting point metal film 9 are continuously formed in a vacuum in Process (1), the manufacturing method is not limited to this.

For example, if the metal film for the first layer metal wiring pattern 11 after the high melting point metal film is formed and exposed to the atmosphere, it becomes difficult to obtain a satisfactory electric connection between the metal film and the high melting point metal film due to a natural oxide film formed on the surface of the metal film for wiring. In this case, at the stage of forming the connection holes 17 to the second layer insulation film 15 on the first layer metal wiring pattern 11 consisting of the metal material pattern 7 and the high melting point metal film 9 that are patterned from the metal film and the high melting point metal film, all the high melting point metal film 9 at the bottom of the connection holes 17 so that the electrical connection between the first layer metal wiring pattern 11 and the CrSi thin-film-resistor object 21 can be obtained.

Further, in Process (1), although the high melting point metal film 9 serving as the barrier film and the antireflection film is formed in 80 nm (800 Å) thickness, the manufacturing method is not limited to this.

Generally, a high melting point metal film serving as an antireflection film is formed in a thickness of 50 nm (500 Å)

or less. However, in anticipation of decrease in the thickness due to over-etching when forming the connection holes 17 (refer to Process (3)), and the Ar sputter etching processing when forming the metal thin film (refer to Process (4)), it is desirable that the high melting point metal film 9 is formed in a thickness of 50 nm (500 Å) or more if the high melting point metal film 9 is to remain at the bottom of the connection holes 17.

Nevertheless, as described above, etching conditions for forming the connection holes 17 and process conditions of Ar sputter etching can be optimized so that the decrease in thickness of the high melting point metal film 9 is minimized, and the thickness of the high melting point metal film 9 can be set to 50 nm (500 Å) or less, still serving as the barrier film.

Further, in Process (4), although the Ar sputter etching process is performed immediately before formation of the CrSi thin film 27, the Ar sputter etching process can be dispensed with where the high melting point metal film 9 serving as the barrier film remains at the bottom of the connection holes 17. Even if the Ar sputter etching process is not performed, the CrSi thin film 27 and the first layer metal wiring pattern 11 are electrically connected at a satisfactorily level. This is because the high melting point metal film 9 constituted by the TiN film does not form a firm natural oxide film even if it is exposed to the atmosphere as an AlSiCu film does. Where the Ar sputter etching process is not performed, the taper form and the Ar sputter etching residual substance 19 of the connection holes 17 are not formed. As described above, since the stability of the resistance of the CrSi thin-film-resistor object 21 is improved by performing the Ar sputter etching process immediately before formation of the CrSi thin film 27, it is desirable to perform the Ar sputter etching process.

Further, although the embodiment uses the SOG film as the second layer insulation film 15, the SOG film being flattened by etching back technology as described above, the insulator layer used as the ground of the metal thin-film-resistor object 21 is not limited to this. The ground of the metal thin-film-resistor object 21 can be served by other insulator layers such as an insulator layer that is flattened by the well-known CMP (chemical mechanical polish), a plasma CVD oxide film that is not flattened, an SOG film to which SOG is applied, heat-treated and flattened, and a CVD insulator layer formed by an HDP (high-density-plasma)-CVD method, and flattened by etching back. When the metal thin-film-resistor object 21 that constitutes the semiconductor device of the present invention is applied to an analog resistor, the insulator layer that serves as the underground of the metal thin-film-resistor object 21 is desirably flattened. This is because analog resistors are often required to provide not only high TCR, but also high pair nature and ratio accuracy.

Further, although the passivation film 23 is formed on the CrSi thin-film-resistor object 21 in the embodiment, the present invention is not limited to this. The insulator layer formed on the CrSi thin-film-resistor object 21 may be other insulation layers such as a layer insulation film for forming the second-layer metal wiring.

Figure 10A:
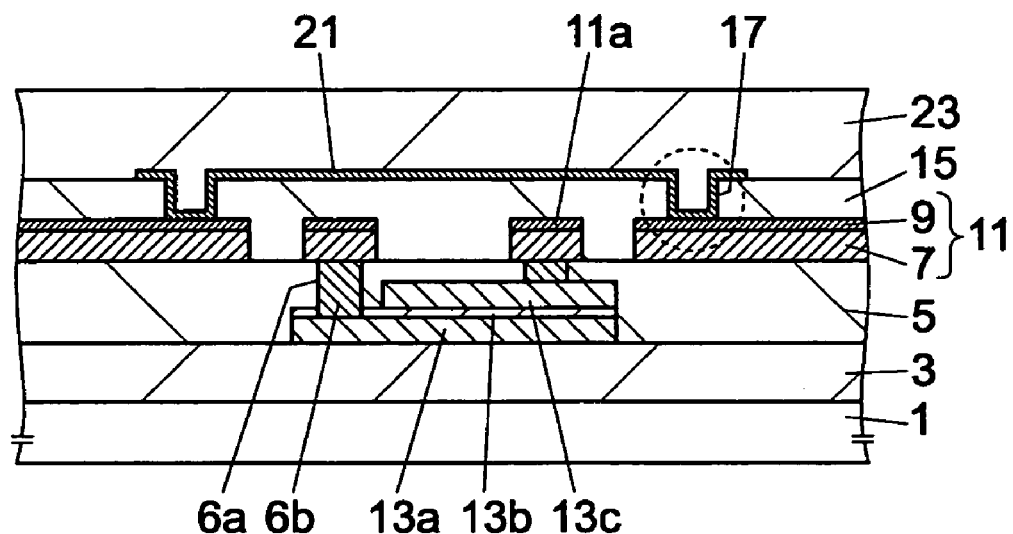
FIG. 10A is a cross-sectional view showing the formation region of the metal thin-film-resistor object according to another embodiment of the first aspect of the present invention.
Figure 10B:
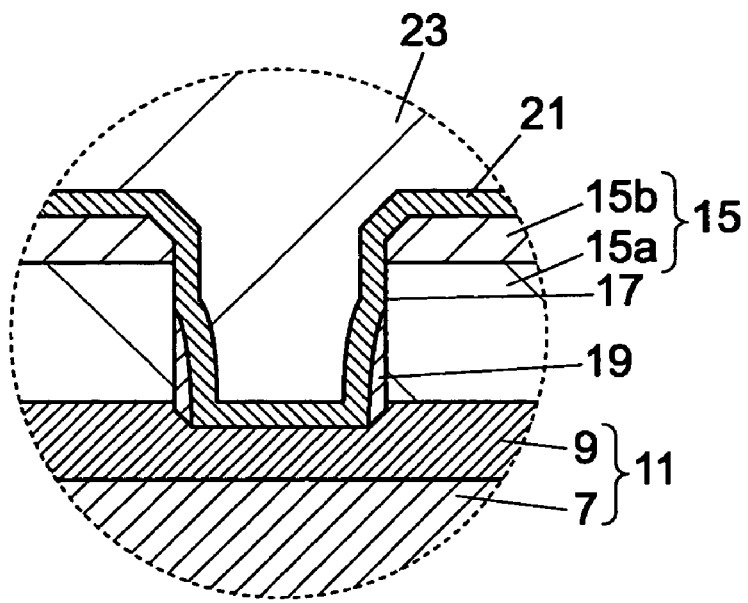
FIG. 10B is a cross-sectional view showing an expanded view of the portion surrounded by a dashed line in FIG. 10A.

FIG. 10A is a cross-sectional view showing the formation region of the metal thin-film-resistor object 21 according to another embodiment of the first aspect of the present invention. FIG. 10B is a cross-sectional view showing an expanded view of the portion surrounded by a dashed line in FIG. 10A. This embodiment replaces the transistor in FIG. 1 with a capacitor formed in the region under the metal thin-film-resistor object 21. The same reference numbers are given to the portions that achieve the same functions as FIGS. 1A and 1B, and detailed explanations thereof are not repeated.

The device separating oxide film 3 is formed on the silicon substrate 1. A lower electrode 13a consisting of, for example, a polysilicon film is formed on the device separating oxide film 3 in the region under the CrSi thin-film-resistor object 21. An upper electrode 13c consisting of a polysilicon film is formed on the lower electrode 13a through an insulator layer 13b for constituting the capacitor. The insulator layer 13b is served by, for example, a laminating film of a silicon oxide film and a silicon nitride film, a silicon oxide film, and a silicon nitride film. The lower electrode 13a, the insulator layer 13b, and the upper electrode 13c constitute the capacitor.

The first layer insulation film 5 is formed on the silicon substrate 1 including the formation region of the device separating oxide film 3 and the capacitor. Contact holes 6a and conductive plugs 6b are formed in the first layer insulation film 5, one being on the lower electrode 13a where the upper electrode 13c is not formed, and the other corresponding to the upper electrode 13c.

On the first layer insulation film 5, the following items are formed, namely, the first layer metal wiring patterns 11 and 11a consisting of the metal material pattern 7 and the high melting point metal film 9, the second layer insulation film 15 constituted by the plasma NSG film 15a, the SOG film, and the plasma PSG film 15b in this sequence from bottom to top, the connection holes 17 that have a taper form at the upper end, the Ar sputter etching residual substance 19, the CrSi thin-film-resistor object 21, and the passivation film 23.

In FIG. 10A, the second layer insulation film 15 is illustrated in one body. The SOG film is not formed in the region shown in FIG. 10B.

In the region under the CrSi thin-film-resistor object 21, the first layer metal wiring pattern 11a and the capacitor consisting of the lower electrode 13a, the insulator layer 13b, and the upper electrode 13c are arranged.

Since the PSG film 15b is formed as the uppermost layer of the underground insulator film 15 of the CrSi thin-film-resistor object 21 also in this embodiment, damage to the regions adjacent to the metal thin-film-resistor object 21 due to laser irradiation can be reduced as compared with the case where an NSG film is used as the insulator layer contacting the undersurface of the CrSi thin-film-resistor object 21.

Further, since the capacitor as the component of the integrated circuit, and the first layer metal wiring pattern 11a are arranged in the region under the CrSi thin-film-resistor object 21, miniaturization of the chip can be attained.

This embodiment can be practiced by first forming the lower electrode 13a, the insulator layer 13b, and the upper electrode 13c on the device separating oxide film 3 by a well-known manufacturing method followed by the formation process of the first insulator layer 5 and the subsequent processes as described with reference to FIGS. 1A, 1B, 2A through 2D, and 3.

Figure 11A:
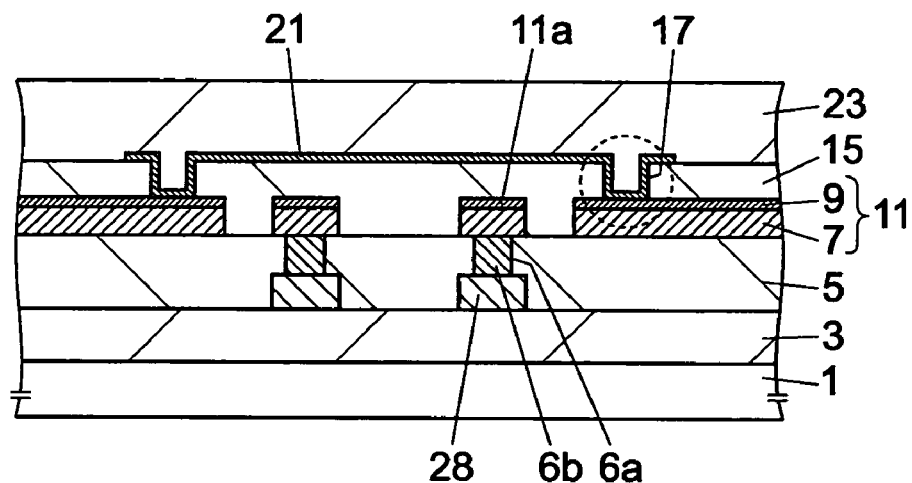
FIG. 11A is a cross-sectional view showing the formation region of the metal thin-film-resistor object according to another embodiment of the first aspect of the present invention.
Figure 11B:
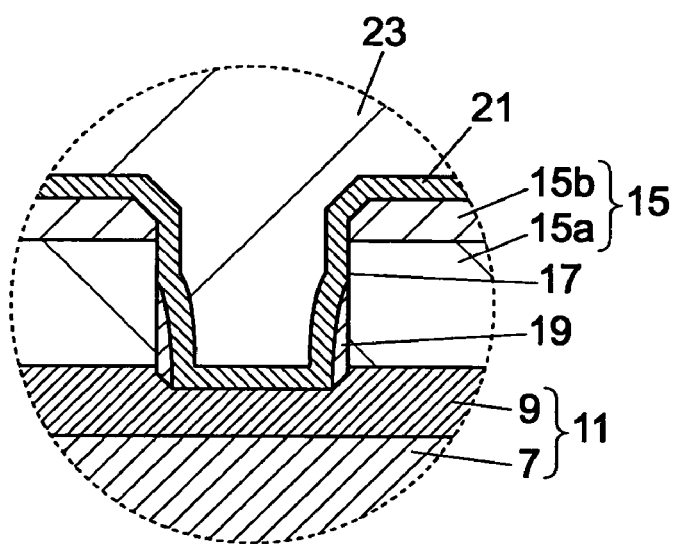
FIG. 11B is a cross-sectional view showing an expanded view of the portion surrounded by a dashed line in FIG. 11A.

FIG. 11A is a cross-sectional view showing the formation region of the metal thin-film-resistor object 21 according to another embodiment of the first aspect of the present invention. FIG. 11B is a cross-sectional view showing an expanded view of the portion surrounded by a dashed line in FIG. 11A. This embodiment replaces the transistor in FIG. 1 with a polysilicon wiring pattern 28 under the metal thin-film-resistor object 21. The same reference numbers are given to the portions that achieve the same functions as FIGS. 1A and 1B, and detailed explanations thereof are not repeated.

The device separating oxide film 3 is formed on the silicon substrate 1. The polysilicon wiring pattern 28 consisting of a polysilicon film is formed on the device separating oxide film 3 under the CrSi thin-film-resistor object 21.

The first layer insulation film 5 is formed on the silicon substrate 1 including the formation region of the device separating oxide film 3 and the polysilicon wiring pattern 28. Corresponding to the polysilicon wiring pattern 28, the contact holes 6a and the conductive plugs 6b are formed in the first layer insulation film 5.

On the first layer insulation film 5, the following items are formed, namely, the first layer metal wiring patterns 11 and 11a consisting of the metal material pattern 7 and the high melting point metal film 9, the second layer insulation film 15 consisting of the plasma NSG film 15a, the SOG film, and the plasma PSG film 15b in this sequence from bottom to top, the connection holes 17 that have a taper form at their top ends, the Ar sputter etching residual substance 19, the CrSi thin-film-resistor object 21, and the passivation film 23. In the region under the CrSi thin-film-resistor object 21, the first layer metal wiring pattern 11a and the polysilicon wiring pattern 28 are arranged. In FIG. 11A, the second layer insulation film 15 is illustrated in one body, and the SOG film is not formed in the region shown in FIG. 11B.

Since the PSG film 15b serves as the uppermost layer of the underground insulator film 15 of the CrSi thin-film-resistor object 21 also in this embodiment, compared with the case where an NSG film is used as an insulator layer in contact with the undersurface of the CrSi thin-film-resistor object 21, damage to the regions adjacent to the metal thin-film-resistor object 21 due to laser irradiation can be reduced.

Further, since the polysilicon wiring pattern 28 serving as a component of the integrated circuit and the first layer metal wiring pattern 11a are arranged in the region under the CrSi thin-film-resistor object 21, miniaturization of the chip can be attained.

This embodiment can be practiced by forming the polysilicon wiring pattern 28 on the device separating oxide film 3 using a well-known manufacturing method followed by forming the first insulator layer 5 and performing the subsequent processes as in the embodiment described with reference to FIGS. 1A, 1B, 2A through 2D, and 3.

Figure 12A:
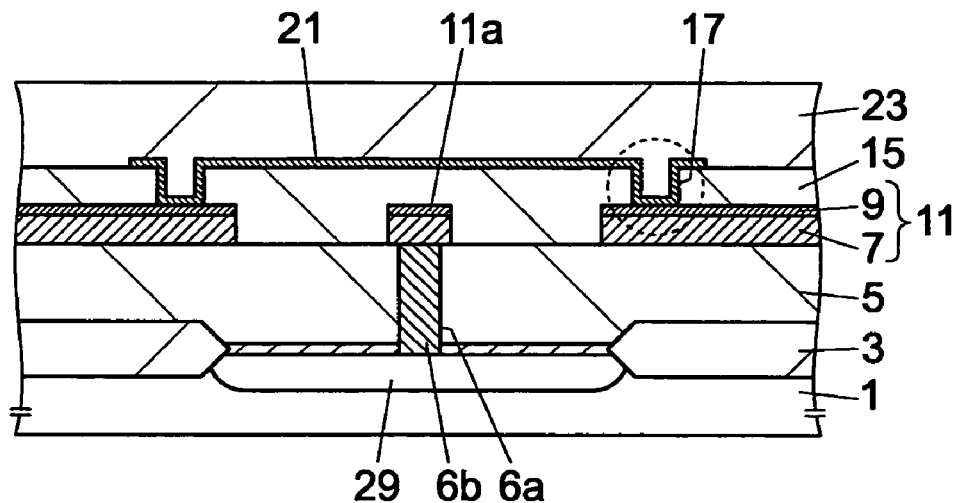
FIG. 12A is a cross-sectional view showing the formation region of the metal thin-film-resistor object according to another embodiment of the first aspect of the present invention.
Figure 12B:
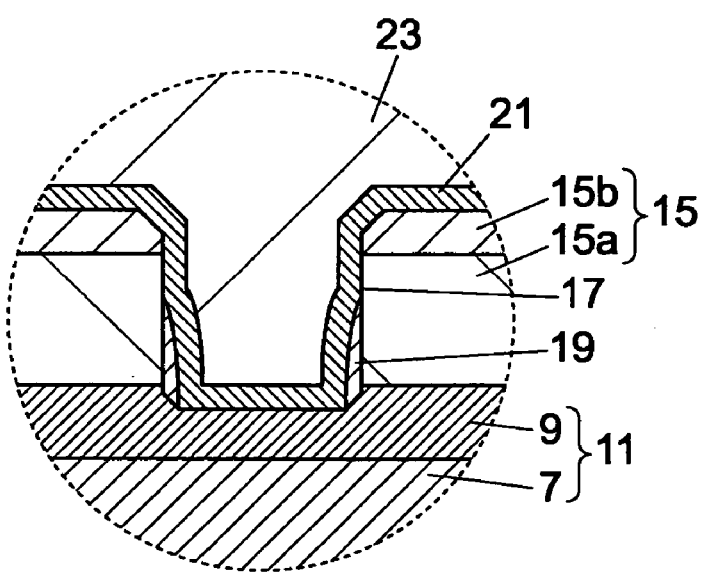
FIG. 12B is a cross-sectional view showing an expanded view of the portion surrounded by a dashed line in FIG. 12A.

FIG. 12A is a cross-sectional view showing the formation region of the metal thin-film-resistor object 21 according to another embodiment of the first aspect of the present invention. FIG. 12B is a cross-sectional view showing an expanded view of the portion surrounded by a dashed line in FIG. 12A. This embodiment replaces the transistor in FIG. 1 with an impurity diffusion layer 29 in the region under the metal thin-film-resistor object 21. The same reference numbers are given to the portions that achieve the same functions as FIGS. 1A and 1B, and detailed explanation thereof are not repeated.

The device separating oxide film 3 is formed on the silicon substrate 1. The impurity diffusion layer 29 is formed in a region surrounded by the device separating oxide film 3 on the surface side of the silicon substrate 1 below the CrSi thin-film-resistor object 21.

The first layer insulation film 5 is formed on the silicon substrate 1 including the formation region of the device separating oxide film 3 and the impurity diffusion layer 29. Corresponding to the impurity diffusion layer 29, the contact holes 6a and the conductive plugs 6b are formed in the first layer insulation film 5.

On the first layer insulation film 5, the following items are formed, namely, the first layer metal wiring patterns 11 and 11a consisting of the metal material pattern 7 and the high melting point metal film 9, the second layer insulation film 15 constituted by the plasma NSG film 15a, the SOG film, and the plasma PSG film 15b in this sequence from bottom to top, the connection hole 17 that has a taper form at its top end, the Ar sputter etching residual substance 19, the CrSi thin-film-resistor object 21, and the passivation film 23. In the region under the CrSi thin-film-resistor object 21, the first layer metal wiring pattern 11a and the impurity diffusion layer 29 are arranged. In FIG. 12A, the second layer insulation film 15 is illustrated in one body, and the SOG film is not formed in the region shown in FIG. 12B.

Since the underground insulator film 15 of the CrSi thin-film-resistor object 21 has the PSG film 15b as the uppermost layer also in this embodiment, compared with the case where an NSG film is used as an insulator layer in contact with the undersurface of the CrSi thin-film-resistor object 21, damage to the regions adjacent to the metal thin-film-resistor object 21 due to laser irradiation can be reduced.

Further, since the impurity diffusion layer 29 as a component of the integrated circuit and the first layer metal wiring pattern 11a are arranged under the CrSi thin-film-resistor object 21, miniaturization of the chip can be attained.

This embodiment can be practiced by forming the device separating oxide film 3 and the impurity diffusion layer 29 in the silicon substrate 1 by a well-known manufacturing method followed by the formation process of the first insulator layer 5 and the subsequent processes as in the embodiment described with reference to FIGS. 1A, 1B, 2A through 2D, and 3.

Figure 13A:
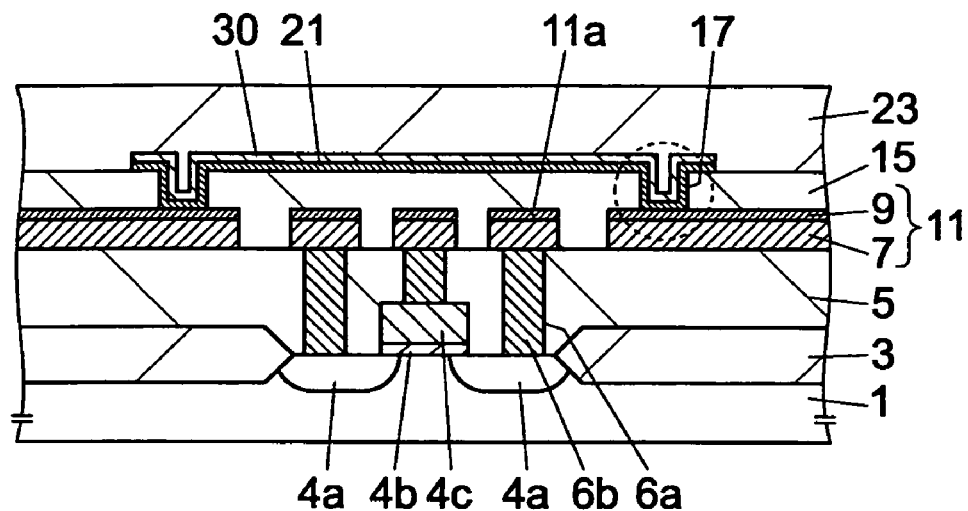
FIG. 13A is a cross-sectional view showing the formation region of the metal thin-film-resistor object according to another embodiment of the first aspect of the present invention.
Figure 13B:
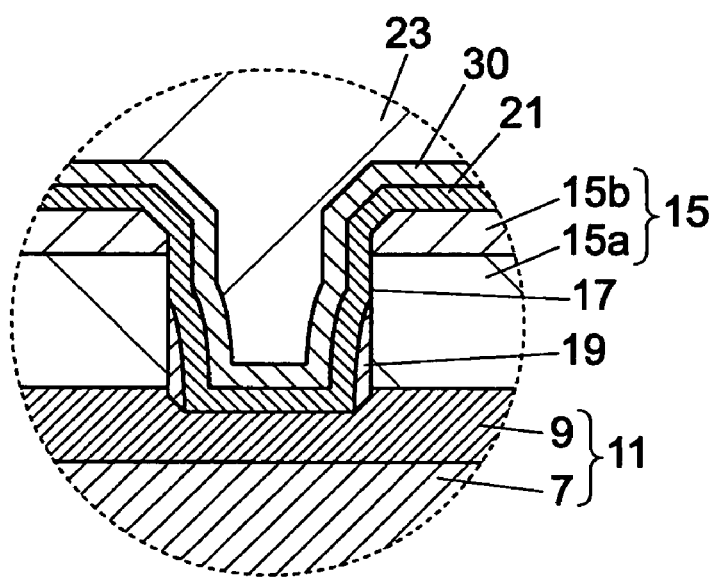
FIG. 13B is a cross-sectional view showing an expanded view of the portion surrounded by a dashed line in FIG. 13A.

FIG. 13A is a cross-sectional view showing the formation region of the metal thin-film-resistor object 21 according to another embodiment of the first aspect of the present invention. FIG. 13B is a cross-sectional view showing an expanded view of the portion surrounded by a dashed line in FIG. 13A. The same reference numbers are given to the portions that achieve the same functions as FIGS. 1A and 1B, and detailed explanation thereof are not repeated.

On the silicon substrate 1, the following items are formed, namely, the device separating oxide film 3, the transistor constituted by the impurity diffusion layers 4a and 4a, the gate insulator layer 4b, and the gate electrode 4c, the first layer insulation film 5, the contact holes 6a, the conductive plugs 6b, the first layer metal wiring patterns 11 and 11a consisting of the metal material pattern 7 and the high melting point metal film 9, the connection hole 17 that has a taper form at its upper end, the second layer insulation film 15 constituted by the plasma NSG film 15a, the SOG film, and the plasma PSG film 15b in this sequence from bottom to top, the Ar sputter etching residual substance 19, and the CrSi thin-film-resistor object 21. In FIG. 13A, the second layer insulation film 15 is illustrated in one body, and the SOG film is not formed in the region shown in FIG. 13B.

A CrSiN film (metal nitride film) 30 is formed on the upper surface of the CrSi thin-film-resistor object 21. CrSiO is not formed between the CrSi thin-film-resistor object 21 and the CrSiN film 30.

The passivation film 23 is formed on the second layer insulation film 15 including the formation region of the CrSi thin-film-resistor object 21 and the CrSiN film 30.

Since the underground insulator film 15 of the CrSi thin-film-resistor object 21 has the PSG film 15b as the uppermost layer also in this embodiment, compared with the case where an NSG film is used as an insulator layer in contact with the undersurface of the CrSi thin-film-resistor object 21, damage to the regions adjacent to the metal thin-film-resistor object 21 due to laser irradiation can be reduced.

The manufacturing method of practicing this embodiment is described.

On the silicon substrate 1 having the shape of a wafer, to which the device separating oxide film 3, and the transistor constituted by the impurity diffusion layers 4a and 4a, the gate insulator layer 4b, and the gate electrode 4c are formed, the first layer metal wiring patterns 11 and 11a consisting of the first layer insulation film 5, the contact holes 6a, the conductive plugs 6b, the metal wiring pattern 7, and the high melting point metal film 9, the second layer insulation film 15, and the connection holes 17 are formed by processes that are the same as Processes (1) through (3) described with reference to FIGS. 2A through 2C.

Figure 2D:
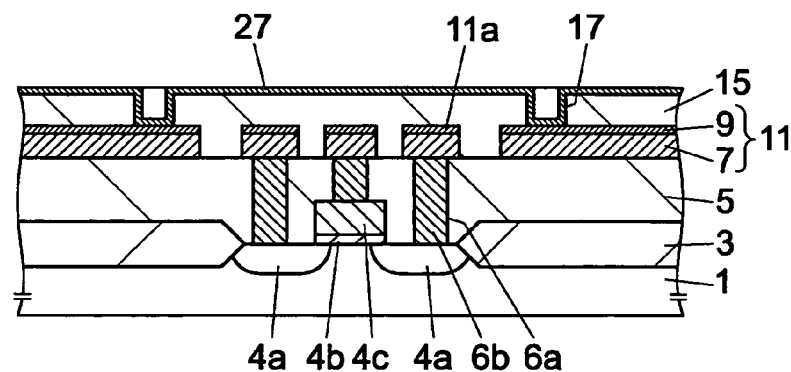

Then, the Ar sputter etching process is performed on the surface of the layer insulation film 5 in a vacuum using the Ar sputter etching chamber of the multi chamber sputtering equipment, for example, under the same conditions as Process (4) described with reference to FIG. 2D such that the taper form at the upper end of the connection hole 17, and the Ar sputter etching residual substance 19 are formed. Then, without breaking the vacuum after the Ar sputter etching process, the CrSi thin film for forming the metal thin film resistor object is formed.

Further, after the formation of the CrSi thin film, a 5 nm (50 Å) thick CrSiN film is formed on the CrSi thin film without breaking the vacuum using, for example, the CrSi target (Si/Cr=80/20 wt %) that is used in forming the CrSi thin film under conditions of DC power: 0.7 kW, Ar+$N_2$ (mixed gas of argon and nitrogen): 85 sccm, pressure: 1.13 Pa (8.5 mTorr), and processing time: 6 seconds. Next, the CrSiN film and the CrSi thin film are patterned such that a laminating pattern consisting of the CrSiN film 30 and the CrSi thin-film-resistor object 21 is formed.

Since the CrSi thin-film-resistor object 21 is electrically connected to the first layer metal wiring pattern 11 as in the manufacturing method described with reference to FIGS. 1A, 1B, 2A through 2D, and 3, it is not necessary to perform a process of removing a metal oxide-film from the surface of the CrSi thin-film-resistor object 21 by hydrofluoric acid solution, which process is required in the conventional technology. Further, since the upper surface of the CrSi thin-film-resistor object 21 is covered by the CrSiN film 30, even if it is exposed to atmosphere containing oxygen, such as the atmosphere, the upper surface of the CrSi thin-film-resistor object 21 is not oxidized.

Then, the passivation film 23 is formed on the second layer insulation film 15.

It is generally known that a metal thin film has high reactivity with oxygen, and resistance of the metal thin film changes if it is exposed to the atmosphere for a long time.

According to this embodiment, the resistance of the CrSi thin-film-resistor object 21 is prevented from changing by forming the CrSiN film 30 on the upper surface of the CrSi thin-film-resistor object 21, the upper surface of the CrSi thin-film-resistor object 21 being protected from the atmosphere. Here, when the CrSi thin film for forming the CrSi thin-film-resistor object 21 is formed, the electrical connection of the CrSi thin film and the first layer metal wiring pattern 11 is completed; accordingly, even if a new thin film is formed on the CrSi thin film, it does not affect the electrical properties.

Figure 14:
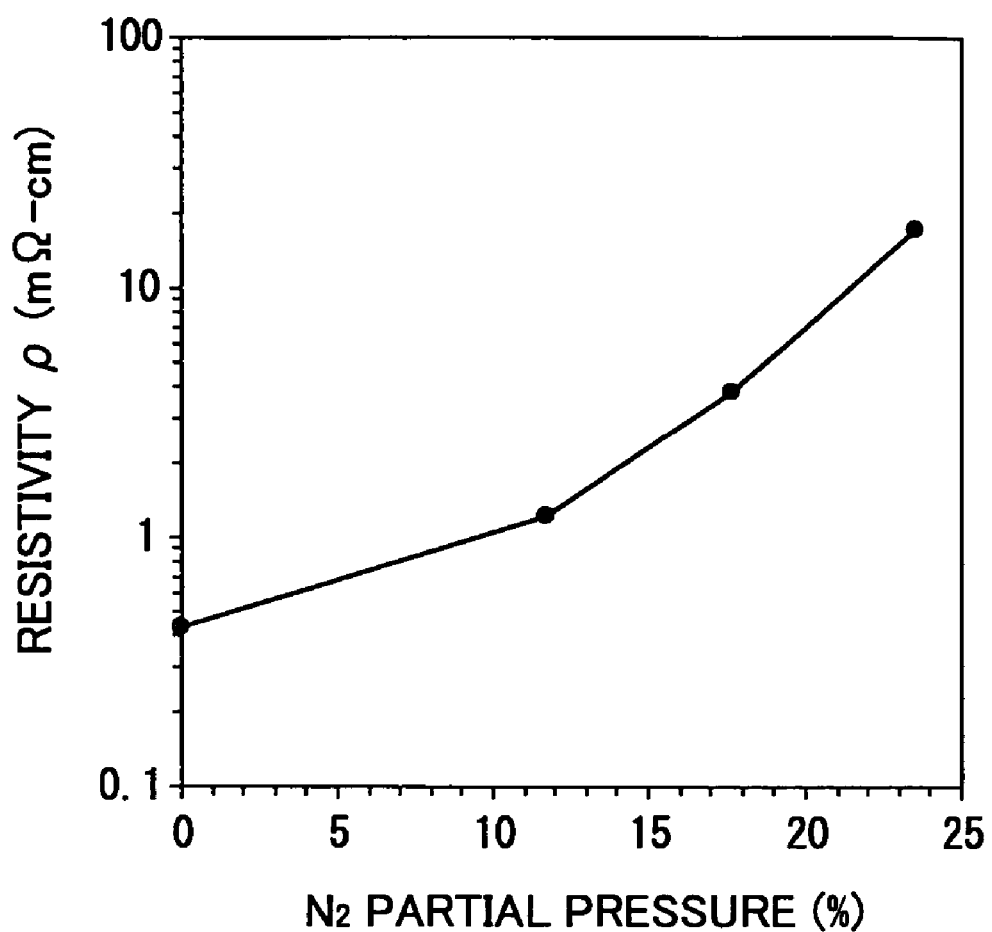
FIG. 14 is a graph showing relations of the resistivity of a CrSiN film to partial pressure of $N_2$ gas for forming the CrSiN film, the vertical axis representing the resistivity ρ (mΩ-cm), and the horizontal axis representing the $N_2$ partial pressure (%)

FIG. 14 is a graph showing relations of the resistivity of a CrSiN film to partial pressure of $N_2$ gas for forming the CrSiN film, the vertical axis representing the resistivity ρ (mΩ-cm), and the horizontal axis representing the $N_2$ partial pressure (%). Here, the CrSiN film is formed under conditions of target: Si/Cr=50/50 wt %, Ar+$N_2$: 85 sccm, wherein $N_2$ partial pressure is made variable, DC power: 0.7 kW, pressure: 1.13 Pa (8.5 mTorr), and processing time: 6 seconds.

As shown by FIG. 14, the CrSiN film formed by a reactive sputter with $N_2$ partial pressure of 18% or greater has a high resistivity of 10 times or greater compared with the case where the gas does not contain $N_2$ at all ($N_2$ partial pressure is 0%). Accordingly, if the $N_2$ partial pressure is set at 18% or greater when forming the CrSiN film, even if the CrSiN film is formed directly on the CrSi thin-film-resistor object, the CrSi thin film dominantly determines the resistance of the whole CrSi thin-film-resistor object, the CrSiN film hardly affecting the resistance. Here, the maximum of the $N_2$ partial pressure is about 90%. If the $N_2$ partial pressure is set greater than 90%, the sputtering speed is slowed, production efficiency falls, and it is not desirable.

In addition, if the CrSiN film is formed by the reactive sputter with the $N_2$ partial pressure of about 6 to 11%, for example, the CrSiN film can serve as a metal thin-film-resistor object.

Further, although the CrSiN film 30 is formed on the CrSi thin-film-resistor object 21 in the embodiment, a CVD system insulator layer, for example, a silicon nitride film may be formed on the CrSi thin-film-resistor object 21. However, common multi chamber sputter equipment does not have a CVD chamber, and in order to form the CVD system insulator layer on the CrSi thin-film-resistor object 21 continuously in a vacuum, new equipment is necessary, and manufacturing cost is increased.

According to the present invention, the structure is such that the CrSiN film 30 is formed on the CrSi thin film 27 for CrSi thin-film-resistor object 21, and the CrSiN film 30 serving as an oxidization-proof cover for the CrSi thin-film-resistor object 21 can be formed without breaking the vacuum state using the common multi chamber sputter equipment without purchasing new equipment.

Further, the formation of the CrSiN film 30 on the CrSi thin-film-resistor object 21 performed in the embodiment described with reference to FIG. 13 is also applicable to each of the embodiments described with reference to FIGS. 10 through 12.

Figure 15A:
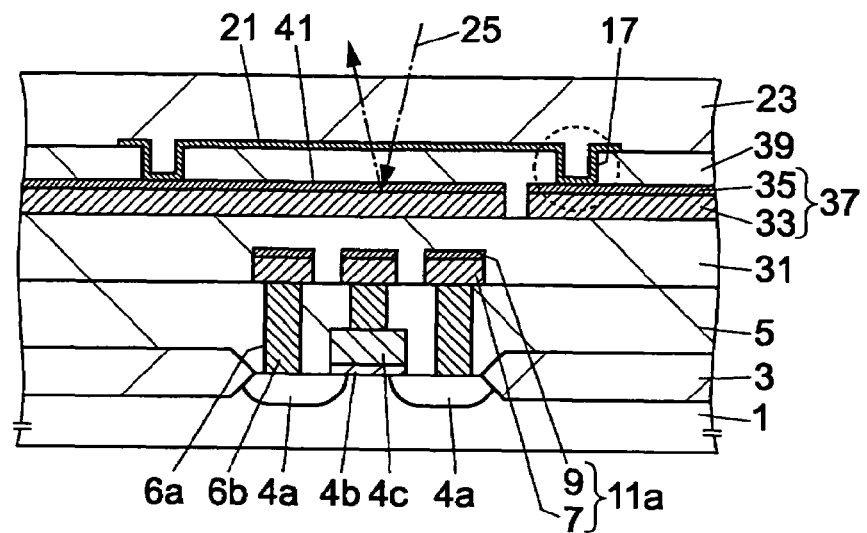
FIG. 15A is a cross-sectional view showing the formation region of the metal thin-film-resistor object according to an embodiment of the first aspect of the present invention.
Figure 15B:
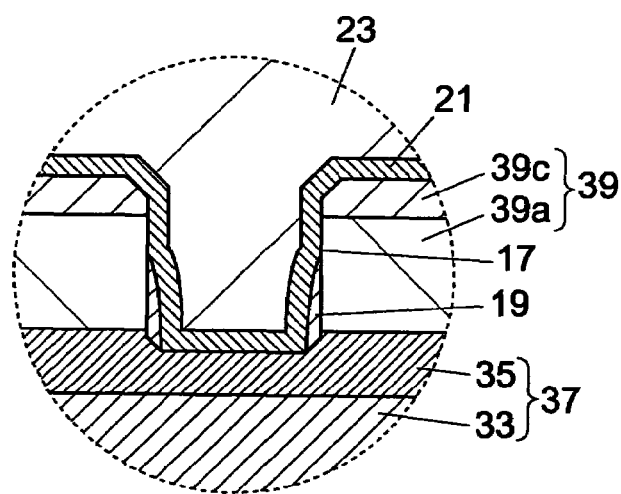
FIG. 15B is a cross-sectional view showing an expanded view of the portion surrounded by a dashed line in FIG. 15A.

FIG. 15A is a cross-sectional view showing the formation region of the metal thin-film-resistor object 21 according to another embodiment of the first aspect of the present invention. FIG. 15B is a cross-sectional view showing an expanded view of the portion surrounded by a dashed line in FIG. 15A. The same reference numbers are given to the portions that achieve the same functions as FIGS. 1A and 1B, and detailed explanation thereof are not repeated.

The device separating oxide film 3 is formed on the surface of the silicon substrate 1. The transistor constituted by the impurity diffusion layers 4a and 4a, the gate insulator layer 4b, and the gate electrode 4c is formed in a region surrounded by the device separating oxide film 3 below the silicon substrate 1 below the CrSi thin-film-resistor object 21.

The first layer insulation film 5 is formed on the silicon substrate 1 including the formation regions of the device separating oxide film 3 and the transistor. Corresponding to the impurity diffusion layers 4a and 4a, and the gate electrode 4c, the contact holes 6a and the conductive plugs 6b are formed in the first layer insulation film 5.

On the first layer insulation film 5 and the conductive plugs 6b, the first layer metal wiring pattern 11a consisting of the metal material pattern 7 and the high melting point metal film 9 is formed. On the first layer insulation film 5, a first layer metal wiring pattern (not illustrated) consisting of the metal material pattern 7 and the high melting point metal film 9 is formed.

On the first layer insulation film 5 including the formation region of the first layer metal wiring pattern 11a, a second layer insulation film 31 constituted by the plasma NSG film, the SOG film, and the plasma PSG film in this sequence from bottom to top is formed. In FIG. 15A, the second layer insulation film 31 is illustrated in one body.

On the second layer insulation film 31, a second layer metal wiring pattern 37 consisting of a metal material pattern 33 and a high melting point metal film 35 formed on the surface of the metal material pattern 33 is formed. The metal material pattern 33 is formed, for example, with an AlSiCu film. The high melting point metal film 35 is formed, for example, with a TiN film, and serves as a barrier film and an antireflection film. A part of the second layer metal wiring pattern 37 is extended and formed in the region below the CrSi thin-film-resistor object 21, and constitutes a laser-beam transparency prevention film 41.

On the second layer insulation film 31 including the formation region of the second layer metal wiring pattern 37 and the laser-beam transparency prevention film 41, a third layer insulation film (ground insulator layer) 39 (illustrated in one body in FIG. 15) is formed, the third insulation film 39 being constituted by a plasma NSG film 39a, an SOG film, and a plasma PSG film 39c is formed in this sequence from bottom to top. The connection holes 17 are formed to the third layer insulation film 39 at places that correspond to both ends of the metal thin-film-resistor object 21 and the second layer metal wiring pattern 37.

As shown in FIG. 15B, a part of the surface of the high melting point metal film 35 is removed at the bottom of the connection holes 17, and the upper ends of connection holes 17 are formed in the taper form. Further, the Ar sputter etching residual substance 19 is formed in the inner wall of the connection holes 17. The taper form at the upper end of the connection holes 17 and the Ar sputter etching residual substance 19 are not illustrated in FIG. 15A. The taper form and the Ar sputter etching residual substance 19 of the connection holes 17 are formed by performing the Ar sputter etching process on the third layer insulation film 39 in which the connection holes 17 are formed. Accordingly, the Ar sputter etching residual substance 19 contains the material of the high melting point metal film 35, the third layer insulation film 39, and Ar; and, in this embodiment, contains Ti, N, Si, O, and Ar.

The CrSi thin-film-resistor object 21 is formed in the region between the connection holes 17 and 17 on the third layer insulation film 39, inside the connection holes 17, and on the second layer metal wiring pattern 37. Both ends of the CrSi thin-film-resistor object 21 are electrically connected to the second layer metal wiring pattern 37 in the connection holes 17. A laser-beam transparency prevention film 41 is arranged below the CrSi thin-film-resistor object 21 through the third layer insulation film 39. Further, the first layer metal wiring pattern 11a and the transistor are arranged below the laser-beam transparency prevention film 41.

The passivation film 23 is formed on the third layer insulation film 39 including the formation region of the CrSi thin-film-resistor object 21.

Since the underground insulator film 31 of the CrSi thin-film-resistor object 21 has the PSG film 31c as the uppermost layer in this embodiment as in the embodiment described with reference to FIG. 1, compared with the case where an NSG film is used as an insulator layer in contact with the undersurface of the CrSi thin-film-resistor object 21, damage to the regions adjacent to the metal thin-film-resistor object 21 due to laser irradiation can be reduced. Further, since the transistor as a component of the integrated circuit and the first layer metal wiring pattern 11a are arranged in the region under the CrSi thin-film-resistor object 21, miniaturization of the chip can be attained.

Further, since the laser-beam transparency prevention film 41 consisting of metal material is provided between the third layer insulation film 39 and the first layer metal wiring pattern 11a, the transistor, and the silicon substrate 1 in the region below the CrSi thin-film-resistor object 21, even if a laser beam 25 of an intensity that is sufficient to cut or modify the CrSi thin-film-resistor object 21 is irradiated onto the CrSi thin-film-resistor object 21 in the laser trimming process, the laser beam 25 penetrating the third layer insulation film 39 is reflected by the laser-beam transparency prevention film 41; and the first layer metal wiring pattern 11a, the transistor, and the silicon substrate 1 are protected from the laser beam 25.

In this way, the first layer metal wiring pattern 11a arranged under the CrSi thin-film-resistor object 21 is prevented from being damaged, and the property of the transistor is prevented from being change. Further, the reliability of the semiconductor device is prevented from degrading due to irradiation of the laser beam onto the silicon substrate 1 at the trimming process. Further, generating of an electronic electron hole pair originated by irradiation of the laser beam onto the silicon substrate 1 at the time of online trimming processing can be prevented from occurring, and highly precise trimming processing can be performed.

Further, as shown in FIG. 15B, the Ar sputter etching residual substance 19 is formed on the inner wall of the connection holes 17, and the upper end of the connection holes 17 is formed in the shape of a taper (that is the same as the embodiment shown in FIG. 1A and FIG. 1B, wherein the Ar sputter etching residual substance 19 is formed on the inner wall of the connection holes 17, and the upper end of the connection holes 17 is formed in the shape of a taper), the step coverage of the CrSi thin-film-resistor object 21 in the neighborhood of the connection holes 17 can be raised, and stabilization of the contact resistance of the CrSi thin-film-resistor object 21 with the metal wiring pattern 37 can be realized.

An example of the manufacturing method to practice this embodiment is described.

The first layer insulation film 5, the contact holes 6a, the conductive plugs 6b, and the first layer metal wiring pattern 11a are formed by the same process as Process (1) described with reference to FIG. 2A on the silicon substrate 1 on which the device separating oxide film 3, and the transistor constituted by the impurity diffusion layers 4a and 4a, the gate insulator layer 4b, and the gate electrode 4c are formed. Then, the second layer insulation film 31 is formed according to the same process as Process (2) described with reference to FIG. 2B.

By the same process as Processes (1) through (4) described with reference to FIGS. 2A through 2D, whereby the first layer metal wiring pattern 11 consisting of the metal material pattern 7 and the high melting point metal film 9, the second layer insulation film 15, the connection holes 17, the Ar sputter etching residual substance 19, and the CrSi thin film 27 is formed on the first layer insulation film 5, the second layer metal wiring pattern 37 consisting of the metal material pattern 33 and the high melting point metal film 35, and the third layer insulation film 39 is formed on the second layer insulation film 31, the connection holes 17 are formed to the third layer insulation film 39, the taper form at the upper end of the connection holes 17 and the Ar sputter etching residual substance 19 are formed by Ar sputter etching process, and the CrSi thin film for CrSi thin-film-resistor object 21 is formed.

Then, the CrSi thin film is patterned such that the CrSi thin-film-resistor object 21 is formed, and the passivation film 23 is formed, which completes the manufacturing process of this embodiment.

As described above, this embodiment also enjoys the effects enjoyed by the embodiment described with reference to FIG. 1; namely, the effect of not performing patterning by wet etching technology after patterning of the CrSi thin-film-resistor object 21, the effect of not exposing the surface of the CrSi thin-film-resistor object 21 contacting the second metal wiring pattern 37 to the atmosphere, the effect of providing the high melting point metal film 35 serving as the barrier film between the CrSi thin-film-resistor object 21 and the metal material pattern 33, and the effect of performing the Ar sputter etching process on the third layer insulation film 39 serving as the underground film before forming the CrSi thin film for CrSi thin-film-resistor object 21.

Figure 16A:
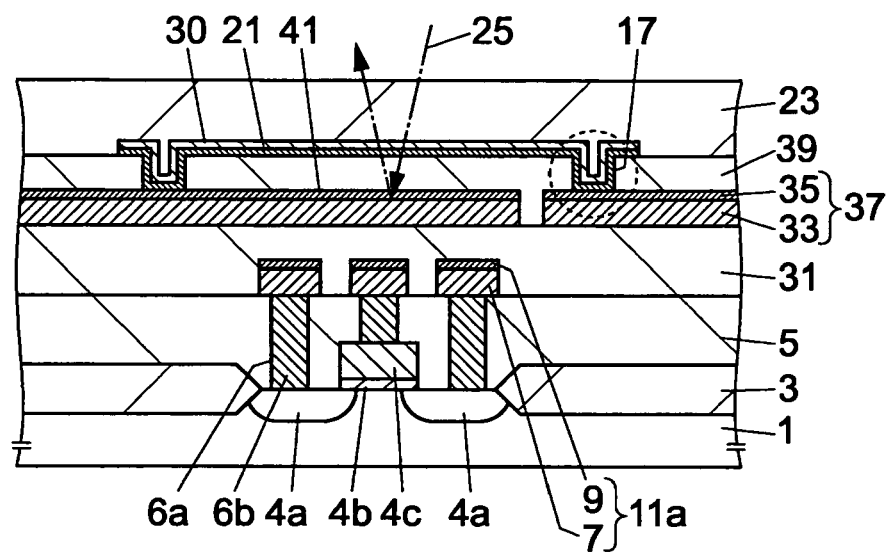
FIG. 16A is a cross-sectional view showing the formation region of the metal thin-film-resistor object according to another embodiment of the first aspect of the present invention.
Figure 16B:
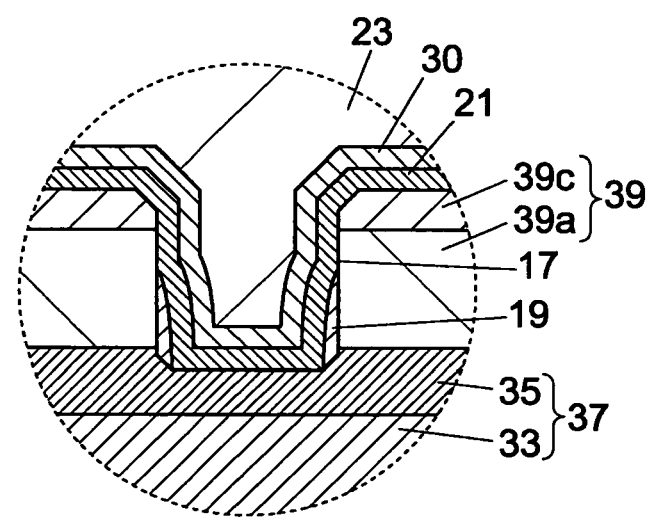
FIG. 16B is a cross-sectional view showing an expanded view of the portion surrounded by a dashed line in FIG. 16A.

Further, as shown in FIG. 16A and FIG. 16B, the CrSiN film 30 may formed on the upper surface of the CrSi thin-film-resistor object 21 as in the embodiment described with reference to FIG. 13. Between the CrSi thin-film-resistor object 21 and the CrSiN film 30, CrSiO is not formed in this embodiment. In the embodiment shown in FIG. 16, the CrSiN film 30 can be formed by the manufacturing method described with reference to FIG. 13.

Figure 17A:
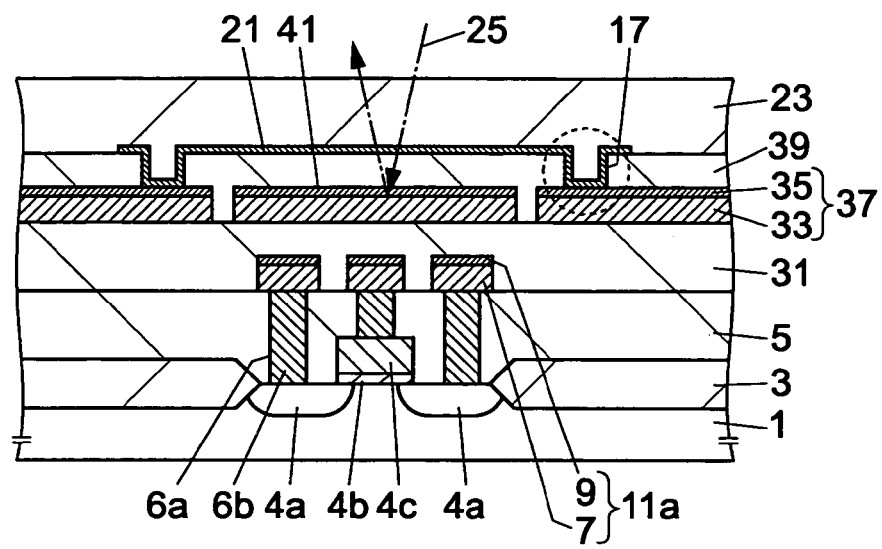
FIG. 17A is a cross-sectional view showing the formation region of the metal thin-film-resistor object according to another embodiment of the first aspect of the present invention.
Figure 17B:
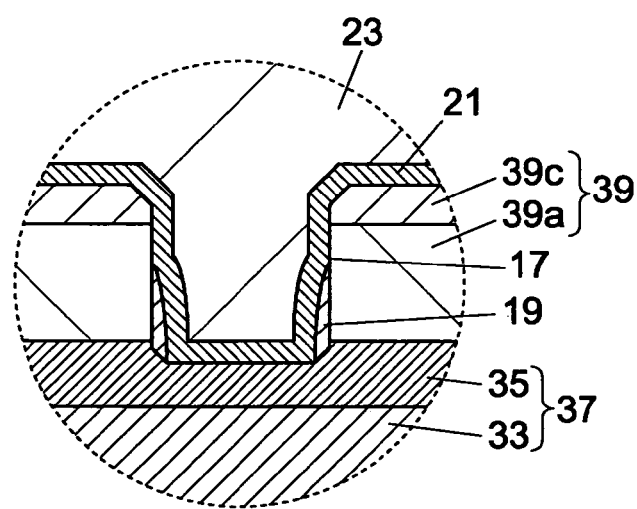
FIG. 17B is a cross-sectional view showing an expanded view of the portion surrounded by a dashed line in FIG. 17A.

FIG. 17A is a cross-sectional view showing the formation region of the metal thin-film-resistor object 21 according to another embodiment of the first aspect of the present invention. FIG. 17B is a cross-sectional view showing an expanded view of the portion surrounded by a dashed line in FIG. 17A. The same reference numbers are given to the portions that achieve the same functions as FIGS. 1A and 1B, and detailed explanation thereof are not repeated.

Difference of this embodiment from the embodiment described with reference to FIG. 15 is in that the laser-beam transparency prevention film 41 is provided separately from the second layer metal wiring pattern 37. Other structures are the same as the embodiment described with reference to FIG. 15. The structure of the present embodiment can be similarly formed by changing the mask for carrying out patterning of the second layer metal wiring pattern 37 and the laser-beam transparency prevention film 41 in the manufacturing process for manufacturing the embodiment shown in FIG. 15.

Even if the second layer metal wiring pattern 37 and the laser-beam transparency prevention film 41 are separately provided, the same action effect as the embodiment described with reference to FIGS. 15A and 15B can be acquired.

In the present embodiment (FIGS. 17A and 17B), the CrSiN film 30 may be formed on the CrSi thin-film-resistor object 21 as in the embodiment described with reference to FIGS. 16A and 16B.

Further, the transistor of the embodiments described with reference to FIGS. 15A, 16A, and 17A may be replaced with the capacitor as shown in FIG. 10A, the polysilicon wiring pattern 28 shown in FIG. 11A, and the impurity diffusion layer 29 as shown FIG. 12A at the position below the CrSi thin-film-resistor object 21 and the laser-beam transparency prevention film 41.

In the embodiments described with reference to FIGS. 15A, 15B, through 17A and 17B, the laser-beam transparency prevention film 41 is formed of the same material as the second layer metal wiring pattern 37 to which the CrSi thin-film-resistor object 21 is electrically connected. Nevertheless, the first aspect of the present invention of the semiconductor device is not limited to this, but the laser-beam transparency prevention film may be formed of a metal material that differs from the second layer metal wiring pattern 37, and formed separately from the second layer metal wiring pattern 37.

Further, in the embodiments described with reference to FIGS. 15A, 15B, through 17A and 17B, the laser-beam transparency prevention film 41 is formed in the same layer as the second layer metal wiring pattern 37 to which the CrSi thin-film-resistor object 21 is electrically connected. Nevertheless, the present invention is not limited to this, but a laser-beam transparency prevention film and the metal wiring pattern to which the metal thin-film-resistor object 21 is electrically connected may be formed in a mutually different layer; for example, the laser-beam transparency prevention film may be formed in the same layer as the second layer metal wiring pattern, and the metal wiring pattern to which a metal thin-film-resistor object is electrically connected is formed of the third layer metal wiring pattern.

Figure 18A:
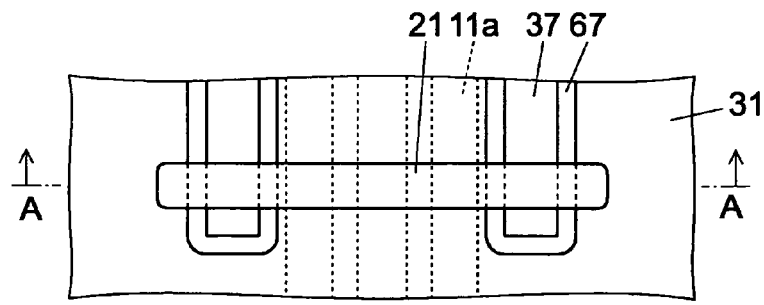
FIG. 18A is a plan view of the formation region of the metal thin-film-resistor object according to an embodiment of the second aspect of the present invention.
Figure 18B:
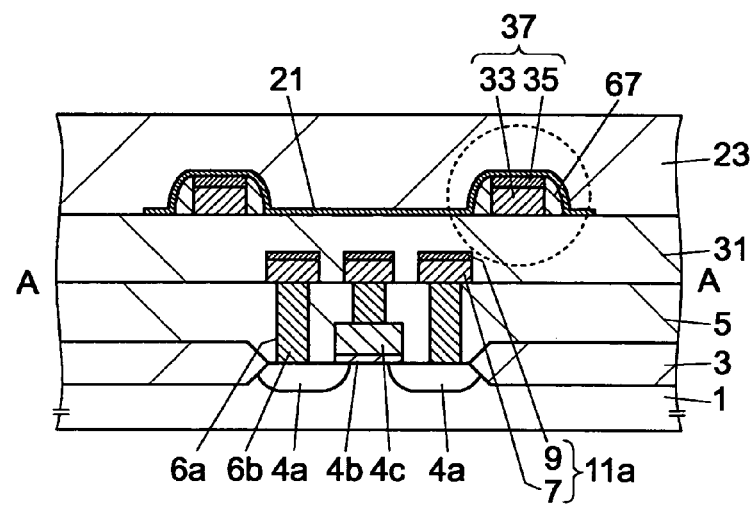
FIG. 18B is a cross-sectional view taken along line A-A in FIG. 18A.
Figure 18C:
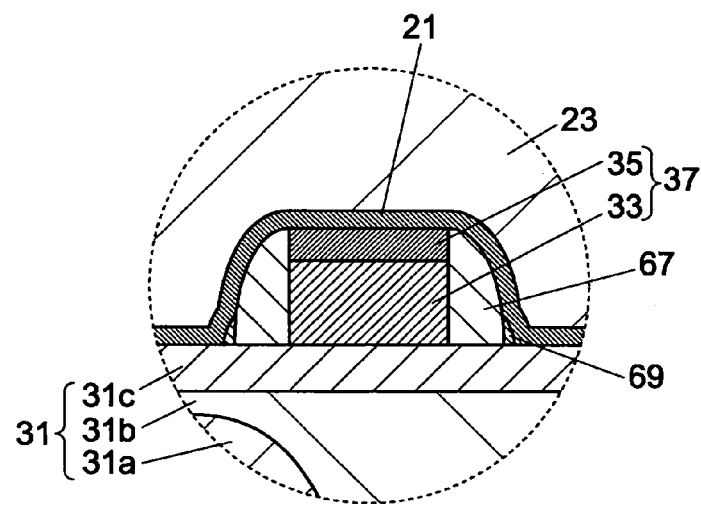
FIG. 18C is a cross-sectional view showing an expanded view of the portion surrounded by a dashed line in FIG. 18B.

FIG. 18A is a plan view of the formation region of the metal thin-film-resistor object 21 according to an embodiment of the second aspect of the present invention. FIG. 18B is a cross-sectional view taken along line A-A in FIG. 18A. FIG. 18C is a cross-sectional view showing an expanded view of the portion surrounded by a dashed line in FIG. 18B. Illustration of the passivation film 23 is omitted in FIG. 18A. The same reference numbers are given to the portions that achieve the same functions as the embodiments already described, and detailed explanations thereof are not repeated.

The device separating oxide film 3 is formed on the surface of the silicon substrate 1. The transistor constituted by the impurity diffusion layers 4a and 4a, the gate insulator layer 4b, and the gate electrode 4c is formed on the silicon substrate 1 in the region surrounded by the device separating oxide film 3 corresponding to the bottom of the CrSi thin-film-resistor object 21.

The first layer insulation film 5 is formed on the silicon substrate 1 including the formation region of the device separating oxide film 3 and the transistor. Corresponding to the impurity diffusion layers 4a and 4a and the gate electrode 4c, the contact holes 6a and the conductive plugs 6b are formed in the first layer insulation film 5.

On the first layer insulation film 5 and the conductive plugs 6b, the first layer metal wiring pattern 11a consisting of the metal material pattern 7 and the high melting point metal film 9 is formed. On the first layer insulation film 5 in a region that is not illustrated, the first layer metal wiring pattern consisting of the metal material pattern 7 and the high melting point metal film 9 is formed.

The second layer insulation film 31 constituted by the plasma NSG film 31a, the SOG film 31b, and the plasma PSG film 31c in this sequence from bottom to top is formed on the first layer insulation film 5 including the formation region of the first layer metal wiring pattern 11a. In FIG. 18B, the second layer insulation film 31 is illustrated in one body.

On the second layer insulation film 31, the second layer metal wiring pattern 37 constituted by the metal material pattern 33 and the high melting point metal film 35 is formed.

A sidewall 67 is formed of an insulating material, for example, a CVD oxide film on the sides of the second layer metal wiring pattern 37. An Ar sputter etching residual substance 69 (illustration is omitted in FIGS. 18A and 18B) is formed on the surface of the sidewall 67 on the side of the second layer insulation film 31. To the second layer insulation film 31, the Ar sputter etching process is performed, and the Ar sputter etching residual substance 69 is formed, after the second layer metal wiring pattern 37 and the sidewall 67 are formed. The Ar sputter etching residual substance 69 contains at least Ar, and the materials of the second layer insulation film 31 and the sidewall 67.

The CrSi thin-film-resistor object 21, which is shaped like a belt, is formed on the surface of the sidewalls 67 and the surface of the Ar sputter etching residual substances 69, and on the second layer insulation film 31 between the countering second layer metal wiring patterns 37. Both ends of the CrSi thin-film-resistor object 21 are extended to the surface of the sidewall 67 and the Ar sputter etching residual substance 69 formed on the opposite sides of the countering sides of the countering second layer metal wiring patterns 37, and to the second layer insulation film 31. The CrSi thin-film-resistor object 21 and the second layer metal wiring pattern 37 are formed such that they intersect each other.

The passivation film 23 (illustration is omitted in FIG. 18A) serving as the final protective coat is formed on the second layer insulation film 31 including the formation region of the CrSi thin-film-resistor object 21.

Since the underground insulator film 31 of the CrSi thin-film-resistor object 21 according to the present embodiment has the PSG film 31c as the uppermost layer as in the embodiment described with reference to FIG. 1, compared with the case where an NSG film is used as an insulator layer in contact with the undersurface of the CrSi thin-film-resistor object 21, damage to the regions adjacent to the metal thin-film-resistor object 21 due to laser irradiation can be reduced.

Further, since the transistor as a component of the integrated circuit, and the first layer metal wiring pattern 11a are arranged in the region under the CrSi thin-film-resistor object 21, miniaturization of the chip can be attained.

FIGS. 19A through 19D are cross-sectional views showing an example of the manufacturing method of the metal thin-film-resistor according to the embodiment. The embodiment is described with reference to FIG. 18 and FIGS. 19A through 19D.

Process (1): According to Processes (1) through (3) described above with reference to FIGS. 2A through 2D, on the silicon substrate 1 in the shape of a wafer, on which the device separating oxide film 3, and the transistor constituted by the impurity diffusion layers 4a and 4a, the gate insulator layer 4b, and the gate electrode 4c are formed, the first layer metal wiring pattern 11a consisting of the first layer insulation film 5, the contact holes 6a, the conductive plugs 6b, the metal wiring pattern 7, and the high melting point metal film 9 are formed.

According to the process same as having formed the second layer insulation film 15 at Process (2) described with reference to FIG. 2B, the second layer insulation film 31 is formed on the first layer insulation film 5, the second layer insulation film 31 being constituted by the plasma NSG film, the SOG film, and the plasma PSG film in this sequence from bottom to top.

Figure 19A:
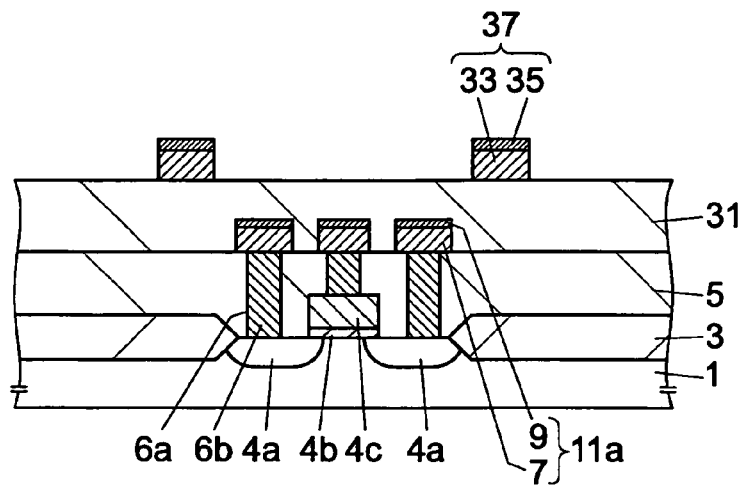
FIGS. 19A through 19C are cross-sectional views showing an example of the manufacturing method of the metal thin-film-resistor according to the embodiment.

According to the process same as having formed the first layer metal wiring pattern 11 at Process (1) described with reference to FIG. 2A, the second layer metal wiring pattern 37 consisting of the metal material pattern 33 and the high melting point metal film 35 is formed on the second layer insulation film 31 (refer to FIG. 19A).

Since at this stage the metal thin-film-resistor object 21 that would have been formed according to the conventional technology has not been formed, but the underground film of the second layer metal wiring pattern 37 is formed with the second layer insulation film 31, it is possible to pattern the high melting point metal film and the metal film for wiring with sufficient over-etching using the dry etching technology. That is, there is no need for applying the wet etching technology, which is one of the problems of the conventional technology, and miniaturization of a circuit can be realized.

Process (2): A plasma PSG film having a thickness of about 200 nm (2000 Å) is formed on the second layer insulation film 31 including the formation region of the second layer metal wiring pattern 37 by, for example, the plasma CVD method; and then, an etch back process is performed to form the sidewall 67 made of the plasma PSG film on the side of the second layer metal wiring pattern 37 (refer to FIG. 19B).

Process (3): The Ar sputter etching process is performed to the second layer insulation film 31 including the second layer metal wiring pattern 37 and the formation region of a sidewall 67 in a vacuum using, for example, an Ar sputter etching chamber of multi chamber sputtering equipment under conditions of DC-bias: 1250 V, Ar: 20 sccm, pressure: 1.13 Pa (8.5 mTorr), and processing time: 20 seconds. The etching conditions are equivalent to etching about 5 nm (50 Å) of a thermal oxidation film formed in wet atmosphere of 1000° C. By the Ar sputter etching process, the Ar sputter etching residual substance 69 is formed on the surface of the sidewall 67 on the side of the second layer insulation film 31 (refer to FIG. 18C).

Then, without breaking the vacuum state after finishing the Ar sputter etching process, the CrSi thin film for forming the metal thin film resistor object is formed. Here, the semiconductor wafer is transported from the Ar sputter etching chamber to the sputter chamber wherein the CrSi target is prepared, and the CrSi thin film is formed in about 5 nm (50 Å) thickness on the second layer insulation film 31 including the formation region of the first layer metal wiring pattern 11 and the sidewalls 67 and 67 under conditions of CrSi target (Si/Cr=80/20 wt %), DC power: 0.7 kW, Ar: 85 sccm, pressure: 1.13 Pa (8.5 mTorr), and processing time: 9 seconds.

The resist pattern for demarcating the formation region of the metal thin-film-resistor object 21 is formed on the CrSi thin film by a photoengraving process. Then, a patterning process is carried out to the CrSi thin film, for example, using RIE equipment with the resist pattern serving as a mask, and the CrSi thin-film-resistor object 21 is formed (refer to FIG. 19C). Then, the resist pattern is removed. Here, since the CrSi thin-film-resistor object 21 is electrically connected to a part of the second layer metal wiring pattern 37, a metal oxide film removing process is not required, the process being for removing a metal oxide-film on the surface of the CrSi thin-film-resistor object 21 by hydrofluoric acid solution required by the conventional technology in order to take electrical connection.

Process (4): A silicon oxide film and a silicon nitride film serving as the passivation film 23 are formed one by one on the second layer insulation film 31 by, for example, the plasma CVD method. This completes the manufacturing process of the semiconductor device according to the present embodiment (refer to FIGS. 18A through 18C).

As described above, after forming the CrSi thin-film-resistor object 21, it is not necessary to perform a patterning process by wet etching technology. Further, since the surface of the CrSi thin-film-resistor object 21 contacting the second layer metal wiring pattern 37 is not exposed to the atmosphere, even if the process of removing the oxide-film is not performed and the barrier film is not formed for etching prevention to protect the CrSi thin-film-resistor object 21, stabilized and satisfactory electrical connection between the CrSi thin-film-resistor object 21 and the second layer metal wiring pattern 37 is obtained. Miniaturization of the CrSi thin-film-resistor object 21 and stabilization of resistance can be realized regardless of the film thickness of the CrSi thin-film-resistor object 21 without increasing the number of processes.

Further, the CrSi thin-film-resistor object 21 is formed covering the upper surfaces of the second layer metal wiring patterns 37, the surfaces of the second layer insulation films 31, the surfaces of the sidewalls 67, and the Ar sputter etching residual substances 69. For this reason, the series of processes of forming the connection hole can be dispensed with, which processes are required in the case where the electrical connection between the metal thin-film-resistor object 21 and the wiring pattern is formed through the connection hole formed on the wiring pattern, thereby shortening and simplifying the manufacturing process. Further, resistance change of the metal thin-film-resistor object 21 and increase in the contact resistance with the electrode resulting from degradation of the step coverage of the metal thin-film-resistor object 21 due to using the connection hole can be avoided.

Further, since the sidewall 67 is formed on the side of the second layer metal wiring pattern 37, degradation of the step coverage of the CrSi thin-film-resistor object 21 by a steep level difference resulting from the side of the wiring pattern 11 can be prevented.

In this way, the resistance of the CrSi thin-film-resistor object 21 including the contact resistance with the second layer metal wiring pattern 37 is stabilized.

Further, since both ends of the CrSi thin-film-resistor object 21 are formed intersecting the corresponding second layer metal wiring patterns 37, superposition gap between the CrSi thin-film-resistor object 21 and the second layer metal wiring pattern 37, and change of contacting area of the second layer metal wiring pattern 37 to the CrSi thin-film-resistor object 21 due to rounding of the ends of the CrSi thin-film-resistor object 21 can be prevented from occurring, the contact resistance can be further stabilized.

Further, since the high melting point metal film 35 serving as the barrier film is formed between the CrSi thin-film-resistor object 21 and the metal material pattern 33, the variation in the contact resistance between the CrSi thin-film-resistor object 21 and the second layer metal wiring pattern 37 can be reduced, and precision of resistance and improvement in yield are attained.

Further, since the high melting point metal film 35 can be formed without increasing the number of manufacturing processes compared with the conventional technology, the high melting point metal film 35 serving as the barrier film and the antireflection film, the contact resistance between the metal thin-film-resistor object 21 and the wiring pattern can be stabilized, while preventing the manufacturing cost from rising.

Further, by performing the Ar sputter etching process immediately before forming the CrSi thin film for CrSi thin-film-resistor object 21, as described with reference to FIGS. 4 through 8, the underground film dependability of the CrSi thin-film-resistor object 21 is improved.

Figure 20A:
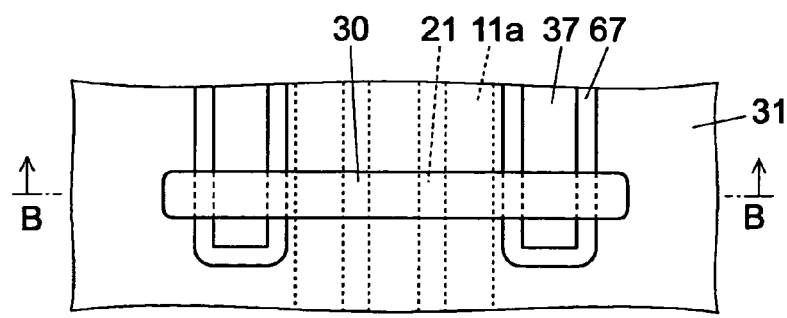
FIG. 20A is a plan view of the formation region of the metal thin-film-resistor object according to another embodiment of the second aspect of the present invention.
Figure 20B:
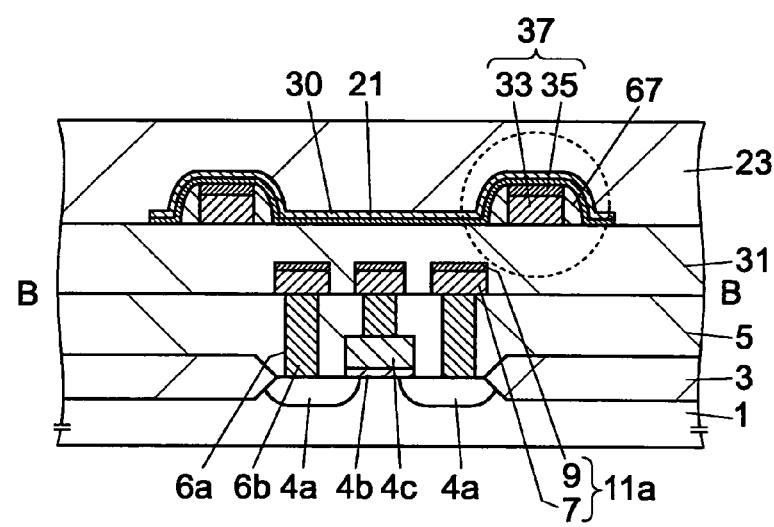
FIG. 20B is a cross-sectional view taken along line B-B in FIG. 20A.
Figure 20C:
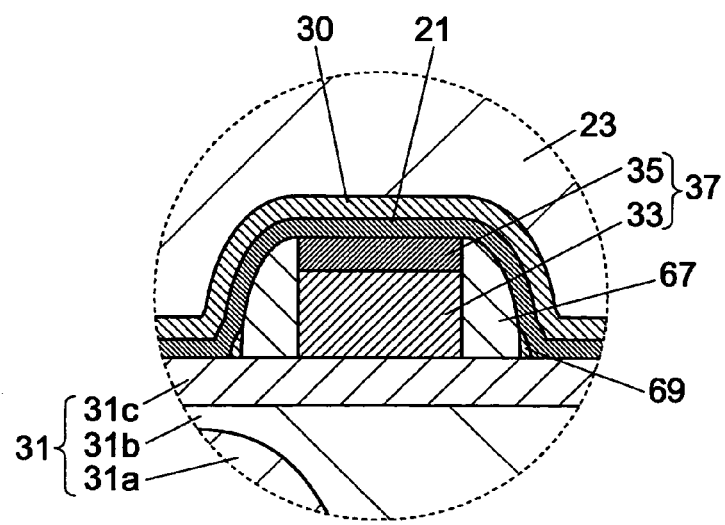
FIG. 20C is a cross-sectional view showing an expanded view of the portion surrounded by a dashed line in FIG. 20B.

FIG. 20A is a plan view of the formation region of the metal thin-film-resistor object 21 according to another embodiment of the second aspect of the present invention. FIG. 20B is a cross-sectional view taken along line B-B in FIG. 20A. FIG. 20C is a cross-sectional view showing an expanded view of the portion surrounded by a dashed line in FIG. 20B. Illustration of the passivation film is omitted in FIG. 20A. The same reference numbers are given to the portions that achieve the same functions as the embodiments already described, and detailed explanations thereof are not repeated.

The present embodiment differs from the embodiment described with reference to FIGS. 18A, 18B, and 18C in that the CrSiN film 30 is formed on the upper surface of the CrSi thin-film-resistor object 21. Between the CrSi thin-film-resistor object 21 and the CrSiN film 30, CrSiO is not formed. The CrSiN film 30 can be formed by the example of the manufacturing method described with reference to FIGS. 13A and 13B.

According to the present embodiment, since the CrSiN film 30 covers the upper surface of the CrSi thin-film-resistor object 21, the upper surface of the CrSi thin-film-resistor object 21 is protected from the atmosphere, and changing the resistance of the CrSi thin-film-resistor object 21 is prevented from occurring as in the embodiment described with reference to FIGS. 13A and 13B.

Figure 21A:
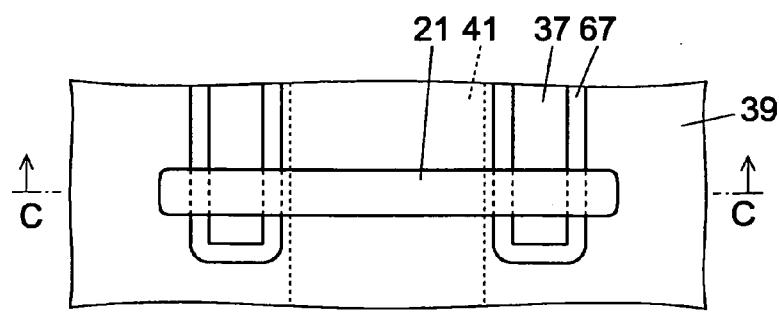
FIG. 21A is a plan view of the formation region of the metal thin-film-resistor object according to another embodiment of the second aspect of the present invention.
Figure 21B:
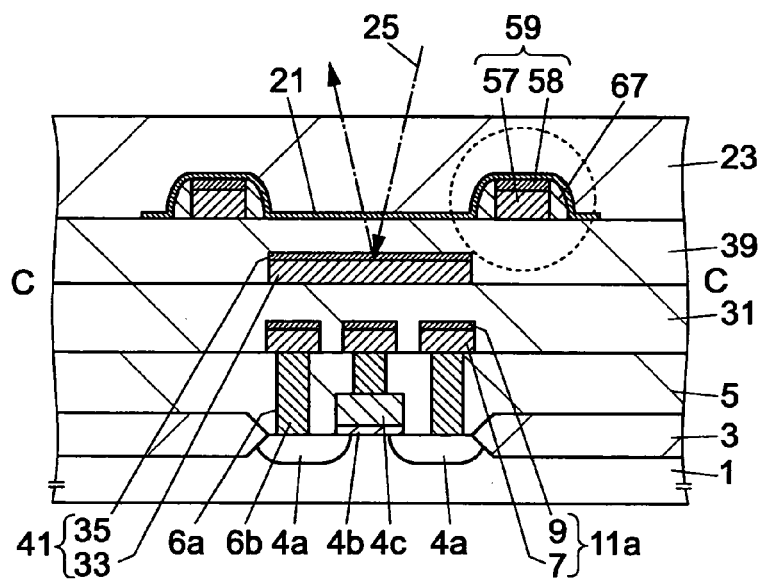
FIG. 21B is a cross-sectional view taken along line C-C in FIG. 21A.
Figure 21C:
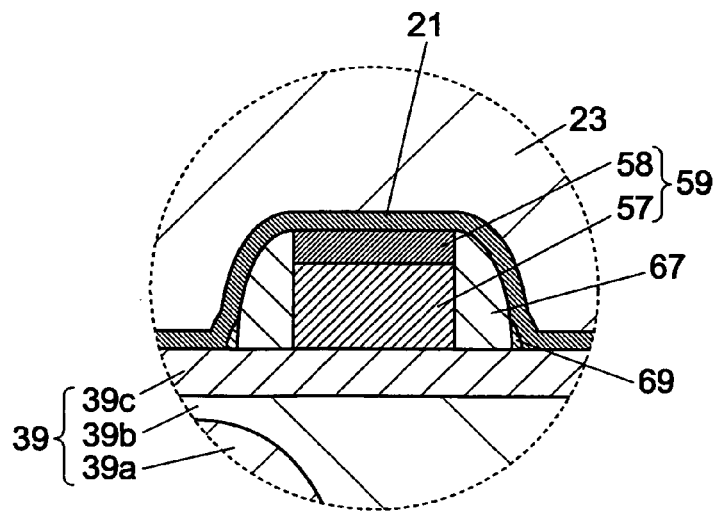
FIG. 21C is a cross-sectional view showing an expanded view of the portion surrounded by a dashed line in FIG. 21B.

FIG. 21A is a plan view of the formation region of the metal thin-film-resistor object 21 according to another embodiment of the second aspect of the present invention. FIG. 21B is a cross-sectional view taken along line C-C in FIG. 21A. FIG. 21C is a cross-sectional view showing an expanded view of the portion surrounded by a dashed line in FIG. 21B. Illustration of the passivation film 23 is omitted in FIG. 21A. The same reference numbers are given to the portions that achieve the same functions as the embodiments already described, and detailed explanations thereof are not repeated.

The device separating oxide film 3 is formed on the surface of the silicon substrate 1.

The transistor constituted by the impurity diffusion layers 4a and 4a, the gate insulator layer 4b, and the gate electrode 4c is formed on the silicon substrate 1 in a region corresponding to the bottom of the CrSi thin-film-resistor object 21 and surrounded by the device separating oxide film 3.

The first layer insulation film 5 is formed on the silicon substrate 1 including the formation region of the device separating oxide film 3 and the transistor. Corresponding to the impurity diffusion layers 4a and 4a and the gate electrode 4c, the contact holes 6a and the conductive plugs 6b are formed in the first layer insulation film 5.

On the first layer insulation film 5 and the conductive plugs 6b, the first layer metal wiring pattern 11a consisting of the metal material pattern 7 and the high melting point metal film 9 is formed. On the first layer insulation film 5 in a region that is not illustrated, the first layer metal wiring pattern consisting of the metal material pattern 7 and the high melting point metal film 9 is formed.

The second layer insulation film 31 is formed on the first layer insulation film 5 including the formation region of the first layer metal wiring pattern 11a. On the second layer insulation film 31, the laser-beam transparency prevention film 41 consisting of the metal material pattern 33 and the high melting point metal film 35 is formed. The laser-beam transparency prevention film 41 is arranged in the region under the CrSi thin-film-resistor object 21.

On the second layer insulation film 31 including the formation region of the laser-beam transparency prevention film 41, the third layer insulation film (ground insulator layer) 39 constituted by the plasma NSG film 39a, the SOG film 39b, and the plasma PSG film 39c formed in this sequence from bottom to top is formed. FIG. 21B shows the third layer insulation film 39 in one body.

On the third layer insulation film 39, a third layer metal wiring pattern 59 consisting of a metal material pattern 57 and a high melting point metal film 58 formed on the metal material pattern 57 is formed. The metal material pattern 57 is formed, for example, of an AlSiCu film. The high melting point metal film 57 is formed, for example, of the TiN film, and serves as the barrier film and the antireflection film.

The sidewalls 67 constituted by an insulating material, for example, a CVD oxide film are formed on the sides of the third layer metal wiring pattern 59. The Ar sputter etching residual substance 69 (illustration is omitted in FIGS. 21A and 21B) is formed on the surface of the sidewalls 67 on the sides of the third layer insulation film 39. The Ar sputter etching residual substance 69 is formed by performing the Ar sputter etching process to the third layer insulation film 39 after forming the third layer metal wiring pattern 59 and the sidewall 67. The Ar sputter etching residual substance 69 contains at least the materials of the third layer insulation film 59 and the sidewall 67, and Ar.

The CrSi thin-film-resistor object 21, which is shaped like a belt, is formed on the surface of the sidewalls 67 and the surface of the Ar sputter etching residual substance 69 between the countering third layer metal wiring patterns 59, and the third layer insulation film 59. Both ends of the CrSi thin-film-resistor object 21 are extended on the surface of the sidewall 67 and the Ar sputter etching residual substance 69 formed on the sides opposite to the sides of the third layer metal wiring patterns 59 that counter, and the third layer insulation film 39. The CrSi thin-film-resistor object 21 and the third layer metal wiring pattern 59 are arranged such that they mutually cross. Below the CrSi thin-film-resistor object 21, the laser-beam transparency prevention film 41 is arranged through the third layer insulation film 39. Further, the first layer metal wiring pattern 11*a* and the transistor are arranged below the laser-beam transparency prevention film 41.

The passivation film 23 (illustration in FIG. 21A is omitted) serving as the final protective coat is formed on the third layer insulation film 39 including the formation region of the CrSi thin-film-resistor object 21.

Since the PSG film 39*c* serves as the uppermost layer of the underground insulator film 39 of the CrSi thin-film-resistor object 21 also in this embodiment, as the embodiment described with reference to FIG. 1, compared with the case where an NSG film is used as an insulator layer in contact with the undersurface of the CrSi thin-film-resistor object 21, damage to the regions adjacent to the metal thin-film-resistor object 21 by laser irradiation can be reduced.

Further, since the transistor as a component of the integrated circuit and the first layer metal wiring pattern 11*a* are arranged in the region under the CrSi thin-film-resistor object 21, miniaturization of the chip can be attained.

Further, since the laser-beam transparency prevention film 41 consisting of metal material is formed between the third layer insulation film 39 and the first layer metal wiring pattern 11*a*, the transistor, and the silicon substrate 1 in the region under the CrSi thin-film-resistor object 21, even if the CrSi thin-film-resistor object 21 is irradiated by the laser beam 25 of sufficient intensity for duly cut or modify the CrSi thin-film-resistor object 21, the laser beam 25 is prevented from irradiating the first layer metal wiring pattern 11*a*, the transistor and the silicon substrate 1 as in the embodiment described with reference to FIG. 15.

An example of the manufacturing method of this embodiment is described. On the silicon substrate 1 to which the device separating oxide film 3, and the transistor constituted by the impurity diffusion layers 4*a* and 4*a*, the gate insulator layer 4*b*, and the gate electrode 4*c* are formed, the first layer insulation film 5, the contact holes 6*a*, the conductive plugs 6*b*, and the first layer metal wiring pattern 11*a* are formed by the same process as Process (1) described with reference to FIG. 2A. Then, the second layer insulation film 31 is formed sequentially from bottom to top by the same process as Process (2) described with reference to FIG. 2B.

The laser-beam transparency prevention film 41 consisting of the metal material pattern 33 and the high melting point metal film 35, and the third layer insulation film 39 consisting of the plasma NSG film, the SOG film, and the plasma PSG film are formed on the second layer insulation film 31 by the same processes as Processes (1) and (2) described with reference to FIG. 2A and FIG. 2B whereby the first layer metal wiring pattern 11 consisting of the metal material pattern 7 and the high melting point metal film 9, and the second layer insulation film 15 are formed on the first layer insulation film 5.

Then, the second layer metal wiring pattern 59 consisting of the metal material pattern 57 and the high melting point metal film 58 is formed on the third layer insulation film 39 by the same process as Process (1) described with reference to FIG. 2A for forming the first layer metal wiring pattern 11.

Figure 19B:
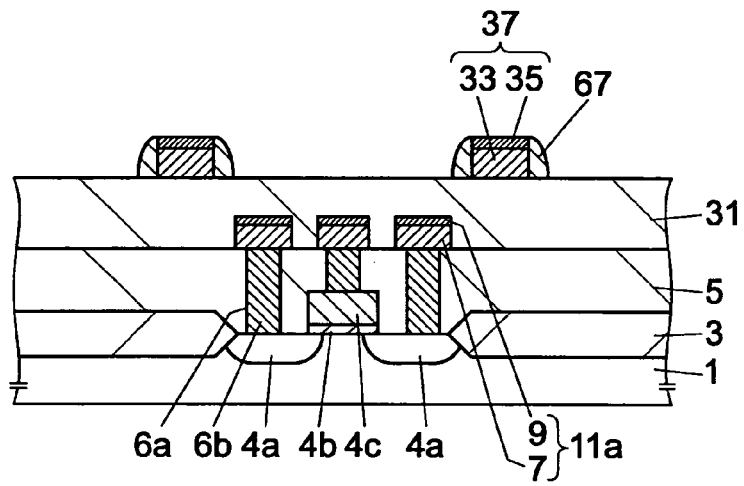
Figure 19C:
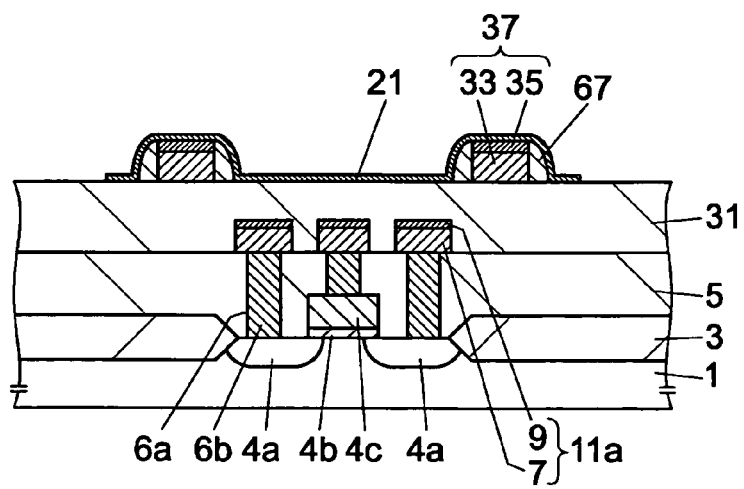

As in Processes (2) and (3) described with reference to FIGS. 19B and 19C, the sidewall 67 is formed on the side of the third layer metal wiring pattern 59, the Ar sputter etching residual substance 69 is formed by the Ar sputter etching process, and the CrSi thin-film-resistor object 21 is formed.

Then, the manufacturing process of this embodiment is completed by forming the passivation film 23.

As described above, the present embodiment enjoys the effect of not performing patterning by wet etching technology after patterning the CrSi thin-film-resistor object 21, the effect of not exposing the surface of the CrSi thin-film-resistor object 21 contacting the metal wiring pattern 37 to the atmosphere, the effect of having the high melting point metal film 35 serving as the barrier film between the CrSi thin-film-resistor object 21 and the metal material pattern 33, and the effect of performing the Ar sputter etching process to the third layer insulation film 39 serving as the underground film before forming the CrSi thin film for CrSi thin-film-resistor object 21.

Further, since the CrSi thin-film-resistor object 21 is formed covering the second layer insulation film 31, the upper surface of the third layer metal wiring pattern 59, the surfaces of the sidewalls 67, and the Ar sputter etching residual substances 69, as in the embodiment described with reference to FIG. 18, compared with the case where the electrical connection between a metal thin-film-resistor object and a wiring pattern is formed through a connection hole formed on the wiring pattern, shortening and simplification of the process are realizable. Further, the contact resistance with the electrode does not increase, and resistance of the metal thin-film-resistor object 21 does not change by degradation of the step coverage of the metal thin-film-resistor object 21 of because of the presence of the connection hole. Further, degradation of the step coverage of the CrSi thin-film-resistor object 21 due to a steep level difference resulting from the side of the wiring pattern 11 can be prevented from occurring.

Further, since both ends of the CrSi thin-film-resistor object 21 are formed intersecting the third layer metal wiring pattern 59, change of the contact area of the third layer metal wiring pattern 59 with the third layer metal wiring pattern 59 due to rounding of the ends of the CrSi thin-film-resistor object 21, and superposition gap of the CrSi thin-film-resistor object 21 to the CrSi thin-film-resistor object 21 is not a concern. Accordingly, the contact resistance that is further stable can be obtained.

Figure 22A:
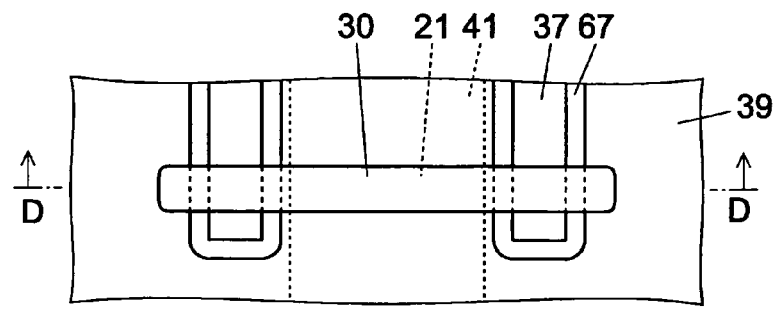
FIG. 22A is a plan view of the formation region of the metal thin-film-resistor object according to another embodiment of the second aspect of the present invention.
Figure 22B:
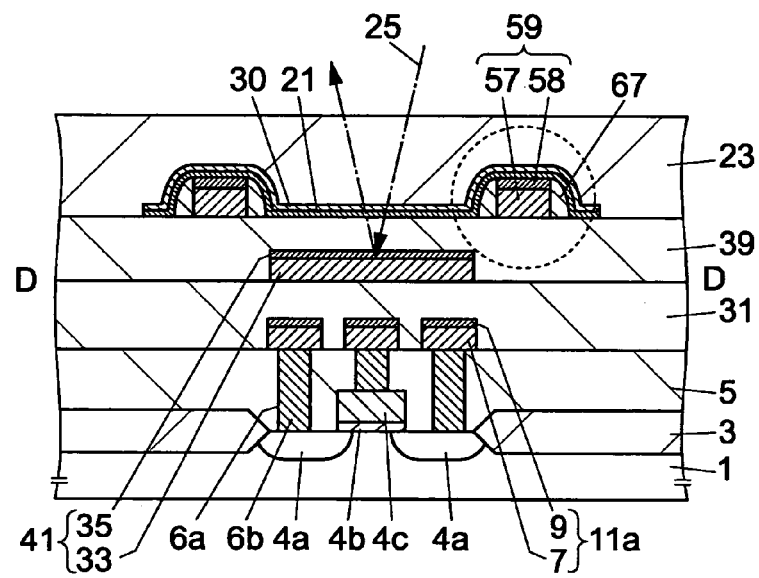
FIG. 22B is a cross-sectional view taken along line D-D in FIG. 22A.
Figure 22C:
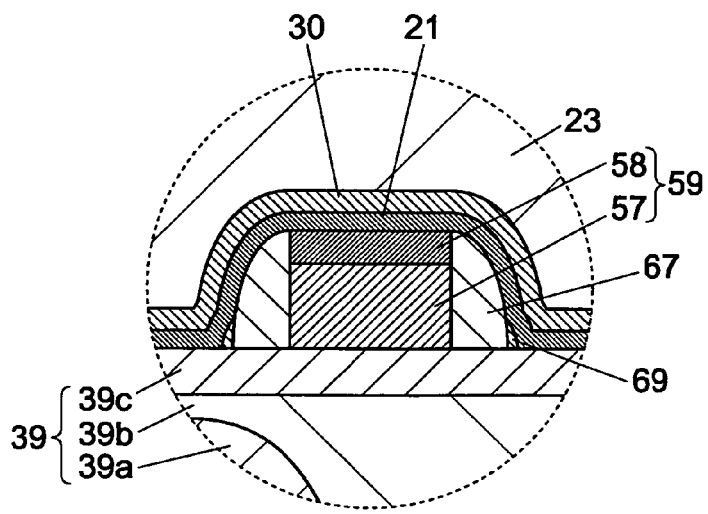
FIG. 22C is a cross-sectional view showing an expanded view of the portion surrounded by a dashed line in FIG. 22B.

Further, as shown in FIG. 22, the CrSiN film 30 may be formed on the upper surface of the CrSi thin-film-resistor object 21 as in the embodiment described with reference to FIG. 13. Between the CrSi thin-film-resistor object 21 and the CrSiN film 30, CrSiO is not formed in this embodiment. In the embodiment shown in FIG. 16, the CrSiN film 30 can be formed as in the manufacturing method described with reference to FIG. 13.

Further, the transistor of the embodiments described with reference to FIGS. 18A, 18B, 18C, 20A, 20B, 20C through 22A, 22B, and 22C may be replaced by the capacitor as shown in FIG. 10, the polysilicon wiring pattern 28 shown in FIG. 11, and the impurity diffusion layer 29 as shown in FIG. 12 in the region under the CrSi thin-film-resistor object 21.

Further, although the CrSi thin-film-resistor object 21 is formed mutually crossing with the second layer metal wiring pattern 37 or the third layer metal wiring pattern 59 in the embodiment of the second aspect, the present invention is not limited to this, but the ends of the metal thin-film-resistor object 21 may be arranged on the metal wiring pattern, and the ends of the metal wiring pattern may be arranged under the metal thin-film-resistor object 21.

Further, the form, direction, and arrangement of the metal thin-film-resistor object 21 and the metal wiring pattern are not limited to those described in the embodiment, e.g., the metal thin-film-resistor object 21 and the metal wiring pattern do not need to be arranged to perpendicularly intersect, but the metal thin-film-resistor object 21 and the metal wiring pattern may be arranged in parallel, for example.

Figure 23A:
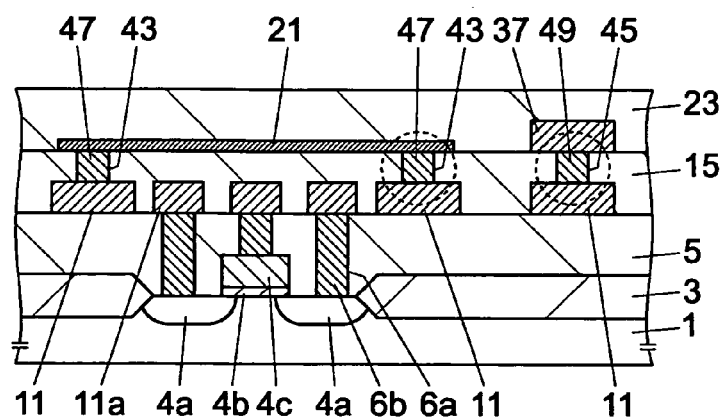
FIG. 23A is a cross-sectional view showing an embodiment of the semiconductor device according to the third aspect of the present invention.
Figure 23B:
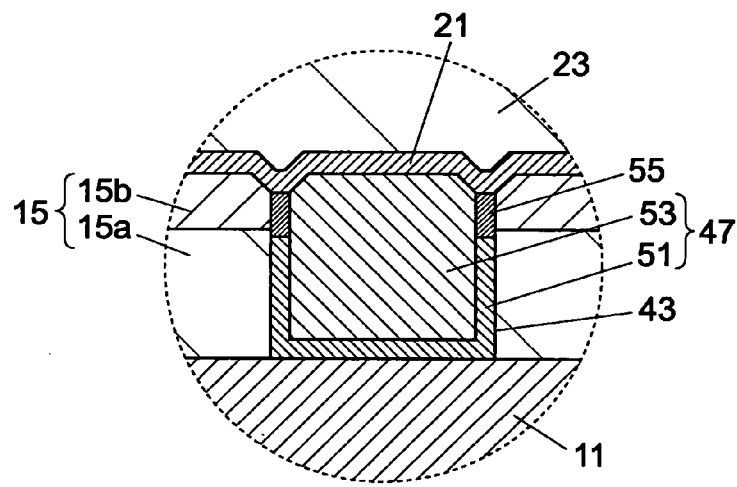
FIG. 23B is a cross-sectional view showing an expanded view of the neighborhood of the first connection hole of the semiconductor device according to the third aspect of the present invention.
Figure 23C:
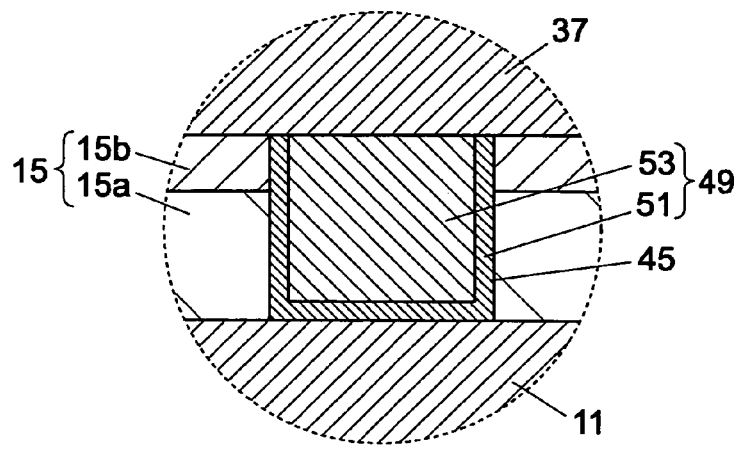
FIG. 23C is a cross-sectional view showing an expanded view of the neighborhood of the second connection hole of the semiconductor device according to the third aspect of the present invention.
Figure 24A:
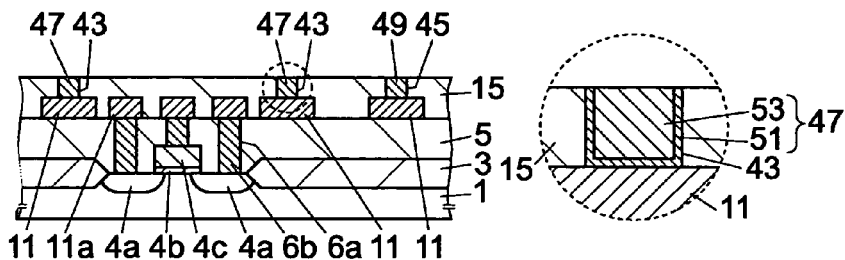
FIGS. 24A through 24E are cross-sectional views showing an example of the manufacturing method of the semiconductor device according to the embodiment.
Figure 24B:
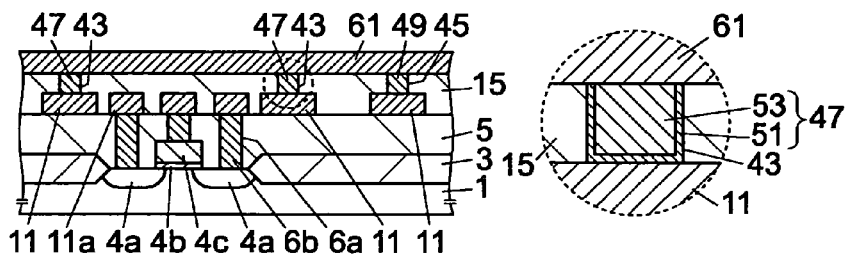
Figure 24C:
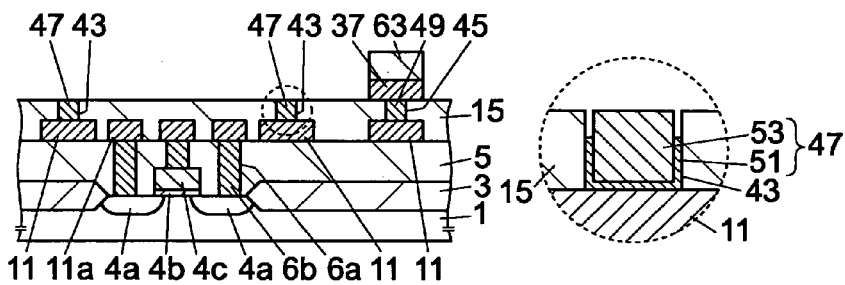
Figure 24D:
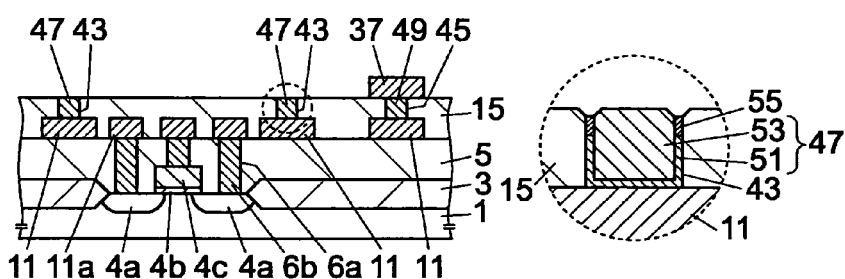
Figure 24E:
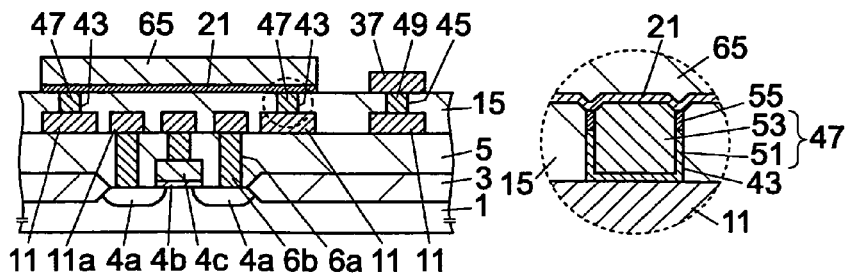

FIG. 23A is a cross-sectional view showing an embodiment of the semiconductor device according to the third aspect of the present invention. FIG. 23B is a cross-sectional view showing an expanded view of the neighborhood of the first connection hole of the semiconductor device according to the third aspect of the present invention. FIG. 23C is a cross-sectional view showing an expanded view of the neighborhood of the second connection hole of the semiconductor device according to the third aspect of the present invention. The same reference numbers are given to the portions that achieve the same functions as the embodiments already described, and detailed explanations thereof are not repeated.

The transistor constituted by the impurity diffusion layers 4a and 4a, the gate insulator layer 4b, and the gate electrode 4c, the device separating oxide film 3, the first layer insulation film 5, the contact holes 6a, the conductive plugs 6b, the first layer metal wiring patterns 11 and 11a consisting of the metal material pattern, and the high melting point metal film are formed on the silicon substrate 1. Although the first layer metal wiring patterns 11 and 11a are formed of the metal material pattern consisting of, e.g., an AlSiCu film and a high melting point metal film, for example, a TiN film, formed on the metal material pattern surface, the metal material pattern and the high melting point metal film are illustrated in one body in FIG. 23A. On the first layer insulation film 5 including the formation region of the first layer metal wiring pattern 11, the second layer insulation film 15 constituted by the plasma NSG film 15a, the SOG film, and the plasma PSG film 15b in this sequence from bottom to top is formed. In FIG. 23A, the second layer insulation film 15 is illustrated in one body, and the SOG film is not formed in the region shown in FIGS. 23B and 23C.

A first connection hole 43 and a second connection hole 45 are formed on the second layer insulation film 15 corresponding to the first layer metal wiring pattern 11. The first connection hole 43 is for electrically connecting the first layer metal wiring pattern 11 and the metal thin-film-resistor object 21 formed on the second layer insulation film 15. The second connection hole 45 is for electrically connecting the first layer metal wiring pattern 11 and the second layer metal wiring pattern formed on the second layer insulation film 15.

In the first connection hole 43, a conductive material is embedded and the first conductive plug 47 is formed. In the second connection hole 45, a conductive material is embedded and the second conductive plug 49 is formed. The first conductive plug 47 and the second conductive plug 49 are formed of, e.g., titanium, and are constituted by a barrier film metal (a first conductive material) 51 formed on the inner surface of the connection holes, and tungsten (a second conductive material) 53 formed on the barrier metal 51. In FIG. 23A, about the first conductive plug 47 and the second conductive plug 49, the barrier film metal 51 and the tungsten 53 are shown in one body.

As shown in FIG. 23B, in the first connection hole 43, the upper end of the barrier film metal 51 is formed with an interval to the upper end of the first connection hole 43, and the upper surface of the tungsten 53. The circumferential section of the upper surface of the tungsten 53 and the upper end of the first connection hole 43 is formed in the taper form (illustration is omitted in FIG. 23A). Further, the Ar sputter etching residual substance 55 (illustration is omitted in FIG. 23A) is formed in the space on the barrier film metal 51 between the inner wall of the first connection hole 43 and the tungsten 53, the Ar sputter etching residual substance 55 containing at least the materials of the second layer insulation film 15, tungsten, and Ar.

As shown in FIG. 23C, in the second connection hole 45, the upper surfaces of the barrier film metal 51, the tungsten 53, and the second layer insulation film 15 are formed at the same height, and neither taper form nor the Ar sputter etching residual substance 55 is formed as is the case with the first connection hole 43.

The CrSi thin-film-resistor object 21 is formed on the first conductive plug 47 and the second layer insulation film 15. Both ends of the CrSi thin-film-resistor object 21 are electrically connected to the first layer metal wiring pattern 11 through the first conductive plug 47. Below the CrSi thin-film-resistor object 21, the first layer metal wiring pattern 11a and the transistor are arranged through the second layer insulation film 5.

On the second conductive plug 49 and the second layer insulation film 15, the second layer metal wiring pattern 37 serving as the metal wiring pattern of the uppermost layer is formed. The second layer metal wiring pattern 37 is electrically connected to the first layer metal wiring pattern 11 through the second conductive plug 49.

The passivation film 23 is formed on the second layer insulation film 15 including the formation region of the CrSi thin-film-resistor object 21 and the second layer metal wiring pattern 37.

Since the underground insulator film 15 of the CrSi thin-film-resistor object 21 of this embodiment has the PSG film 15b as the uppermost layer as in the embodiment described with reference to FIG. 1, compared with the case where an NSG film is used as an insulator layer in contact with the undersurface of the CrSi thin-film-resistor object 21, damage to the regions adjacent to the metal thin-film-resistor object 21 by laser irradiation can be reduced.

Further, since the transistor as a component of the integrated circuit and the first layer metal wiring pattern 11a are arranged in the region under the CrSi thin-film-resistor object 21, miniaturization of the chip can be attained.

FIGS. 24A through 24E are cross-sectional views showing an example of the manufacturing method of the semiconductor device according to the embodiment, each of the drawing being associated with a cross-sectional view surrounded with a dashed line circle on the right-hand side, which is an expanded view of the corresponding first connection hole. An example of the manufacturing method of this embodiment is described with reference to these drawings and FIGS. 23A through 23C.

Process (1): Using processes that are the same as Processes (1) and (2) described with reference to FIGS. 2A and 2B, the first layer insulation film 5, the contact holes 6a, and the conductive plugs 6b are formed on the silicon substrate 1 in the shape of a wafer, to which formation of the device separating oxide film 3, the transistor constituted by the impurity diffusion layers 4a and 4a, the gate insulator layer 4b, and the gate electrode 4c, etc., has been completed. On the first layer insulation film 5, the first layer metal wiring pattern 11a consisting of the metal material pattern 7 and the high melting point metal film 9 is formed, and the second layer insulation film 15 is formed.

Using a well-known photoengraving process and a well-known dry etching process, the first connection hole 43 and the second connection hole 45 are formed in the second layer insulation film 15 corresponding to predetermined regions of the first layer metal wiring pattern 11.

The barrier film metal 51 consisting of titanium is formed in 100 nm (1000 Å) thickness on the second layer insulation film 15 including the inner wall surface of the first connection hole 43 and the second connection hole 45. Then, on the barrier film metal 51, the tungsten 53 is formed in 750 nm (7500 Å) thickness, and an etch back process or a CMP process is performed such that unnecessary portions of the tungsten 53 and the barrier film metal 51 are removed. This forms the first conductive plug 47 consisting of the barrier film metal 51 and the tungsten 53 in the first connection hole 43, and the second conductive plug 49 consisting of the barrier film metal 51 and the tungsten 53 is formed in the second connection hole 45 (refer to FIG. 24A).

Process (2): For example, using DC magnetron sputtering equipment, on the second layer insulation film 15, the metal material film of, for example, AlSiCu, is formed in an about 500 nm (5000 Å) thickness, and the high melting point metal film of TiN is formed in about 50 nm (500 Å) thickness continuously in the vacuum, and the metal film 61 for wiring is formed (refer to FIG. 24B).

Process (3): The resist pattern 63 for demarcating the formation region of the second layer metal wiring pattern is formed on the metal film 61 for wiring with a photoengraving process. Using dry etching technology, the metal film 61 for wiring is patterned such that the second layer metal wiring pattern 37 is formed with the resist pattern 63 serving as a mask (refer to FIG. 24C). When the dry etching process is carried out, the metal film 61 for wiring on the first conductive plug 47 is removed, and the upper part of the barrier film metal 51 that constitutes the first conductive plug 47 is also removed; and a hollow is formed in the circumference of the first conductive plug 47 (refer to the extended view of FIG. 24C).

Such a hollow is formed when the etching selection ratio of the metal film 61 for wiring to the tungsten 53 (the second conductive material) is great, and the etching selection ratio of the metal film 61 for wiring to the barrier film metal 51 (the first conductive material) is small. Accordingly, such a hollow is formed not only when the materials of the first conductive plug 47 and the metal film 61 for wiring are as specified in this embodiment, but a hollow can be formed where the etching selection ratio of the first conductive material constituting the first conductive plug to the metal film for the patterns for metal wiring is small, and when the etching selection ratio of the second conductive material which constitutes the second conductive plug is great.

Process (4): The Ar sputter etching process is carried out to the surface of the second layer insulation film 15 including the formation region of the first conductive plug 47 under the same conditions as the Ar sputter etching process at Process (4) described with reference to FIG. 2D after removing the resist pattern 63 (refer to FIG. 24D).

About the first connection hole 43, the perimeter section of the upper surface of the tungsten 53 and the upper end of the first connection hole 43 are formed in the taper form by the Ar sputter etching process. Further, the Ar sputter etching residual substance 55 containing at least the material of the second layer insulation film 15, tungsten, and Ar is formed in the space between the inner wall of the first connection hole 43 and the tungsten 53 on the barrier film metal 51 (refer to the extended view of FIG. 24D).

Process (5): After finishing the Ar reverse process, the CrSi thin film for the metal thin film resistor object is formed on the second layer insulation film 15 including the formation regions of the first conductive plug 47 and the second layer metal wiring pattern 37 continuously without breaking the vacuum under the same conditions as CrSi thin film formation at Process (4) described with reference to FIG. 2D. With a photoengraving process, the resist pattern 65 for demarcating the formation region of the metal thin-film-resistor object 21 is formed on the CrSi thin film. Then, using RIE equipment, the CrSi thin film is patterned with the resist pattern 65 serving as a mask, and the CrSi thin-film-resistor object 21 is formed (refer to FIG. 24E).

The step coverage of the CrSi thin film near the first connection hole 43 is improved in this way, i.e., the Ar sputter etching process is performed to the second layer insulation film 15, about the first connection hole 43, the perimeter section of the upper surface of the tungsten 53 and the upper end of the first connection hole 43 is formed in taper form, and the Ar sputter etching residual substance 55 is formed on the barrier film metal 51 in the space between the inner wall of the first connection hole 43 and the tungsten 53, before forming the CrSi thin film for the metal thin film resistor.

Further, as described with reference to FIGS. 4 through 8, the underground film dependability of the CrSi thin-film-resistor object 21 formed from the CrSi thin film at a back process is improved by performing the Ar sputter etching processing.

Process (6): The resist pattern 65 is removed. Here, since the CrSi thin-film-resistor object 21 is electrically connected to the first layer metal wiring pattern 11 through the first conductive plug 47, it is not necessary to perform a process of removing a metal oxide-film to the surface of the CrSi thin-film-resistor object 21 by hydrofluoric acid solution for obtaining an electrical connection to the upper surface of the metal thin-film-resistor object 21 as required in the conventional technology.

Then, the silicon oxide film and silicon nitride film serving as the passivation film 23 are formed one by one. This completes the manufacturing process of the semiconductor device (refer to FIGS. 23A, 23B, and 23C).

Since, as descried above, the first layer metal wiring pattern 11 and the connection holes 43 and 45 are formed, the conductive plugs 47 and 49 are formed in the first connection holes 43 and 45, the CrSi thin-film-resistor object 21 is formed, and then the electrical connection between the CrSi thin-film-resistor object 21 and the first layer metal wiring pattern 11 is formed through the first conductive plug 47, patterning by wet etching technology is not required after patterning of the CrSi thin-film-resistor object 21.

Further, since the surface of the CrSi thin-film-resistor object 21 contacting the first conductive plug 47 is not exposed to the atmosphere, even if a process of removing an oxide film is not performed and the barrier film formation for etching prevention is not performed to the CrSi thin-film-resistor object 21, stabilized and satisfactory electrical connection between the CrSi thin-film-resistor object 21 and the first conductive plug 47 is obtained.

In this way, miniaturization and resistance stability of the CrSi thin-film-resistor object 21 are realized regardless of the film thickness of the CrSi thin-film-resistor object 21 without increasing the number of processes.

Figure 41:
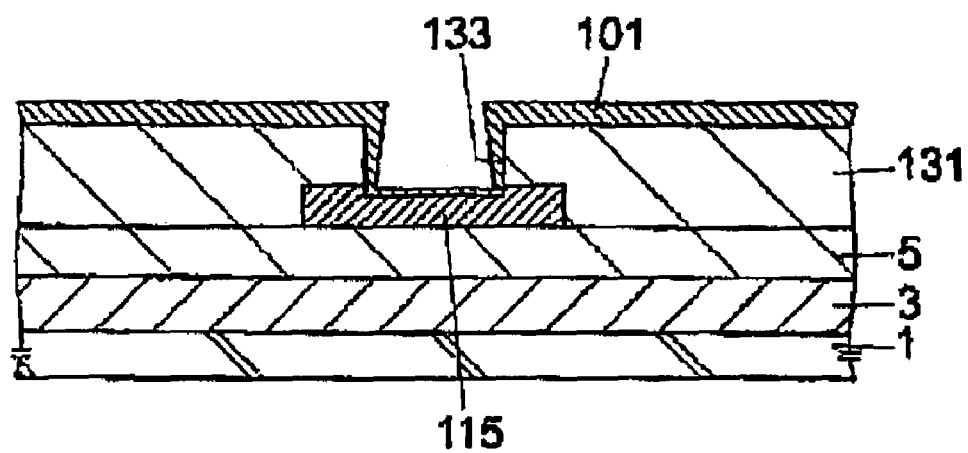
FIG. 41 is a cross-sectional view for explaining a fault with another conventional semiconductor device.
Figure 42:
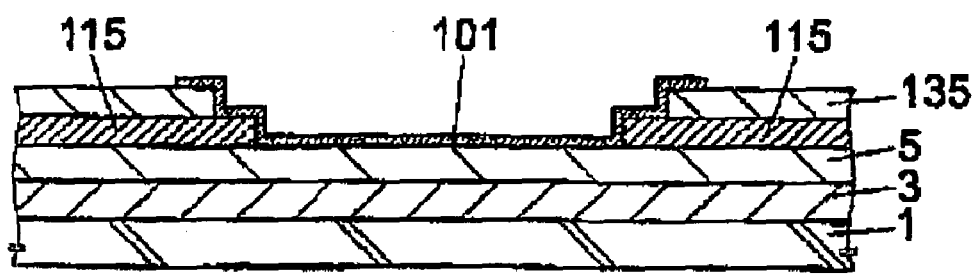
FIG. 42 is a cross-sectional view showing another conventional semiconductor device.

Further, since the CrSi thin-film-resistor object 21 is formed on the first conductive plug 47 and the second layer insulation film 15, resistance change and increase of contact resistance of the electrode of the metal thin-film-resistor object 21 due to degradation of the step coverage of the metal thin-film-resistor object 21 are not concerns, which can occur where the connection between the metal thin-film-resistor object 21 and the wiring pattern is made through the connection hole formed on the wiring pattern as described with reference to FIG. 41.

Figure 40:
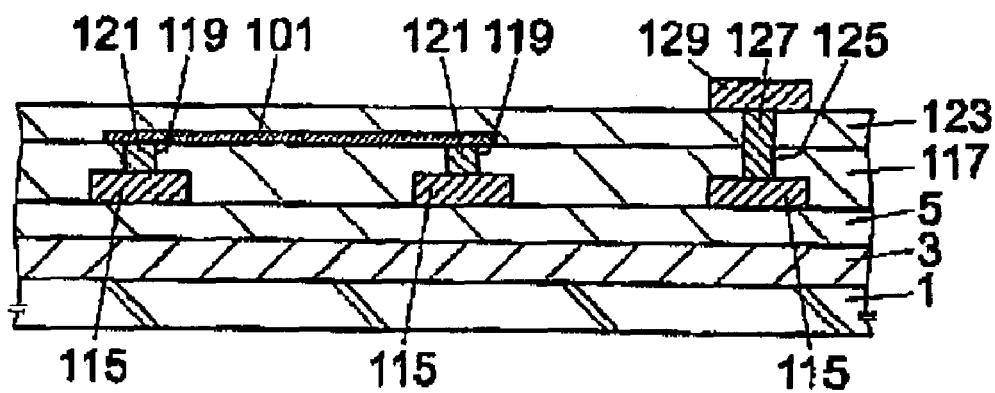
FIG. 40 a cross-sectional view for explaining a fault occurring with another conventional semiconductor device.

Further, since the second conductive plug 49 for electrically connecting the first layer metal wiring pattern 11 and the second layer metal wiring pattern 37 is formed simultaneously with the first conductive plug 47, comparing with the manufacturing process described with reference to FIG. 40, the formation process of the insulator layer 123, and the exclusive process of forming the second connection hole 125 and the second conductive plug 127 are dispensed with. That is, the CrSi thin-film-resistor object 21 can be formed by low cost and in a short time without increasing the number of the manufacturing processes.

Figure 25A:
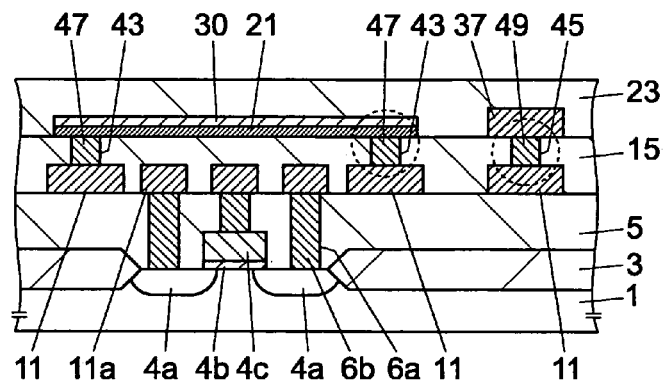
FIG. 25A is a cross-sectional view showing another embodiment of the semiconductor device according to the third aspect of the present invention.
Figure 25B:
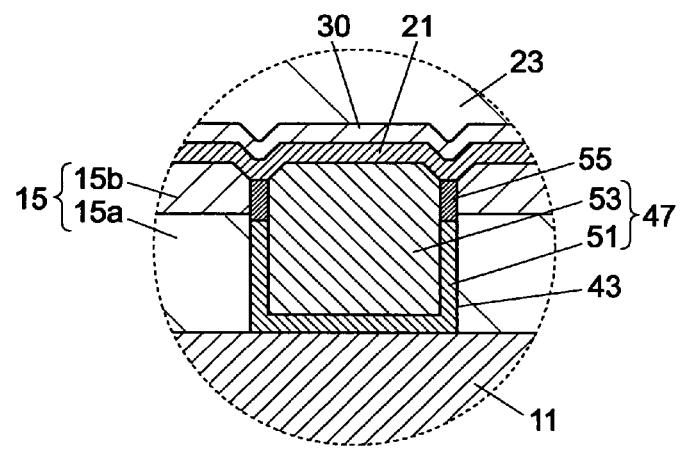
FIG. 25B is a cross-sectional view showing an expanded view of the neighborhood of the first connection hole of the semiconductor device according to the third aspect of the present invention.
Figure 25C:
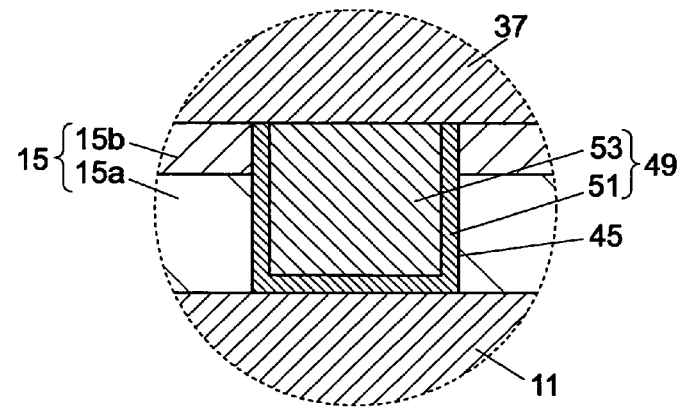
FIG. 25C is a cross-sectional view showing an expanded view of the neighborhood of the second connection hole of the semiconductor device according to the third aspect of the present invention.

FIG. 25A is a cross-sectional view showing another embodiment of the semiconductor device according to the third aspect of the present invention. FIG. 25B is a cross-sectional view showing an expanded view of the neighborhood of the first connection hole of the semiconductor device according to the third aspect of the present invention. FIG. 25C is a cross-sectional view showing an expanded view of the neighborhood of the second connection hole of the semiconductor device according to the third aspect of the present invention. The same reference numbers are given to the portions that achieve the same functions as the embodiments described above, and detailed explanations thereof are not repeated.

The present embodiment differs from the embodiment described with reference to FIGS. 23A, 23B, and 23C in that a CrSiN film 30 is formed on the upper surface of the CrSi thin-film-resistor object 21. CrSiO is not formed between the CrSi thin-film-resistor object 21 and the CrSiN film 30. The CrSiN film 30 can be formed as in the embodiment described with reference to FIGS. 10A and 10B.

Since the present embodiment also provides the CrSiN film 30 on the upper surface of the CrSi thin-film-resistor object 21, the upper surface of the CrSi thin-film-resistor object 21 is prevented from being exposed to the atmosphere, and the resistance of the CrSi thin-film-resistor object 21 is prevented from changing as in the embodiment shown in FIG. 13.

Figure 26A:
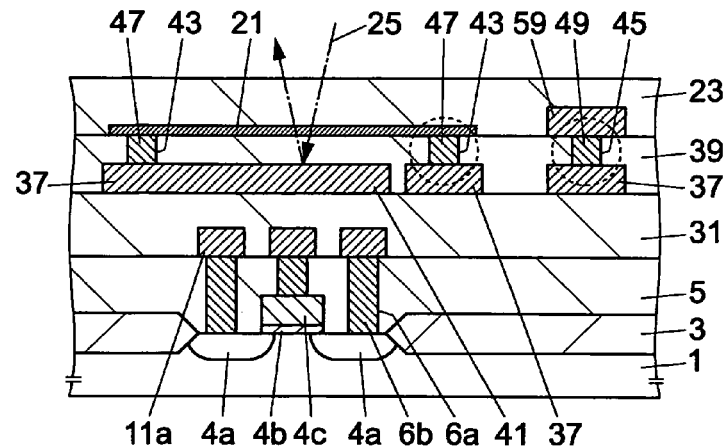
FIG. 26A is a cross-sectional view showing another embodiment of the semiconductor device according to the third aspect of the present invention.
Figure 26B:
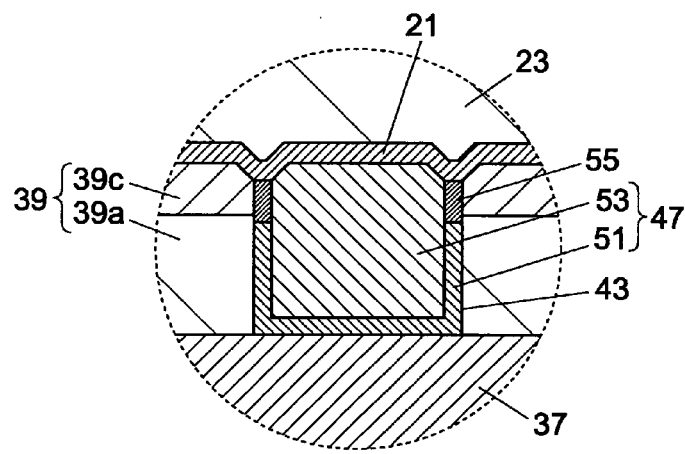
FIG. 26B is a cross-sectional view showing an expanded view of the neighborhood of the first connection hole of the semiconductor device according to the third aspect of the present invention.
Figure 26C:
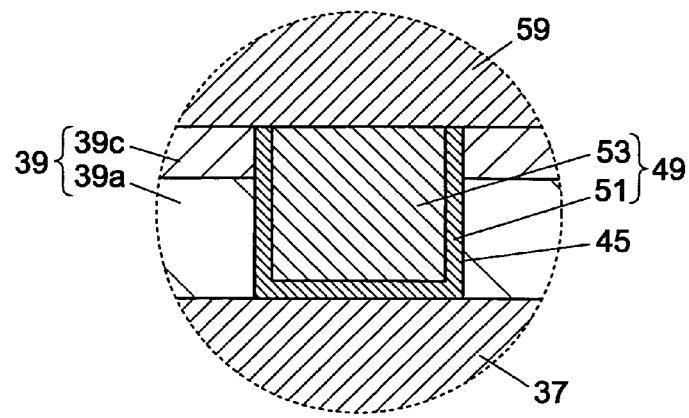
FIG. 26C is a cross-sectional view showing an expanded view of the neighborhood of the second connection hole of the semiconductor device according to the third aspect of the present invention.

FIG. 26A is a cross-sectional view showing another embodiment of the semiconductor device according to the third aspect of the present invention. FIG. 26B is a cross-sectional view showing an expanded view of the neighborhood of the first connection hole of the semiconductor device according to the third aspect of the present invention. FIG. 26C is a cross-sectional view showing an expanded view of the neighborhood of the second connection hole of the semiconductor device according to the third aspect of the present invention. The same reference numbers are given to the portions that achieve the same functions as the embodiments described above, and detailed explanations thereof are not repeated.

On the silicon substrate 1, the device separating oxide film 3, the transistor constituted by the impurity diffusion layers 4a and 4a, the gate insulator layer 4b, and the gate electrode 4c, the first layer insulation film 5, the contact holes 6a, the conductive plugs 6b, the first layer metal wiring pattern 11a that consists of the metal material pattern 7 and the high melting point metal film 9, and the second layer insulation film 31 are formed.

On the second layer insulation film 31, the second layer metal wiring pattern 37 is formed. A part of the second layer metal wiring pattern 37 is extended and formed in the region under the CrSi thin-film-resistor object 21, and the part serves as the laser-beam transparency prevention film 41. The second layer metal wiring pattern 37 and the laser-beam transparency prevention film 41 are formed with the metal material pattern consisting of, for example, an AlSiCu film, and the high melting point metal film, for example, a TiN film, formed on the surface of the metal material pattern. In FIGS. 23A, 23B, and 23C, the metal material pattern and the high melting point metal film are illustrated in one body.

The third layer insulation film 39 constituted by the plasma NSG film 39a, the SOG film, and the plasma PSG film 39c in this sequence from bottom to top is formed on the second layer insulation film 31 including the formation regions of the second layer metal wiring pattern 37 and the laser-beam transparency prevention film 41. In FIG. 26A, the third layer insulation film 39 is illustrated in one body, and the SOG film is not formed in the region shown in FIGS. 26B and 26C.

To the third layer insulation film 39 corresponding to the second layer metal wiring pattern 37, the first connection hole 43 for electrically connecting the second layer metal wiring pattern 37 and the CrSi thin-film-resistor object 21, and the second connection hole 45 for electrically connecting the second layer metal wiring pattern 37 and the third layer metal wiring pattern 59 are formed. The first conductive plug 47 consisting of the barrier film metal 51 and the tungsten 53 is formed in the first connection hole 43, and the second conductive plug 49 consisting of the barrier film metal 51 and the tungsten 53 is formed in the second connection hole 45.

As shown in FIG. 26B, at the hole 43, the upper end of the barrier film metal 51 is formed with an interval to the upper end of the first connection hole 43, and the upper surface of the tungsten 53. The perimeter section of the upper surface of the tungsten 53 and the upper end of the first connection hole 43 are formed in taper form (illustration is omitted in FIG. 26A). Further, the Ar sputter etching residual substance 55 (illustration is omitted in FIG. 26A) containing at least the material of the third layer insulation film 39, tungsten, and Ar is formed on the barrier film metal 51 in the space between the inner wall of the first connection hole 43 and the tungsten 53.

As shown in FIG. 26C, at the second connection hole 45, the upper surfaces of the barrier film metal 51, the tungsten 53, and the second layer insulation film 15 are formed in the same height, and neither the taper form nor the Ar sputter etching residual substance 55 is formed, being different from the first connection hole 43.

The CrSi thin-film-resistor object 21 is formed on the first conductive plug 47 and the third layer insulation film 39. Both ends of the CrSi thin-film-resistor object 21 are electrically connected to the second layer metal wiring pattern 37 through the first conductive plug 47. Under the CrSi thin-film-resistor object 21, the laser-beam transparency prevention film 41 is arranged through the second layer insulation film 15. Further, the first layer metal wiring pattern 11a and the transistor are further arranged under the laser-beam transparency prevention film 41.

On the second conductive plug 49 and the third layer insulation film 39, the third layer metal wiring pattern 59 serving as the metal wiring pattern of the uppermost layer is formed. The third layer metal wiring pattern 59 is electrically connected to the second layer metal wiring pattern 37 through the second conductive plug 49.

The passivation film 23 is formed on the third layer insulation film 39 including the formation regions of the CrSi thin-film-resistor object 21 and the third layer metal wiring pattern 59.

Since, according to the present embodiment, the underground insulator film 39 of the CrSi thin-film-resistor object 21 has the PSG film 39c in the uppermost layer as in the embodiment described with reference to FIG. 1, compared with the case where an NSG film is used as an insulator layer in contact with the undersurface of the CrSi thin-film-resistor object 21, damage to the regions adjacent to the metal thin-film-resistor object 21 by laser irradiation can be reduced.

Further, since the transistor as a component of the integrated circuit and the first layer metal wiring pattern 11a are arranged in the region under the CrSi thin-film-resistor object 21, miniaturization of the chip can be attained.

Further, since the laser-beam transparency prevention film 41 consisting of metal material is arranged between the third layer insulation film 39 and the first layer metal wiring pattern 11a, the transistor, and the silicon substrate 1 in the region under the CrSi thin-film-resistor object 21, even if the CrSi thin-film-resistor object 21 is irradiated by the laser beam 25 of sufficient intensity to cut or modify during the laser trimming process performed to the CrSi thin-film-resistor object 21, as in the embodiment described with reference to FIG. 15, the laser beam 25 is prevented from irradiating the first layer metal wiring pattern 11a, the transistor and the silicon substrate 1.

An example of the manufacturing method of this embodiment is briefly described. The process down to the formation of the third layer insulation film 39 is the same as the example of the manufacturing method described with reference to FIG. 15. Then, performing the same process as the example of the manufacturing method described with reference to FIGS. 24A through 24E, the first connection hole 43 and the second connection hole 45 are formed to the third layer insulation film 39. Then, the first conductive plug 47 and the second conductive plug 49 are formed, the third layer metal wiring pattern 59 is formed, the Ar sputter etching process is performed, the CrSi thin-film-resistor object 21 is formed, and finally, the passivation film 23 is formed.

Thus, according to the present embodiment also, the effects described above are obtained. Namely, the effect by not patterning by wet etching technology after patterning the CrSi thin-film-resistor object 21, the effect of the contact surface between the metal wiring pattern 37 and the CrSi thin-film-resistor object 21 not being exposed to the atmosphere, the effect of the high melting point metal film 35 serving as the barrier film between the CrSi thin-film-resistor object 21 and the metal material pattern 33, and the effect of performing the Ar sputter etching process to the third layer insulation film 39 serving as the underground film before forming the CrSi thin film for CrSi thin-film-resistor object 21.

Further, as in the embodiment described with reference to FIGS. 23A, 23B, and 23C, since the CrSi thin-film-resistor object 21 is formed on the first conductive plug 47 and the second layer insulation film 15, resistance change of the metal thin-film-resistor object 21 by degradation of the step coverage of the metal thin-film-resistor object 21 and increase of contact resistance with an electrode are prevented from occurring.

Further, since the first conductive plug 47 and the second conductive plug 49 are simultaneously formed, the CrSi thin-film-resistor object 21 can be formed for low cost and in a short time without increasing the number of manufacturing processes.

Figure 27A:
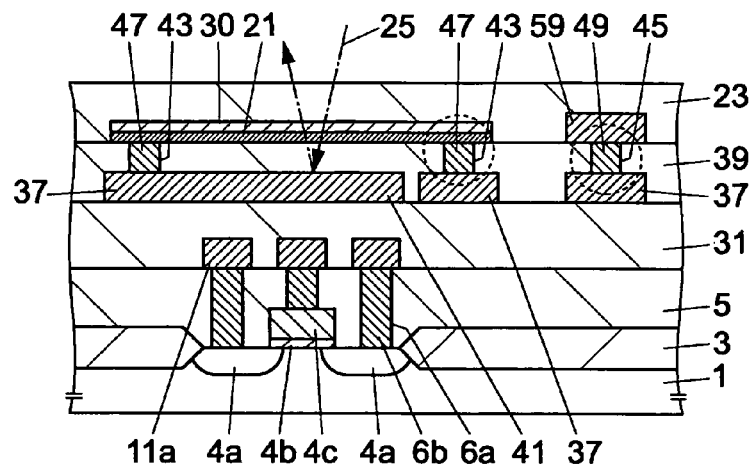
FIG. 27A is a cross-sectional view showing another embodiment of the semiconductor device according to the third aspect of the present invention.
Figure 27B:
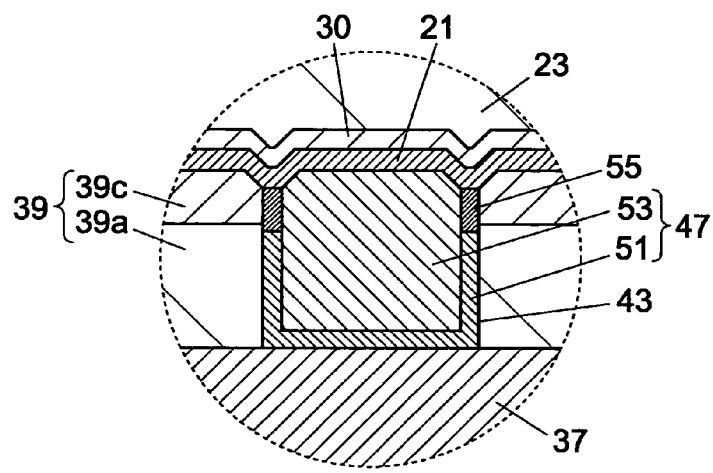
FIG. 27B is a cross-sectional view showing an expanded view of the neighborhood of the first connection hole of the semiconductor device according to the third aspect of the present invention.
Figure 27C:
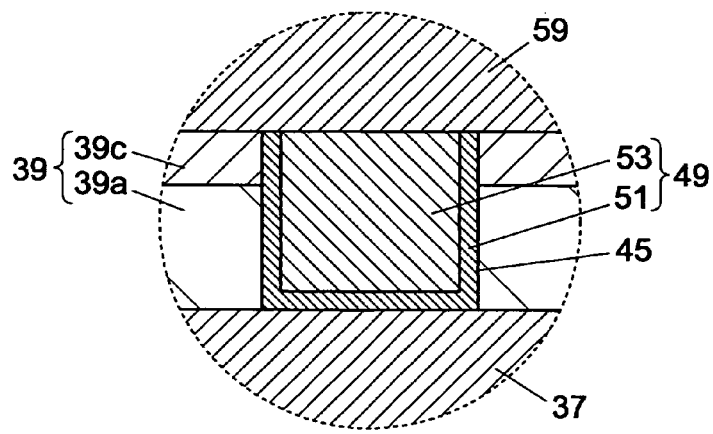
FIG. 27C is a cross-sectional view showing an expanded view of the neighborhood of the second connection hole of the semiconductor device according to the third aspect of the present invention.

Further, as shown in FIGS. 27A, and 27B, the CrSiN film 30 may formed on the upper surface of the CrSi thin-film-resistor object 21 as in the embodiment described with reference to FIG. 13B. Between the CrSi thin-film-resistor object 21 and the CrSiN film 30, CrSiO is not formed in this embodiment. In the embodiment shown in FIGS. 27A, 27B, and 27C, the CrSiN film 30 can be formed as in the manufacturing method described with reference to FIG. 13.

Figure 28A:
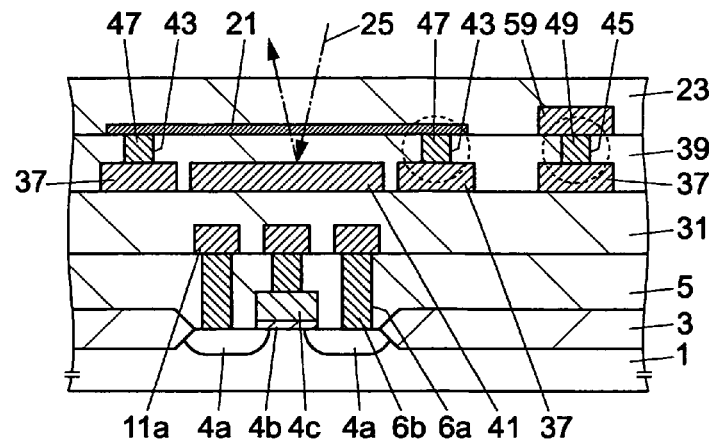
FIG. 28A is a cross-sectional view showing another embodiment of the semiconductor device according to the third aspect of the present invention.
Figure 28B:
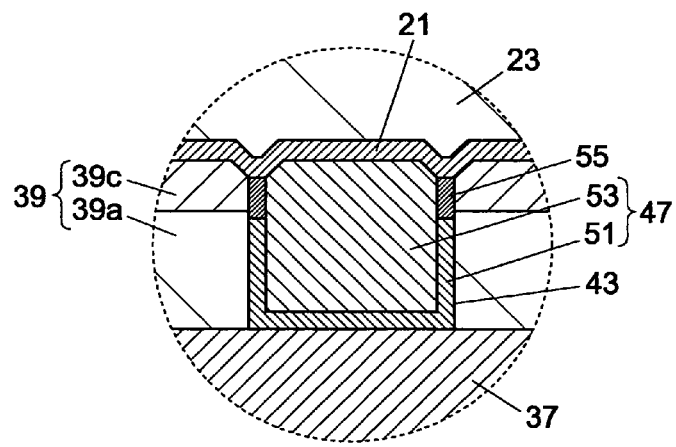
FIG. 28B is a cross-sectional view showing an expanded view of the neighborhood of the first connection hole of the semiconductor device according to the third aspect of the present invention.
Figure 28C:
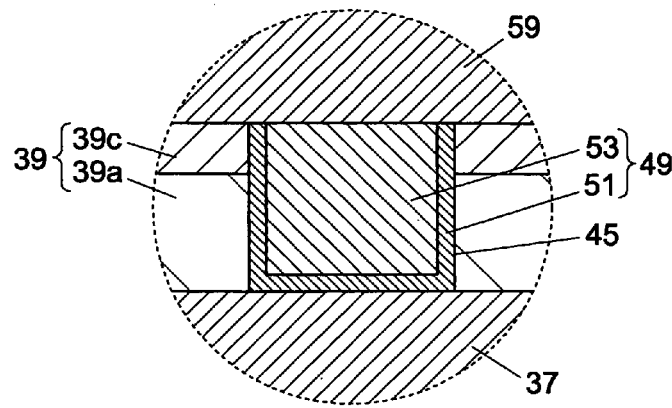
FIG. 28C is a cross-sectional view showing an expanded view of the neighborhood of the second connection hole of the semiconductor device according to the third aspect of the present invention.

Further, as shown in FIG. 28A, as in the embodiment described with reference to FIG. 17A, the laser-beam transparency prevention film 41 may be formed separated from the second layer metal wiring pattern 37.

Figure 29A:
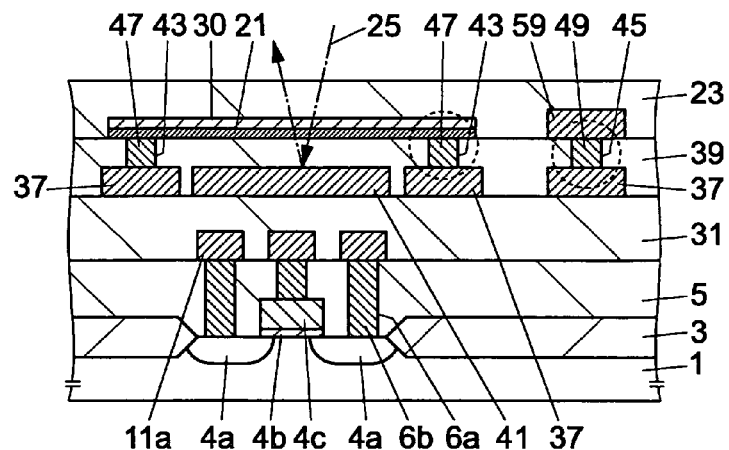
FIG. 29A is a cross-sectional view showing another embodiment of the semiconductor device according to the third aspect of the present invention.
Figure 29B:
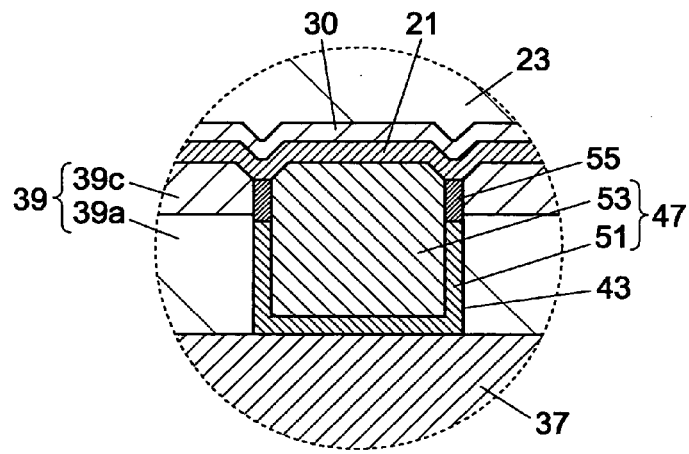
FIG. 29B is a cross-sectional view showing an expanded view of the neighborhood of the first connection hole of the semiconductor device according to the third aspect of the present invention.
Figure 29C:
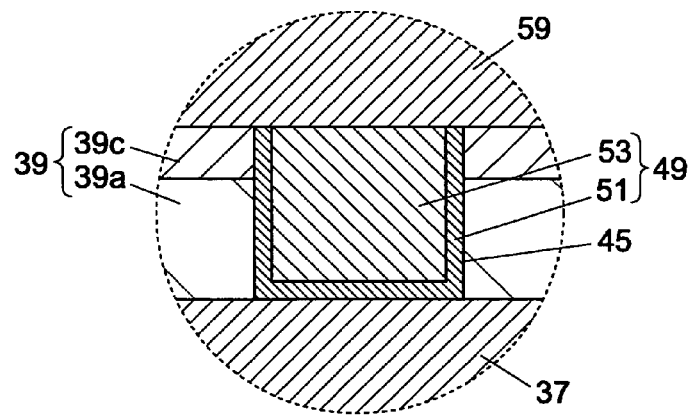
FIG. 29C is a cross-sectional view showing an expanded view of the neighborhood of the second connection hole of the semiconductor device according to the third aspect of the present invention.

Further, as shown in FIGS. 29A, and 29B, the CrSiN film 30 may formed on the upper surface of the CrSi thin-film-resistor object 21 as in the embodiment described with reference to FIGS. 13A, and 13B.

In these cases, the same effects as the embodiment described with reference to FIGS. 25A, 25B, and 25C can be acquired.

Further, although the laser-beam transparency prevention film 41 is formed of the same material as the second layer metal wiring pattern 37 to which the CrSi thin-film-resistor object 21 is electrically connected in the embodiments described with reference to FIGS. 25A, 25B, 25C, through 29A, 29B, and 29C, the semiconductor device of the third aspect of the present invention is not limited to this. The laser-beam transparency prevention film 41 may be formed of a metal material different from the second layer metal wiring pattern 37, and formed separately from the second layer metal wiring pattern 37.

Further, although both the laser-beam transparency prevention film 41 and the second layer metal wiring patterns 37 that is electrically connected to the CrSi thin-film-resistor object 21 are formed above the first layer insulation film 5 according to the embodiment, the laser-beam transparency prevention film and the metal wiring pattern that is electrically connected to the metal thin-film-resistor object 21 may be formed on mutually different insulator layers.

Further, the transistor below the CrSi thin-film-resistor object 21 of the embodiments described with reference to FIGS. 23A, 25A through 29A may be replaced with the capacitor as shown in FIG. 10A, the polysilicon wiring pattern 28 shown in FIG. 11A, and the impurity diffusion layer 29 shown in FIG. 12A.

Further, the embodiments described with reference to Figs. FIGS. 23A, 23B, 23C, 25A, 25B, 25C through 29A, 29B, and 29C, the first conductive plug 47 and the second conductive plug 49 are formed of the barrier film metal 51 consisting of titanium and the tungsten 53; however, the present invention is not limited to this. For example, TiW, TiN, W, and WSi can be used as the first conductive material (barrier film metal); and Cu, aluminum, WSi, etc., can be used as the second conductive material. Nevertheless, the first conductive material and the second conductive material are not limited to the materials mentioned here.

Further, according to the embodiments described with reference to FIGS. 23A, 25A through 29A, at the first connection hole 43, the upper end of the barrier film metal 51 is formed with an interval to the upper end of the first connection hole 43, and the upper surface of the tungsten 53; and the upper end of the first connection hole 43 and the upper surface of the tungsten 53 are formed in taper form and the Ar sputter etching residual substance 55 is formed thereto. However, the third aspect of the present invention is not limited to this, but may be implemented with a different structure near the first connection hole 43.

For example, if the Ar sputter etching process is not performed before forming the CrSi thin film for CrSi thin-film-resistor object 21, the perimeter section of the upper surface of the tungsten 53 and the upper end of the first connection hole 43 are not formed in taper form and the Ar sputter etching residual substance 55 is not formed, either. The semiconductor device of the present invention may take this structure.

Further, in the example of the manufacturing method described with reference to FIGS. 24A through 24E, the CrSi thin-film-resistor object 21 is formed after forming the second layer metal wiring pattern 37 (refer to Processes (2) and (3)); nevertheless, the second layer metal wiring pattern 37 may be formed after forming the CrSi thin-film-resistor object 21 (refer to Process (4)). In this case, at the first connection hole 43, the upper end of the barrier film metal 51 is not removed, and the upper surface of the first conductive plug 47 can be formed flat. In addition, even if the Ar sputter etching process is performed just before formation of the CrSi thin film for CrSi thin-film-resistor object 21, the taper form and the Ar sputter etching residual substance 55 of are not formed at the perimeter section of the upper surface of the tungsten 53 and the upper end of the first connection hole 43.

However, in order not to etch the CrSi thin-film-resistor object 21 when forming the second layer metal wiring pattern 37 after formation of the CrSi thin-film-resistor object 21, it is desirable that the insulator layer for protection be formed on the upper surface of the CrSi thin-film-resistor object 21. The insulator layer for protection can be served by, e.g., the CrSiN film 30 shown in FIGS. 13A and 13B, a silicon nitride film formed with well-known technology, and a laminating film of the silicon nitride and the CrSiN film 30.

In the above, the embodiments of the first, the second, and the third aspects of the present invention are described. Although the described embodiments use the TiN film as the high melting point metal films 9, 33, and 57 formed on the upper surface of the metal wiring pattern, the high melting point metal film that constitutes the metal wiring pattern is not limited to this, but other high melting point metal such as TiW, and WSi may used.

Further, the embodiments described with reference to FIGS. 1A through 29A use CrSi as the material of the metal thin-film-resistor object 21; nevertheless, the present invention is not limited to this, and other materials, e.g., NiCr, TaN, CrSi$_2$, CrSiN, CrSi, and CrSiO may be used as the material of the metal thin-film-resistor object 21.

Further, although the embodiments of the present invention are applied to the semiconductor device equipped with the metal wiring pattern of one layer, two layers, or three layers, the present invention is not limited to this, but the present invention can also be applied to a semiconductor device of a multilevel-metal wiring structure equipped with the metal wiring pattern of four or more layers. In this case, a metal wiring pattern of any layer can be used for electrical connection of the metal thin-film-resistor object 21.

Further, the laser-beam transparency prevention film arranged below the metal thin-film-resistor object 21 may be formed simultaneously with the metal wiring pattern of any layer as long as the laser-beam transparency prevention film arranged is formed in an region below the metal thin-film-resistor object 21. Further, the laser-beam transparency prevention film may be constituted by a metal material that is separately formed from the metal wiring pattern.

Further, the metal wiring pattern of the uppermost layer to which the CrSi thin-film-resistor object 21 is electrically connected is the first layer metal wiring pattern 11, the second layer metal wiring pattern 37, and the third layer metal wiring pattern 59 for the embodiments according to the first aspect, the second aspect, and the third aspect, respectively.

In the embodiment of the third aspect, the second layer metal wiring patterns 37 or the third layer metal wiring patterns 59 that is on the upper side by one layer of the metal wiring pattern to which the CrSi thin-film-resistor object 21 is electrically connected is made into the metal wiring pattern of the uppermost layer.

In this way, the flexibility of a design is enhanced, for example, layout change of the CrSi thin-film-resistor object 21 is realizable by layout change of the CrSi thin-film-resistor object 21 and the metal wiring pattern of the uppermost layer.

Further, since the passivation film 23 of an insulating material is formed on the CrSi thin-film-resistor object 21 except for the thin CrSiN film 30 that is thin, the insulating material on the CrSi thin-film-resistor object 21 can be made thin, and thickness variation of which can be made small, compared with the case where an insulator layer other than the final protective coat is formed on the upper layer of the metal thin-film-resistor object 21. In this way, when a laser beam is irradiated to the CrSi thin-film-resistor object 21 for performing a trimming process, variation in the laser energy provided to the CrSi thin-film-resistor object 21 due to interference of the laser in the insulating material on the CrSi thin-film-resistor object 21 is made small, and accuracy of trimming can be raised. Further, heat dissipation capacity can be raised to the temperature rise of the CrSi thin-film-resistor object 21 resulting from the laser irradiation at the time of the trimming process, and the like.

Further, although the metal wiring patterns 11, 37, and 59 according to the embodiments, are constituted by a metal material pattern on which a high melting point metal film is formed is used, the present invention is not limited to this, but a metal material pattern with no high melting point metal film being formed on the upper surface of the a metal wiring pattern may serve. In this case, since a solid natural oxide film is formed on the metal material pattern surface when, for example, aluminum system alloy is used as the metal material pattern, it is desirable to perform a process of removing the natural oxide film on the metal material pattern surface at the bottom of the connection hole after formation of the connection hole and before forming the metal thin film for the metal thin film resistor object. The natural oxide film removing process may also serve as the Ar sputter etching process that is performed aiming at reducing temporal change of the resistance of the metal thin-film-resistor object 21. Further, the metal wiring pattern is not limited to what contains aluminum system alloy, but the metal wiring pattern may be constituted by other metal material, such as Cu wiring formed by the so-called damascene method.

Further, although components of the integrated circuit such as a transistor, a capacitor, a metal wiring pattern, a polysilicon wiring pattern, and an impurity diffusion layer are arranged in the region under the metal thin-film-resistor object 21 according to the embodiments, the structure of the semiconductor device of the present invention is not limited to this, but may contain no components such as above in the region under the metal thin-film-resistor object 21.

Further, although, in the embodiments, the PSG film is used as the film of the uppermost layer of the underground insulator film that contacts the undersurface of the metal thin-film-resistor object 21, the PSG film may be replaced with a BPSG film. As for the film of the uppermost layer of the underground insulator film in contact with the undersurface of the metal thin-film-resistor object 21, an example of phosphor impurity concentration of the PSG film is 3.7% of the weight; an example of the phosphor impurity concentration of the BPSG film is 4.5% of the weight, and an example of the boron impurity concentration of the BPSG film is 3.7% of the weight. Further, although the laminating film is used as the underground insulator film in the embodiments, the underground insulator film may be constituted by a single layer of a PSG film or a BPSG film.

The metal thin-film-resistor object 21 that constitutes the semiconductor device of the present invention is applicable to a semiconductor device that includes an analog circuit. An embodiment of a semiconductor device including the analog circuit equipped with the metal thin-film-resistor object 21 of the present invention is described below.

Figure 30:
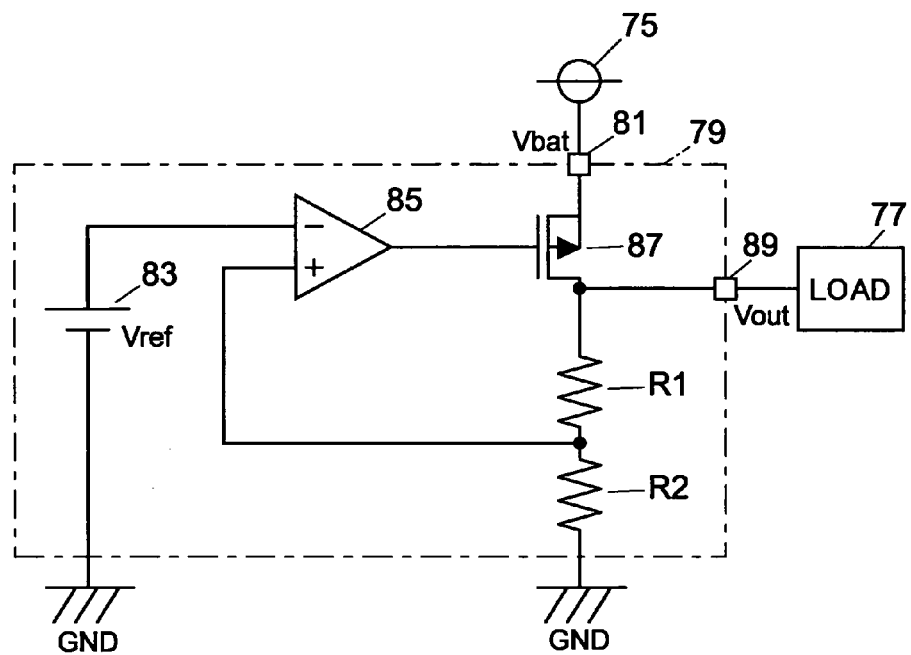
FIG. 30 is a circuit diagram of an embodiment of the semiconductor device including a constant voltage generating circuit, which is an analog circuit.

FIG. 30 is a circuit diagram showing the embodiment of the semiconductor device equipped with a constant voltage generating circuit 79, which is an analog circuit.

The constant voltage generating circuit 79 is for taking in power supplied from a DC power supply 75, stabilizing, and outputting the stabilized power to a load 77. The constant voltage generating circuit 79 includes an input terminal (Vbat) 81 where the DC power supply 75 is connected, a reference voltage generating circuit (Vref) 83, an operational amplifier (comparator circuit) 85, a P channel MOS transistor (PMOS) 87 that constitutes an output driver, division resistors R1 and R2, and an output terminal (Vout) 89.

As for the operational amplifier 85 of the constant voltage generating circuit 79, an output terminal of the operational amplifier 85 is connected to the gate electrode of the PMOS 87, a reference voltage Vref is applied to a reversed input terminal (−) of the operational amplifier 85 from the reference-voltage generating circuit 83, and a divided voltage is applied to a non-reversed input terminal (+) of the operational amplifier 85, the divided voltage being a part of the output voltage Vout, divided by the resistors R1 and R2, wherein it is controlled such that the divided voltage become equal to the reference voltage Vref.

Figure 31:
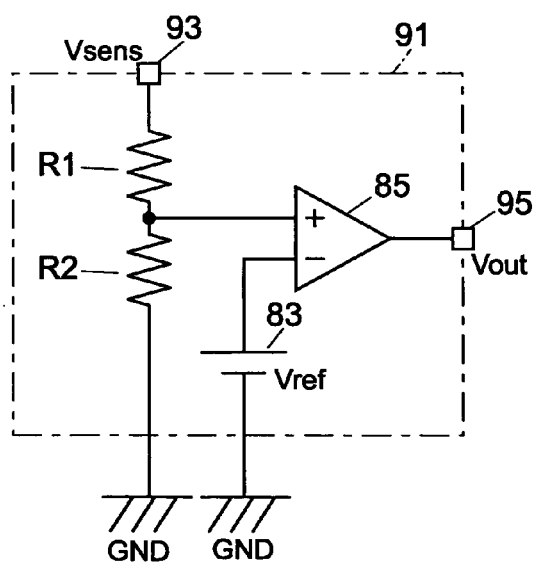
FIG. 31 is a circuit diagram of an embodiment of the semiconductor device including a voltage detector, which is an analog circuit.

FIG. 31 is a circuit diagram of another embodiment of the semiconductor device equipped with a voltage detector 91, which is an analog circuit.

The voltage detector 91 includes the operational amplifier 85, to the reversed input terminal (−) of which the reference voltage generating circuit 83 is connected, and the reference voltage Vref is provided. A voltage to be detected is provided to an input terminal (Vsens) 93, and is divided by the division resistors R1 and R2. The divided portion of the voltage is input to the non-reversed input terminal (+) of the operational amplifier 85. The output of the operational amplifier 85 is provided to an external load through an output terminal (Vout) 95.

According to the voltage detector 91, if the voltage to be detected is high, and the voltage divided by the division resistors R1 and R2 is higher than the reference voltage Vref, the output of the operational amplifier 85 stays at H level. If the voltage to be detected is low, and the divided voltage by the division resistors R1 and R2 turns into below the reference voltage Vref, the output of the operational amplifier 85 is set to L level.

Generally, in the constant voltage generating circuit and the voltage detector as shown in FIGS. 30, and 31, respectively, the reference voltage Vref provided by the reference-voltage generating circuit is subject to fluctuation due to variation in the manufacture process; and in order to cope with the fluctuation, resistance of the dividing resistors of a division resistance circuit is adjusted by cutting a fuse element, or alternatively by irradiating a laser beam.

Figure 32:
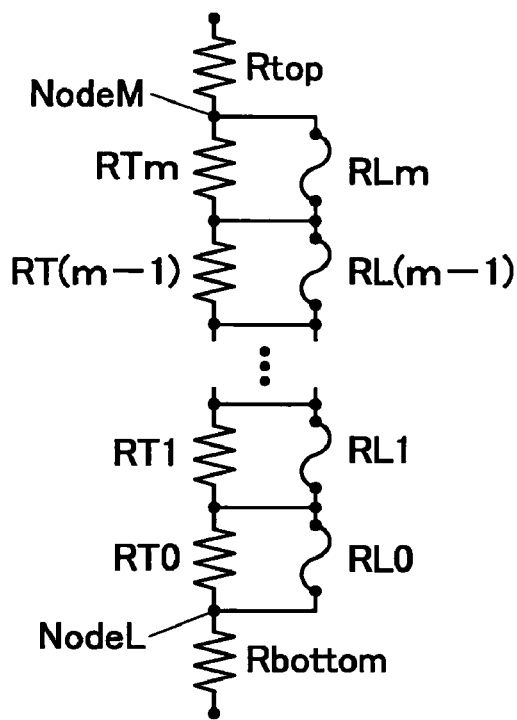
FIG. 32 is a circuit diagram of an embodiment of the semiconductor device including a division resistance circuit, which is an analog circuit.

FIG. 32 is a circuit diagram showing an example of the division resistance circuit where the metal thin-film-resistor object 21 of the present invention is applied.

Figure 33:
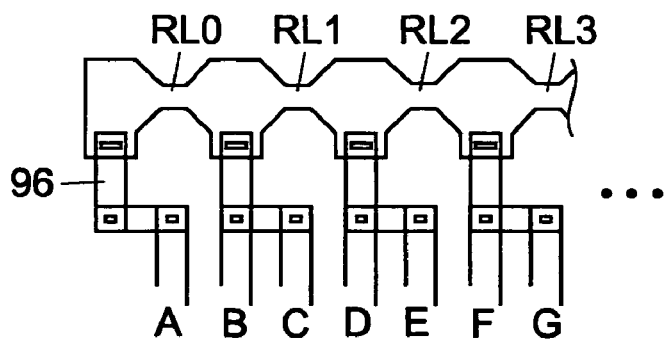
FIG. 33 is a plan view showing an example of a layout of the fuse element portion of the division resistance circuit.
Figure 34:
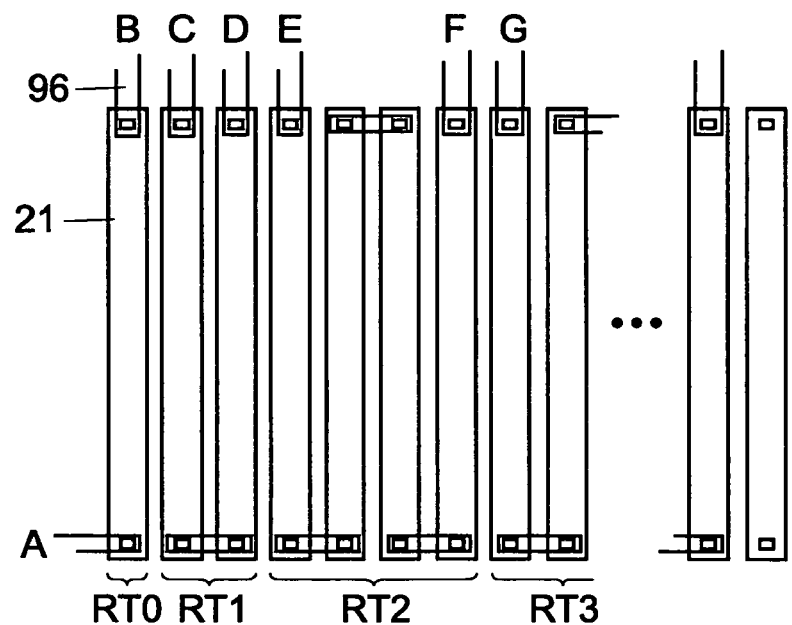
FIG. 34 is a plan view showing an example of a layout of the metal thin-film-resistor object portion of the division resistance circuit.

FIG. 33 and FIG. 34 are plan views showing a layout example of the division resistance circuit, wherein FIG. 33 shows the layout example of a fuse element portion, and FIG. 34 shows a layout example of a resistor portion.

As shown in FIG. 32, the division resistance circuit includes a resistor Rbottom, m+1 resistors (m is a positive integer) RT0, RT1, through RTm, and a resistor Rtop, which are connected in series. Fuse elements RL0, RL1, through RLm are connected to the resistors RT0, RT1, through RTm, respectively, in parallel.

As shown in FIG. 33, the fuse elements RL0, RL1, through RLm are formed with a polysilicon pattern, for example, whose sheet resistance is between 20 Ω and 40 Ω.

Values of the resistors RL0, RL1, through RLm are set up so that the values sequentially increase in a binary fashion from the resistor Rbottom side. That is, the resistance of the resistor RLn is set to 2n times the resistance of the resistor RL0.

An example of the structure is as shown in FIG. 34, wherein the CrSi thin-film-resistor objects 21 are used, one CrSi thin-film-resistor object 21 serving as the resistor RT0 as unit resistance, and the $2^n$ CrSi thin-film-resistor objects 21 constituting the resistor RTn. As the CrSi thin-film-resistor object 21, the CrSi thin-film-resistor object 21 described in the embodiments above can be used, for example. In addition, although FIG. 34 illustrated connection holes, the connection holes can be dispensed with if the CrSi thin-film-resistor object 21 of the present invention is used, wherein electrical connection to the metal wiring pattern is obtained without using a connection hole. Further, the uppermost layer of the underground insulator film of the CrSi thin-film-resistor object 21 is a PSG film or a BPSG film.

With reference to FIG. 33 and FIG. 34, electrical connections are made between A-A, between B-B, and between C-C, between D-D, between E-E, between F-F, and between G-G by corresponding metal wiring patterns 96.

As described above, the division resistance circuit where the precision of the ratio of the resistors is important, unit resistors, each consisting of a resistor and fuse element, are arranged in series in the shape of a ladder in order obtain precision in the manufacturing process.

With the structure as described above, a desired series resistance value can be acquired by cutting appropriate fuse elements RL0, RL1, through RLm by the laser beam.

With the semiconductor device of the present invention, since at least the PSG film or the BPSG film serves as the uppermost layer of the underground insulator film of the metal thin-film-resistor object 21, damage to the regions adjacent to the metal thin-film-resistor object 21 by laser irradiation can be reduced, and the precision of the output voltage of the division resistance circuit shown in FIG. 32 can be raised.

When applying the division resistance circuit shown in FIG. 32 to the division resistors R1 and R2 of the constant voltage generating circuit 79 shown in FIG. 30, for example, the bottom end of the resistor Rbottom is grounded, and the top end of the resistor Rtop is connected to the drain of PMOS 87. Further, a terminal Node L between the resistor Rbottom and RT0, or a terminal Node M between the resistors Rtop and RTm is connected to the reversed input terminal of the operational amplifier 85.

Since the precision of the output voltage of the division resistance circuit can be raised according to the present invention, the stability of the output voltage of the constant voltage generating circuit 79 can be raised.

Further, when applying the division resistance circuit shown in FIG. 32 to the division resistors R1 and R2 of the voltage detector 91 shown in FIG. 31, the bottom end of the resistor Rbottom is grounded and the top end of the resistor Rtop edge is connected to the input terminal 93. Further, the terminal Node L between the resistor Rbottom and RT0, or the terminal Node M between the resistors Rtop and RTm is connected to the non-reversed input terminal of the operational amplifier 85.

Since the precision of the output voltage of the division resistance circuit is raised according to the present invention, the detection precision of the voltage detector 91 can be raised.

Figure 35:
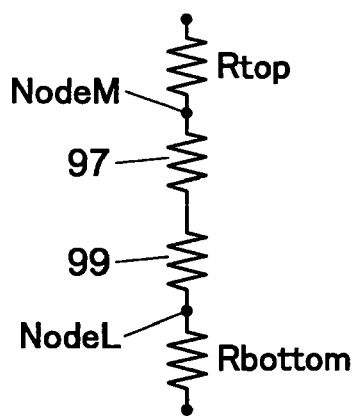
FIG. 35 is a circuit diagram showing another embodiment of the semiconductor device including the division resistance circuit, which is an analog circuit.
Figure 36:
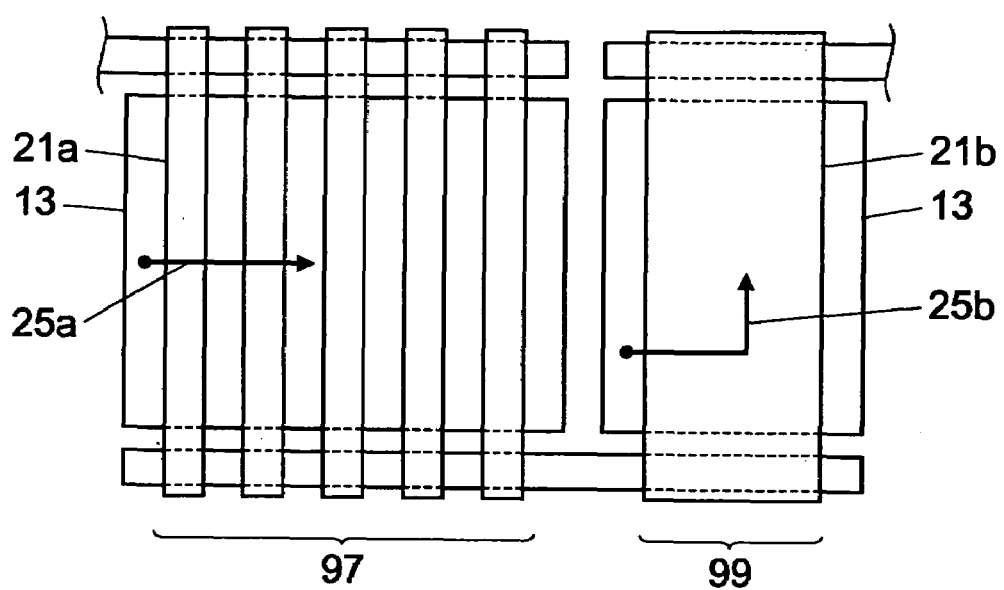
FIG. 36 is a plan view showing an example of a layout of resistors for rough tuning and fine tuning of the division resistance circuit.
Figure 37:
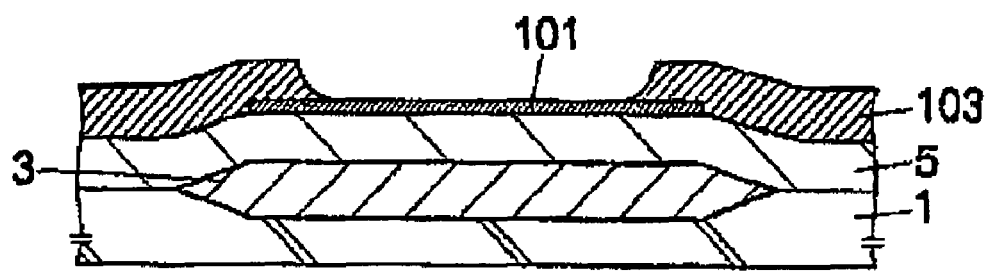
FIG. 37 is a cross-sectional view showing a conventional semiconductor device.
Figure 38:
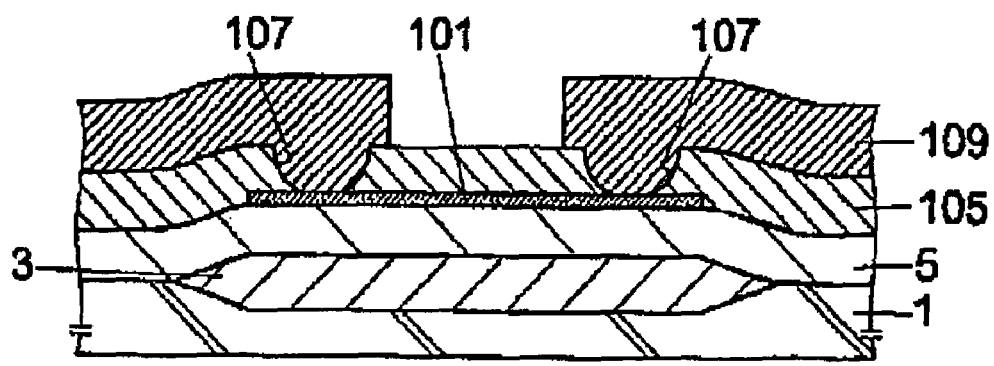
FIG. 38 is a cross-sectional view showing another conventional semiconductor device.
Figure 39:
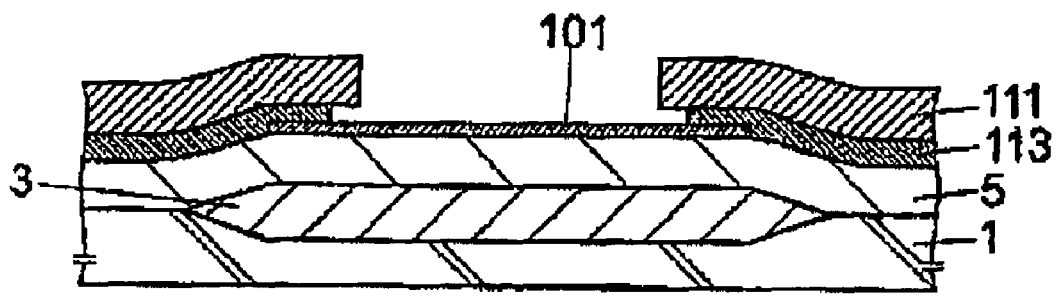
FIG. 39 is a cross-sectional view showing another conventional semiconductor device.

FIG. 35 is a circuit diagram showing another example of the division resistance circuit to which the metal thin-film-resistor object 21 of the present invention is applied. FIG. 36 is a plan view showing a layout example of a resistor for rough adjustment 97 and a resistor for fine tuning 99 in the division resistance circuit.

As shown in FIG. 35, the resistor Rbottom, the resistor for rough adjustment 97, the resistor for fine tuning 99, and the resistor Rtop are connected in series.

As shown in FIG. 36, the resistor for rough adjustment 97 is constituted by metal thin-film-resistor objects 21a shaped like a belt connected in parallel. The resistor for fine tuning 99 is constituted by a metal thin-film-resistor object 21b shaped like a board. The laser-beam transparency prevention film 41 is arranged through an insulator layer (illustration is omitted) under the metal thin-film-resistor objects 21a and 21b. As the metal thin-film-resistor objects 21a and 21b, the metal thin-film-resistor object 21 of the present invention is used. Although illustration is omitted, under the laser-beam transparency prevention film 41, components of the integrated circuit, such as a transistor, a capacitor, a metal wiring pattern, a polysilicon wiring pattern, and an impurity diffusion layer, are arranged.

As shown in FIG. 36, a desired series resistance value can be acquired by cutting or modifying desired metal thin-film-resistor objects 21a by a laser-beam, locus 25a of which is shown in FIG. 36, and cutting or modifying desired regions of the metal thin-film-resistor object 21b by a laser-beam, locus 25b of which is shown in FIG. 36.

Since according to the metal thin-film-resistor object 21 and the laser-beam transparency prevention film, which constitute the semiconductor device of the present invention, at least a part of components of the integrated circuit other than the metal thin-film-resistor object 21 are arranged in the region under the metal thin-film-resistor object 21, miniaturization of the chip can be attained, and miniaturization of the chip of the semiconductor device including the division resistance circuit shown in FIG. 35 can be attained. Further, since the laser-beam transparency prevention film is arranged under the metal thin-film-resistor object 21, even if the laser beam of sufficient intensity is irradiated at the time of the laser trimming process for cutting or modifying the metal thin-film-resistor object 21, the precision of the output voltage of the division resistance circuit shown in FIG. 35 is not degraded because the laser beam is prevented from irradiating the components and the semiconductor substrate of the integrated circuit.

When applying the division resistance circuit shown in FIG. 35 to the division resistors R1 and R2 of the constant voltage generating circuit 79 shown in FIG. 30, the bottom end of the resistor Rbottom is grounded and the top end of the resistor Rtop is connected to the drain of PMOS 87, for example. Further, the terminal Node L between the resistor Rbottom and the resistor for fine tuning 99 or the terminal Node M between the resistor Rtop and the resistor for rough adjustment 97 is connected to the reversed input terminal of the operational amplifier 85.

According to the division resistance circuit to which the metal thin-film-resistor object 21 and the laser-beam transparency prevention film of the present invention are applied, miniaturization of the chip of the semiconductor device is attained, and further the precision of the output voltage of the division resistance circuit shown in FIG. 35 is raised. In this way, miniaturization of the chip of the semiconductor device including the constant voltage generating circuit 79 is obtained, and the stability of the output voltage of the constant voltage generating circuit 79 is further raised.

Further, when applying the division resistance circuit shown in FIG. 35 to the division resistors R1 and R2 of the voltage detector 91 shown in FIG. 31, the bottom end of the resistor Rbottom is grounded and the top end of the resistor Rtop s connected to the input terminal 93, for example. Further, the terminal Node L between the resistor Rbottom and the resistor for fine tuning 99 or the terminal Node M between the resistor Rtop and the resistor for rough adjustment 97 is connected to the reversed input terminal of the operational amplifier 85.

Since the precision of the output voltage of the division resistance circuit shown in FIG. 35 can be raised, and miniaturization of the chip of the semiconductor device is attained according to the division resistance circuit to which the metal thin-film-resistor object 21 and the laser-beam transparency prevention film of the present invention are applied, miniaturization of the chip of the semiconductor device containing the voltage detector 91 is attained, and the detection precision of the voltage detector 91 is further raised further.

With reference to FIGS. 30 through 36, the examples of the semiconductor device, to which the division resistance circuit of the present invention is applied, are described, wherein the structure of arranging the components of the integrated circuit under the metal thin-film-resistor object 21 of the present invention, and the structure of arranging the laser-beam transparency prevention film under the metal thin-film-resistor object 21 are applied to the division resistance circuit. Nevertheless, a semiconductor device to which the division resistance circuit of the present invention is applied is not limited to the semiconductor device equipped with a voltage detector or a constant voltage generating circuit, but the present invention applies to any semiconductor device equipped with the division resistance circuit.

Further, a semiconductor device, to which the structure of arranging the components of the integrated circuit under the metal thin-film-resistor object 21 of the present invention, and the structure of arranging the laser-beam transparency prevention film under the metal thin-film-resistor object 21 is applied, is not limited to the semiconductor device equipped with the division resistance circuit, but the present invention is applicable to a semiconductor device equipped with a metal thin-film-resistor object.

The embodiments of the present invention are described as above; nevertheless, the present invention is not limited to those as described, which are only examples concerning the size, form, material, arrangement, etc., and various changes and modifications are possible within the limits of the present invention.

Further, the present invention is not limited to these embodiments, but variations and modifications may be made without departing from the scope of the present invention.

The present application is based on Japanese Priority Application No. 2004-286742 filed on Sep. 30, 2004 with the Japanese Patent Office, the entire contents of which are hereby incorporated by reference.

What is claimed is:

1. A semiconductor device equipped with an integrated circuit including a metal thin-film-resistor object, comprising:
   a lower layer side insulator film formed on a semiconductor substrate through another layer;
   a metal wiring pattern formed on the lower layer side insulator film;
   an underground insulator film having a silicon oxide film that contains one of phosphor, and phosphor and boron at least as the uppermost layer of the underground insulator film that is formed on the lower layer side insulator film and the metal wiring pattern; and
   a connection hole formed in the underground insulator film on the metal wiring pattern; wherein
   the metal thin-film-resistor object is formed covering the underground insulator film, and inside the connection hole, and is electrically connected to the metal wiring pattern in the connection hole.

2. The semiconductor device as claimed in claim 1, wherein the connection hole is shaped in a taper form at least at its upper end, and an Ar sputter etching residual substance containing at least Ar, and materials of the metal wiring pattern and the underground insulator film is formed in the inner wall of the connection hole.

3. The semiconductor device as claimed in claim 1, wherein the metal wiring pattern is constituted by a metal material pattern and a high melting point metal film formed on at least the upper surface of the metal material pattern.

4. The semiconductor device as claimed in claim 1, wherein the upper surface of the metal thin-film-resistor object is covered by a metal nitride film, and a metal oxide film is not formed between the upper surface of the metal thin-film-resistor object and the metal nitride film.

5. The semiconductor device as claimed in claim 1, wherein the metal wiring pattern is the metal wiring pattern of the uppermost layer.

6. The semiconductor device as claimed in claim 1, further comprising:
   a laser-beam transparency prevention film consisting of a metal material under the underground insulator film in a region under the metal thin-film-resistor object.

7. The semiconductor device as claimed in claim 1, wherein at least a part of components of an integrated circuit other than the metal thin-film-resistor object is arranged in a region under the metal thin-film-resistor object.

8. The semiconductor device as claimed in claim 7, wherein the components of the integrated circuit arranged in the region under the metal thin-film-resistor object include a transistor.

9. The semiconductor device as claimed in claim 7, wherein the components of the integrated circuit arranged in the region under the metal thin-film-resistor object include a capacitor.

10. The semiconductor device as claimed in claim 7, wherein the components of the integrated circuit arranged in the region under the metal thin-film-resistor object include a metal wiring pattern.

11. The semiconductor device as claimed in claim 7, wherein the components of the integrated circuit arranged in the region under the metal thin-film-resistor object include a polysilicon wiring pattern.

12. The semiconductor device as claimed in claim 7, wherein the components of the integrated circuit arranged in the region under the metal thin-film-resistor object include an impurity diffusion layer formed on a surface of the semiconductor substrate.

13. The semiconductor device as claimed in claim 1, wherein the thickness of the metal thin-film-resistor object is between 0.5 and 100 nm (5 and 1000 Å).

14. The semiconductor device as claimed in claim 1, wherein a flattening process is performed on the underground insulator film.

15. A semiconductor device equipped with a division resistance circuit for obtaining an output voltage by dividing a voltage by a plurality of resistors, the output voltage being adjustable by cutting a fuse element, wherein
   the resistors are constituted by the metal thin-film-resistor object as claimed in claim 1.

16. A semiconductor device equipped with a division resistance circuit for obtaining an output voltage by dividing a voltage by a plurality of resistors, the output voltage being adjustable by irradiating a laser beam onto the resistors, wherein
   the resistors are constituted by the metal thin-film-resistor object as claimed in claim 1.

17. A semiconductor device equipped with a voltage detector that includes a division resistance circuit for dividing an input voltage and supplying a divided voltage, a reference-voltage generating circuit for supplying a reference voltage, and a comparator circuit for comparing the divided voltage supplied by the division resistance circuit with the reference voltage supplied by the reference-voltage generating circuit, wherein
   the division resistance circuit is the division resistance circuit as claimed in claim 15.

18. A semiconductor device equipped with a constant voltage generating circuit that includes an output driver for controlling an output voltage, a division resistance circuit for dividing the output voltage and supplying the divided voltage, a reference-voltage generating circuit for supplying a reference voltage, a comparator circuit for comparing the divided voltage supplied by the division resistance circuit with the reference voltage supplied by the reference-voltage generating circuit, and for controlling operation of the output driver according to a comparison result, wherein
   the division resistance circuit is the division resistance circuit as claimed in claim 15.

* * * * *